United States Patent [19]

Polonio

[11] Patent Number: 5,065,282

[45] Date of Patent: * Nov. 12, 1991

[54] INTERCONNECTION MECHANISMS FOR ELECTRONIC COMPONENTS

[76] Inventor: John D. Polonio, 625 NE. 22nd Ave., Canby, Oreg. 97013

[ * ] Notice: The portion of the term of this patent subsequent to Dec. 5, 2006 has been disclaimed.

[21] Appl. No.: 444,709

[22] Filed: Dec. 1, 1989

Related U.S. Application Data

[63] Continuation-in-part of Ser. No. 170,444, Mar. 18, 1988, which is a continuation-in-part of Ser. No. 920,582, Oct. 17, 1986, abandoned.

[51] Int. Cl.[5] .............................................. H05K 1/18
[52] U.S. Cl. .................................. 361/399; 361/389; 174/52.4; 439/68
[58] Field of Search ............... 361/386, 388, 389, 399, 361/400, 408; 174/16.3, 52.4; 357/79; 439/68, 71, 72, 73, 330, 678, 680

[56] References Cited

U.S. PATENT DOCUMENTS

| | | | |
|---|---|---|---|
| 3,487,267 | 12/1969 | Winston et al. | 361/389 X |
| 4,684,184 | 8/1987 | Grabbe et al. | 439/71 |
| 4,812,949 | 3/1989 | Fontan et al. | 361/386 |
| 4,885,126 | 12/1989 | Polonio | 361/408 X |

Primary Examiner—Leo P. Picard
Assistant Examiner—Paramita Ghosh
Attorney, Agent, or Firm—Chernoff, Vilhauer, McClung & Stenzel

[57] ABSTRACT

An electronic circuit component housing assembly adapted to be mounted mechanically on a printed circuit, using a single mechanical fastener to attach the circuit component housing assembly in a unique alignment with the printed circuit, and simultaneously using the fastener to provide force to press physically compliant electrical contacts included in the circuit component housing assembly into electrical contact with terminal contact pads on the printed circuit. Several electronic circuit components may be housed in separate hermetically sealed cavities and can be biased independently of one another. Thermal conductors are included in the base member and a convection cooler is mounted atop the assembly. The mechanical fastener also acts as a thermal conductor. A test probe assembly including multiple contacts mounts on the electronic circuit component housing.

14 Claims, 36 Drawing Sheets

INTERCONNECTION MECHANISMS FOR ELECTRONIC COMPONENTS

This application is a continuation-in-part of pending U.S. application Ser. No. 07/170,444, filed Mar. 18, 1988, which is a continuation-in-part of U.S. application Ser. No. 06/920,582, filed Oct. 17, 1986 now abandoned.

TECHNICAL FIELD

The present invention relates to interconnection of electrical circuit components, and in particular to mounting of integrated circuits and similar electronic components in unitary housings on a printed circuit so as to assure reliable electrical connection in a reduced amount of printed circuit area and with increased contact density.

BACKGROUND OF THE INVENTION

Various arrangements of electrical leads have been taught previously for enabling integrated circuit packages to be connected to printed circuits, as by soldering individual leads to the printed circuits or by clamping leads between a rigid separate body and contact pads on a printed circuit. The physical space required to permit soldering individual leads or clamping individual leads in place, however, presents certain shortcomings in applications where signals are intended to be transmitted at high frequencies and where there is high signal line density. Also, the length and impedance of individual conductors may be a factor in the circuit design. In such circuits, it becomes desirable, then, to reduce the size of circuits as much as possible, and, for the sake of reducing the cost of production and repair, it is desirable to provide simple and reliable means for connecting components to printed circuits.

The prior art has typically relied upon chip carriers to house electronic components, with such chip carriers being attached to printed circuits either through the use of conductive adhesives (such as reflowed solders or conductive epoxies) or through the use of a third, electrically conductive, and physically and electrically connective socketing part, which resides between the printed circuit and the component housing.

The attachment of electronic component housings to the contact pads of printed circuits using socketing parts is a solderless approach to interconnecting the two units, however, in the prior art a third, physically independent, electrically conductive, mechanically and electrically connective part has generally been required for this type of interconnection.

As an example, gull wing leads of an electronic component housing may be mated to the printed circuit contact pad using a compressible elastomer in a socket such that the rigid pressure bracket of the socket compresses the elastomer down upon the gull wing leads and physically and electrically mates the two contacts. Normally, all of such contacts have a high quality exterior finish with high electrical conductivity, such as by the use of gold, and are considered to have a reliable interconnection when a minimum pressure of approximately 8 to 16 grams is applied to the interface between the contacts. Such pressure has been provided in the past by, for example, corner screws which distribute the force across the socket's rigid pressure bracket such that the pressure at each lead is maintained at the required level.

A rigid insulating socket body, in other devices, retains an array of individual pin leaded spring contact sockets, wherein each contact houses a spring contact which mates, again under pressure, to the component housing pin lead. The socket itself, in such systems, is reflow soldered to the printed circuit contact pad, and conductivity between the component housing body and the printed circuit is again made by way of a component socket.

It is also desirable to provide a compatible electromagnetic environment to act as a suitable vehicle for the conveyance of electronic signals between the printed circuit and the electronic components housed within a component housing, and to supply the signals internally to the electronic components in such a manner as to minimized the total area of circuit board required for the interconnection between the mounted component housing and the printed circuit on which it is mounted.

As the physical size of circuit components is reduced it becomes more and more difficult to make good electrical contact with individual circuit component leads. It is therefore important to provide for reliable electrical connection to the various electrical components located within a housing of reduced size.

Because individual leads previously have had to be connected, by the use of wires or conductive material desposited on flexible films appropriately clamped in place by separate structural members during installation of component housings, the size of conductors and connector pads previously has been larger than would be desired otherwise, in order that desired junctions may be accomplished without inadvertent electrical interconnections of electrical leads which are intended not to be connected to one another. As a result, currently used leads and pads have dimensions which are in many cases much larger than the size needed to carry the anticipated electrical loads.

More recently, devices disclosed in Hutchison U.S. Pat. No. 3,984,166, Modden U.S. Pat. No. 4,458,968, and Hodge et al. U.S. Pat. No. 4,420,767 have disclosed chip carriers capable of solderless connections, but without great advantage in terms of contact density. White et al. U.S. Pat. No. 4,601,526 discloses a chip carrier providing improved contact density.

Along with reduced component size, however, comes added difficulty in making contact for the testing of individual circuit elements.

What is needed, then, is an improved assembly for mounting electronic component housings on printed circuits, making installation simple, accurate, and reliable, and permitting installation of electronic components in a smaller space on a printed circuit than previously was required, while still leaving it possible to test the circuits contained and connected with the electronic components so mounted.

DISCLOSURE OF THE INVENTION

The present invention provides apparatus and a method for mounting electronic component housings or printed circuits and electrically connecting the components contained within such housings to the appropriate terminals provided on printed circuits, thus overcoming the above-mentioned shortcomings and drawbacks of the previously available ways of connecting electronic component housings to printed circuits.

In accordance with the present invention a housing for an electrical component assembly is mounted on a mechanical fastener, and cooperative alignment members are provided on the housing and a printed circuit on which it is to be mounted, to assure that the electronic component housing is aligned precisely with the printed circuit when the mechanical fastener is used to attach the electronic component housing to the printed circuit. These alignment members may be pins and corresponding sockets as in one embodiment, in which case, one of the pins is preferably different in configuration, and the pins are arranged so that the electronic circuit component housing can be mounted in only one orientation on a circuit board. In another embodiment of the invention, alignment is accomplished by the use of stiff wires arranged in a unidirectional pattern which permits the fastening wires to be inserted into a set of corresponding holes in a printed circuit in only a unique orientation. The pins and fastening wires are spaced widely apart, with the result that the maximum accuracy of location is obtained, for the tolerance of size variation used in production and assembly of the wires, pins and sockets.

Mechanically compliant electrical contacts are connected to the electronic circuit components held within the housing and are located about the periphery and interior of the face of the housing directed toward the printed circuit, so as to be properly aligned with mating conductor terminal pads provided in a planar array as part of the printed circuit. When the electronic component housing according to the present invention is mounted on the printed circuit accurate alignment and ample pressure are provided to assure reliable physical contact and resulting electrical contact between the circuits contained in the electronic component housing and those of the printed circuit, without the use of electrically conductive adhesives and without the use of physically independent sockets, clamps, and the like.

In order to minimize the total area required for the interface between the electronic circuit component housing and the printed circuit, the component mounting system of the present invention provides for contacts on the electronic circuit component housing which interconnect with contact pads of the printed circuit, and which extend from beneath the electronic component housing, so that not all of the signal lines entering the component housing need to originate adjacent the edge of the component housing. This allows a smaller number of conductors to be more closely spaced at the edges of the housing and allows other conductors to enter the housing at the corner and interior portions which, as such, do not require significant additional area to be taken up by the component housing.

Several different types of mechanically compliant contacts are disclosed, including finger-like spring contacts, flexible conductors carried on flexible insulative sheet or tape backings and supported by elastomeric pressure members, and physically deformable nodular contacts of several different types of construction.

Only the critical signal lines are required to be brought from the outer edge of the component housing to the interconnection region near the edge of the electronic component, which is typically mounted centrally within the component housing, and thus the overall exterior dimensions of the housing are reduced due to the need to incorporate a lesser number of lines arrayed side by side.

The present invention provides for solderless replaceable interconnection and mounting of more than one electronic circuit component on a printed circuit simultaneously, in a single electronic circuit component housing. In particular, the present invention provides for housing electronic circuit components needed to complement integrated circuits, housing these complementary circuit components in the closest possible proximity to the integrated circuits. The invention also provides for housing more than one integrated circuit in the same electronic circuit component housing, and for doing so in a manner permitting relatively simple replacement of individual integrated circuits within such a circuit component housing capable of containing several integrated circuit components. This is of particular value if one of several integrated circuit components fails to function properly during initial testing.

The present invention also provides a mechanism for monitoring the electronic signals traveling between the printed circuit and electronic components housed within the component housing. This monitoring is accomplished by using a multiple contact probe attached to the component housing, the probe using compliant contacts to contact the electronic component housing and the printed circuit, to sense both a reference signal and the signals residing on the conductors radiating from beneath the attached component housing.

It is therefore a principal object of the present invention to provide an improved method for direct, non-permanent, electrical interconnection of electronic components with electrical circuits contained on mechanically supportive members on which the electronic component housings are to be mounted.

It is another principal object of the present invention to provide an improved electronic circuit component housing providing for self-socketing interconnection of an electronic component to a printed circuit and providing for construction of such a housing using fabrication processes currently in use for manufacture of printed circuit assemblies.

It is another important object of the present invention to provide for mounting electronic component housings on printed circuits in a manner which requires less physical space for removably mounting the electronic circuitry contained in a particular electronic component housing.

Yet another object of the invention is to provide electrical interconnection of electronic components with electrical circuits by providing the electrical components with compliant electrical contacts and a single fastener for applying compressive force so as to hold the contacts onto the electrical circuits.

A still further object of the present invention is to provide a compressive fastener having orientation means for ensuring proper alignment of electrical components with electrical circuits.

Yet another object of the present invention is to provide a test probe assembly for electrical components compressively connected to electrical circuits which may be electrically connected to such components, and take measurements therefrom, without interfering with the connection between the electrical components and the electrical circuits.

A further object of this invention is to provide a method for placing electrical resistors between circuit paths or contact points economically and using a minimum of space.

The foregoing and other objectives, features, and advantages of the invention will be more readily understood upon consideration of the following detailed description of the invention, taken in conjunction with the accompanying drawings.

BEST MODE FOR CARRYING OUT

Figure 1:
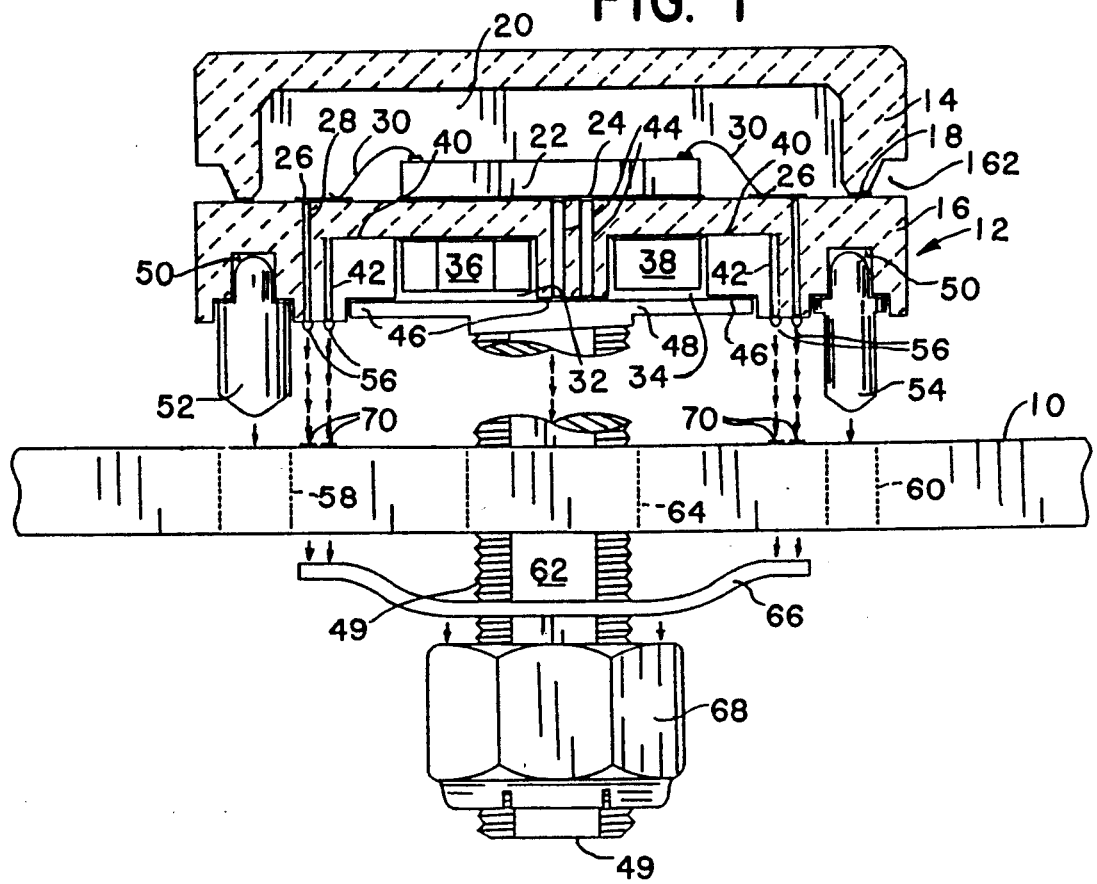
FIG. 1 is a sectional view of a portion of a printed circuit and an electronic circuit component housing embodying an interconnection mechanism according to the present invention.

Referring now to FIGS. 1–4 of the drawings, in a first embodiment of the present invention, a portion of a printed circuit 10 is shown in side view, together with an electronic circuit component housing 12 embodying the interconnection mechanisms for electronic components according to the present invention. The electronic circuit component housing 12 includes a lid 14, which is hermetically attached to a base 16 by a hermetic seal 18 to define a cavity 20. The component housing base 16 and lid 14 may be made of a ceramic material such as alumina. The hermetic seal 18 may be formed of a fusible adhesive, as by soldering.

Within the cavity 20 is located an active electronic component such as an integrated circuit chip 22 mechanically attached to the upper side of the base member 16, using eutectic reflow solder 24 or other industry standard techniques.

The base 16 also includes horizontal electrical conductors 26 and vertical electrical conductors 28. The conductors 28 and 26 may be made by sintering refractory metal paste in the appropriate locations. Electrical conductors 30, typically fine wires, connect the various terminals of the integrated circuit chip 22 to respective ones of the horizontal conductors 26 in a conventional manner.

The base member 16 also defines cavities 32 and 34 on its lower side, for containment of other passive or active electronic components 36, 38. Additional horizontal conductors 40 and vertical conductors 42, and may be made in the same fashion as the horizontal and vertical conductors 26 and 28. Additional sintered refractory metal vertical conductors 44 are also provided, and may serve as thermal conductors to draw heat away from the integrated circuit chip 22 as necessary, as well as providing appropriate electrical connection between the chip 22 and the head 48.

The ceramic technology typically employed to construct the component housing base 16 is typically referred to as refractory metal multi-layer ceramic technology. In the construction of the base 16, multiple layers of green ceramic material are first shaped and punched with "via" holes, and refractory metal paste is then applied by screening. Following this process for each layer required, all of the layers are laminated together, shaped again, sintered, and plated as necessary with other conductive metals. Finally, any parts which are to be attached to the component base 16 may be attached using conventional brazing techniques. In fabrication of the electronic circuit component housing 12 and its included electronic components 22, 36, and 38, the base 16 is inverted so that the components 36 and 38 may be placed within the cavities 32 and 34 to be connected with their respective conductors 40.

A hermetic seal area 46 surrounding the cavities 32 and 34 is then covered by a brazing preform, and the generally planar head 48 of a mechanical fastener such as a screw 49 is placed on top of the preform. It will be appreciated that the head 48 of the screw 49 thus serves as a bottom wall of the cavities 32 and 34 so that the hermetic seal area 46, when the head 48 is connected, as by brazing, to the base member 16, provides a hermetically sealed cavity to contain the electronic components 36 and 38. At this time, appropriate brazing preforms are placed in sockets 50 defined in the bottom side of the base member 16, and respective alignment pins 52 and a key alignment pin 54 are set atop the preforms within the sockets 50. Thereafter the component housing base is heated to braze the head 48 of the screw 49, and the alignment pins 52 and 54, to the base member 16.

Each of the vertical conductors 28 and 42 is provided, in this embodiment of the invention, with a conductive compliant contact in the form of a nodule 56 located in the appropriate position upon the bottom side of the component housing base member 16. A preferred method of constructing these conductive compliant contact nodules 56 is to plate the exposed lower end portions of the refractory metal vertical conductors 28 and 42, also known as vias, with gold to form a generally hemispherical deposit of substantially pure gold, which is well suited for this application because of its softness, ductility, and conductivity. Each nodule is, for example, in the form of a hemisphere about 0.008 inch in diameter, although the size is not critical so long as it is great enough to accomodate irregularities in the shapes of the base 16 and the printed circuit 10. Such nodules could be arrayed with spacing of 0.010 inch, center to center. Alternatively, nodules of conductive silicone material may be applied by molding them atop the lower end of each vertical conductor 28, 42.

Another method of forming conductive compliant contact nodules includes the bonding of metal balls to the exposed lower end portions of via conductors 28 and 42 after finishing these exposed end portions with a suitable bond mating metalization, such as by electroplating the ends with thin layers of nickel and gold, and then bonding the gold balls formed in a conventional gold wire ball bonding operation to these exposed finished surfaces without leaving the wire tail.

A method of forming conductive compliant contact nodules of less expensive materials employs a metal alloy, such as a solder, which is screen printed onto the exposed end portions of via conductors 28 and 42 after these end portions have been finished with a suitable solder wetting metallization, such as by electroplating the ends with a thin layer of nickel. This screen printed metalization is reformed into suitable conductive compliant contact nodules by temperature cycling the nodule metalization applied to the via ends using conventional oven techniques, or by using directed microflame or laser heating techniques. Similar temperature cycling techniques could also be applied to the bonded metal balls previously discussed, both to reform the balls into a more desirable shape and to promote adhesion to the via ends.

The horizontal electrical conductors 26 may be formed on the top side of the base 16 using a thin film deposition technique. Thereafter the integrated circuit chip 22 or other electronic component is attached to the deposited metal on the top side of the housing base 16 as will be described in greater detail subsequently. The ceramic component housing lid 14 is then aligned accurately with the base member 16 and attached to it, as by use of reflow solder to form the hermetic seal 18 described previously.

When the electronic circuit component housing 12 is complete, it may be attached to the printed circuit 10 by aligning the alignment pins 52 and the key alignment pin 54 with alignment apertures 58 and a key alignment aperture 60 defined in the structural portions of the printed circuit.

The screw 49 is a D-shank screw, including a flat side 62 which is useful as will be explained subsequently for alignment of the electronic circuit component housing 12 by automatic component installation machinery. An aperture 64 defined in the printed circuit 10 is, however, preferably circular because of the lower cost of producing a circular aperture. When the electronic circuit component housing 12 has been properly located on the printed circuit 10, a tensioning member, such as a spring washer 66, is placed on the shank of the screw 49 on the side of the printed circuit 10 opposite the location of the circuit component housing 12, and a complementary member of the mechanical fastener, in this case a locknut 68, is assembled with the screw 49 and tightened so as to place the elongate shank portion of the screw 49 in tension, which is maintained by the elastic force provided by the spring washer 66.

Nodular shaped gold conductive compliant contacts such as the nodules 56 will make a reliable, mechanical and electrical interconnection with terminal contact pads 70, provided on the printed circuit 10, when compressed with a force of approximately 8 to 16 grams urging each nodule 56 contact toward the surface of the respective contact of the terminal pads 70. The mechanical fastener employed in accordance with the present invention provides compressive force distributed through the base member 16 of the electronic component housing 12 by way of the mechanical fastening device such as the screw 49, with the force being distributed laterally from the shank of the screw toward the nodules 56 by the head 48, so that the requisite force is provided at each of the contacts to provide electrical contact without the need to use conductive adhesives such as reflow solders, conductive epoxys, and the like. As a result, the electronic component housing 12 may be attached to or detached from the printed circuit 10 without the use of specialized equipment or facilities. In this manner the component housing 12 acts as its own base, while the printed circuit 10 acts as a socket in the traditional sense of receiving and electrically connecting the component housing 12, and the expense of a separate and independent socketing member separately mechanically fastened to the printed circuit to retain the electronic circuit component housing 12 is unnecessary. The compliant nature of each contact nodule 56 provided on the base member 16 permits the various nodules 56 to adjust to the varying geometry of the printed circuit 10 on which the electronic circuit component housing 12 is mounted. Thus, although the conductive compliant nodule contacts 56 are small, they are required to adjust only to the relatively small amount of unevenness of the surface of the printed circuit 10 in the localized area of the mounting site covered by the electronic circuit component housing 12.

Figure 2:
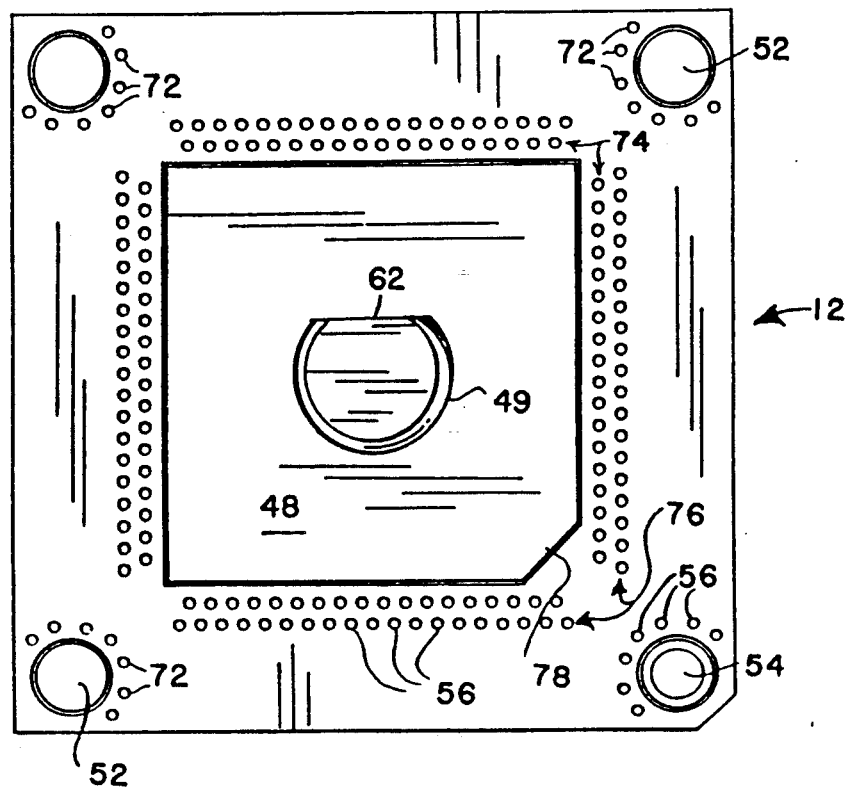
FIG. 2 is a bottom plan view of the electronic circuit component housing shown in FIG. 1.

The force necessary to hold the compliant conductive electrical contacts against the surface of the terminal pads 70 is derived from the particular mechanical fastening device, which may comprise, instead of the threaded "D"-shank screw 49 shown in FIGS. 1 and 2, a threaded socket attached to the base member 16 and a complementary screw (not shown) which may be obtained in the appropriate length, depending upon the thickness of the printed circuit structure with which a particular electronic circuit component housing 12 is to be used. Because it is necessary to maintain at least a minimum amount of force on each of the conductive compliant contacts, to preserve the electrical integrity of the interface between the contacts of the electronic component housing 12 and the printed circuit terminal pads 70, it is important that the tensioning force storage member, such as the spring washer 66, be able to maintain and exert force to provide tension in the mechanical fastener over a span of time and throughout a range of temperatures, both to accommodate the thermal expansion characteristics of the entire interconnection system and to offset any relaxation that may occur as a result of deformation of the contacts themselves.

The alignment pins 52 and the key alignment pin 54, are preferably constructed to be of diameters nearly equal to those of the alignment apertures 58 and key alignment aperture 60, respectively, so that, when located at the extremities of the electronic circuit component housing 12 the engagement of the pins with the respective apertures will minimize the possible misalignment of the conductive compliant nodules 56 with respect to the terminal pads 70. This is essential when a single mechanical fastening device, such as the screw 49, is used to attach the housing 12 to the printed circuit 10.

Referring particularly to FIG. 2, it may be seen that the nodules 56 may be arrayed in close proximity to one another about the periphery of the base member 16. Preferably, a plurality of DC contacts 72 are located about the alignment pins 52 and 54 in the corners of the base member 16. The interior-most row 74 of contacts are, for example, the reference contacts for the reference plane of a high frequency transmission line, while the outermost row 76 of contacts are preferably for the individual signal transmission line conductors.

At the center of the electronic circuit component housing 12, as shown in FIG. 2, is the screw 49. It will be appreciated that the head 48 of the screw 49 has a unique diagonal corner portion 78 oriented toward the key alignment pin 54, which is of a smaller diameter then the other alignment pins 52, and that the flat side 62 of the screw 49 has a particular orientation which is useful as mentioned previously to detect the orientation of the electronic circuit component housing 12 prior to its insertion into the printed circuit 10, so that appropriate automatic insertion equipment may be used for assembling the component housing 12 into the printed circuit 10 during production-scale fabrication of large electronic circuits. It will be appreciated that the alignment apertures might be provided in the base member 16 and the alignment pins 52 and 54 might be permanently installed in the printed circuit 10, or some of the pins might be located on the printed circuit 10 while others are located on the base member 16. The object is to ensure that installation of the electronic circuit component housing 12 is possible only in a single orientation in which each of the compliant contact nodules 56 is properly aligned with the corresponding terminal pad 70 on the printed circuit 10.

Figure 3:
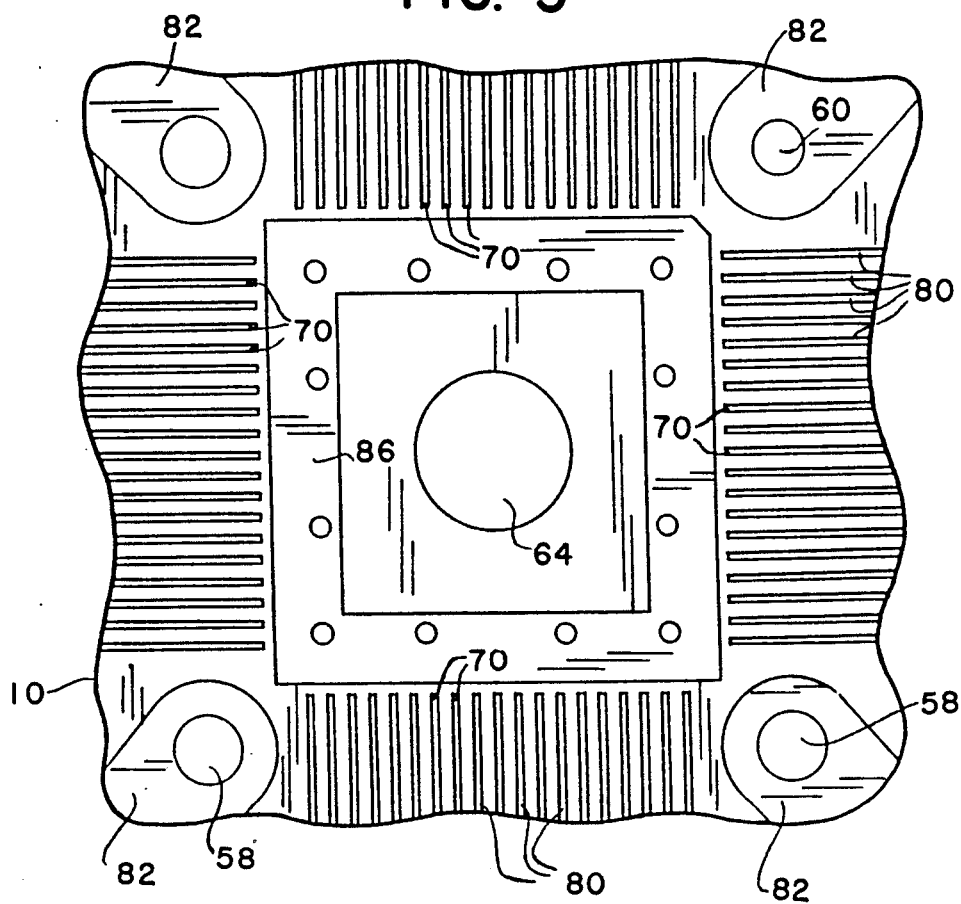
FIG. 3 is a top plan view of the portion of the printed circuit shown in FIG. 1, showing the mounting site which is available on the printed circuit to be occupied by the electronic component housing assembly shown in FIG. 1.

FIG. 3 shows a portion of the printed circuit 10 including and surrounding the area which is covered by the electronic circuit component housing 12 when it is in place on the printed circuit 10. It will be appreciated that the several electrical conductors 80 extend perpendicularly away from the outer boundaries of the mounting site for the housing 12. The importance of this orientation will become apparent subsequently in connection with a test probe adapted for use in conjunction with the circuit component housing 12. It will be appreciated that the plurality of DC contacts 72 surrounding each of the alignment pins 52 and 54 will fall on a single electrical conductor terminal pad 82 surrounding each of the alignment apertures 58 and 60.

Figure 6:
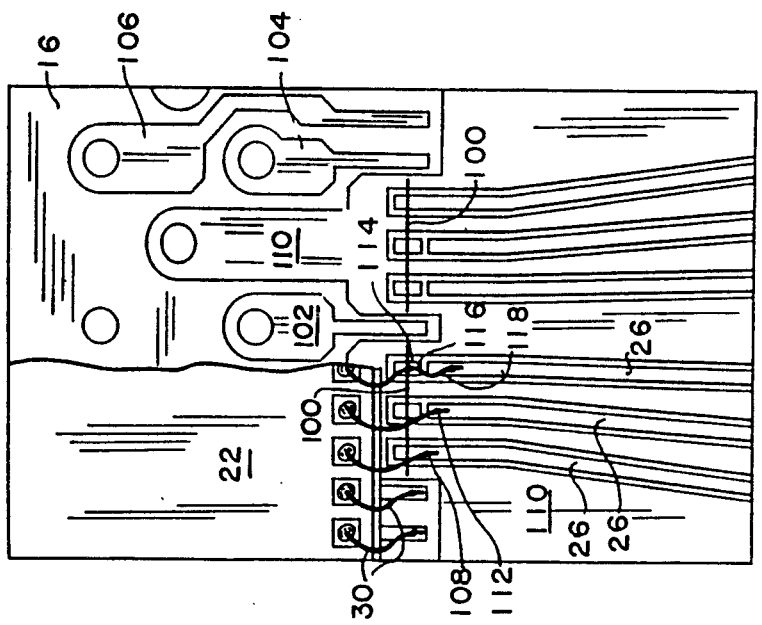
FIG. 6 is a top plan view, at a further enlarged scale, of a portion of the area of the electronic circuit component housing assembly shown in FIG. 5.

Referring particularly to FIG. 6, it will be seen that each of the connector conductors 30 leads from the integrated circuit chip 22 connect to a respective one of the conductors 26 located atop the base member 16.

Figure 4:
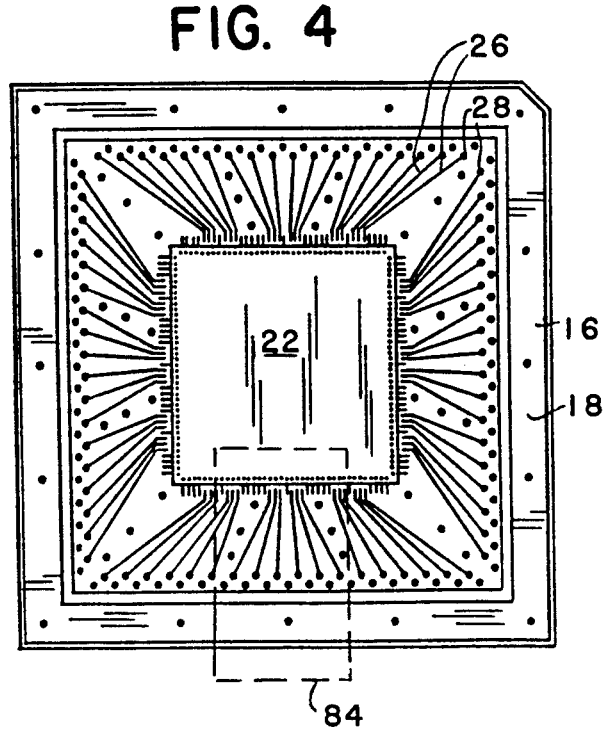
FIG. 4 is a top plan view of the electronic circuit component housing assembly shown in FIG. 1, without the lid of the housing.
Figure 5:
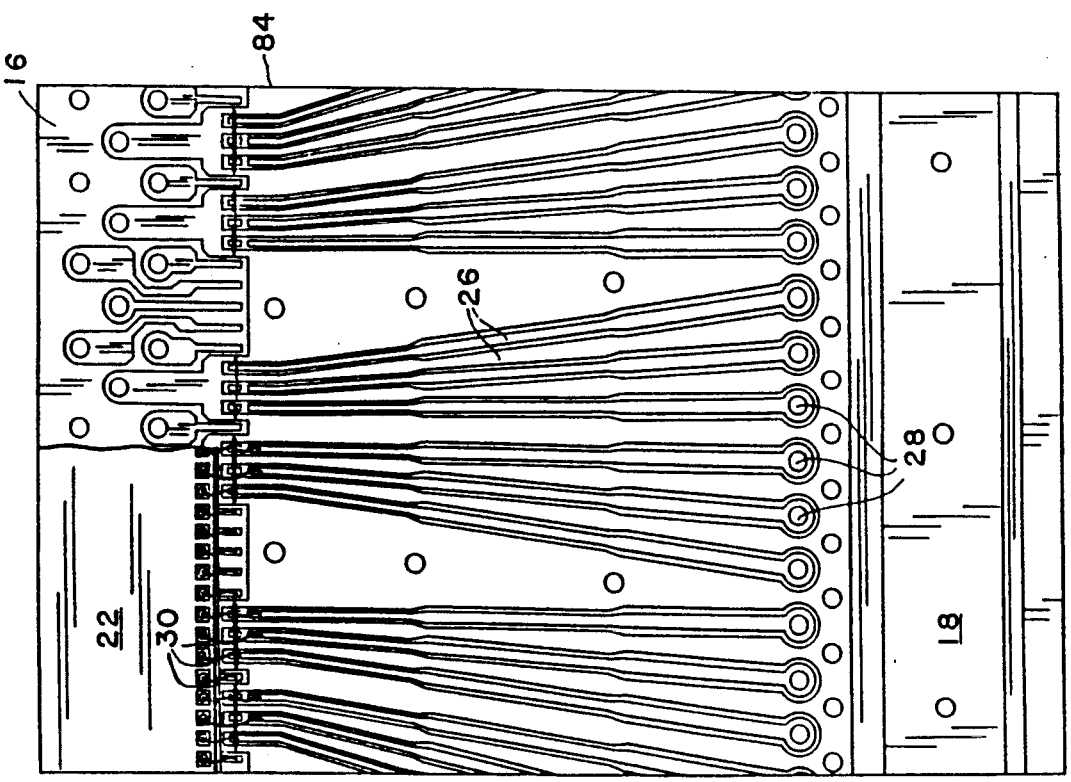
FIG. 5 is a partially cut-away top plan view of a portion of the electronic circuit component housing as shown in FIG. 4, with a portion of an integrated circuit mounted thereon.
Figure 7:
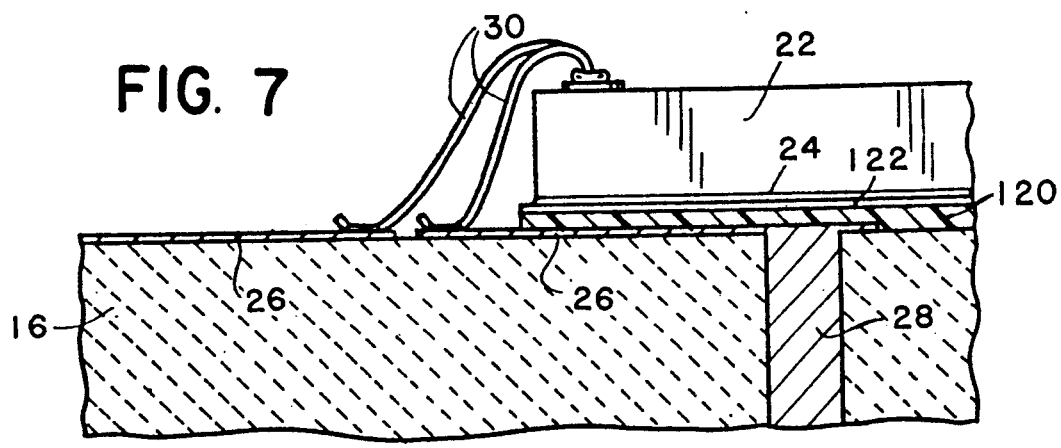
FIG. 7 is a side view of the portion of the electronic circuit component housing shown in FIG. 6.

Referring now to FIGS. 5, 6 and 7 a portion of the upper surface of the base member 16 and the integrated circuit chip 22 indicated by the broken line outline 84 in FIG. 4 is shown at an enlarged scale in FIG. 5, showing interconnection of the individual conductors 30 with various ones of the horizontal conductors 26 atop the base member 16. Preferably, the conductors 26 are, themselves, portions of a printed circuit forming the upper surface of the base member 16. In FIGS. 5 and 6, a portion of the integrated circuit chip 22 has been cut away in the upper righthand corner of the views shown, to expose portions of printed circuited conductors located beneath the integrated circuit chip 22. Location of these terminals beneath the integrated circuit chip 22 reduces the amount of space needed on the upper surface of the printed circuit 10 for the electronic circuit component housing. For example, such conductors may extend downwardly to a single common terminal 86 surrounding the aperture 64, as shown in FIG. 3.

Referring particularly to FIG. 6, a strip of resistive material, such as a thin strip 100 of NiChrome is deposited on the upper surface of the base member 16 as a straight line generally parallel with the nearby edge of the integrated circuit chip 22. The strip 100 of NiChrome is interrupted at various locations, as where the conductor 102 and the conductors 104 and 106 are located as shown in FIG. 6, but it is easier to deposit a single occasionally interrupted line extending peripherally about the intended location of the integrated circuit chip 22 then to deposit numerous short lines extending perpendicular to the edges of the integrated circuit 22. After the strip 100 is deposited on the base member 16, the conductors such as the horizontal conductors 26 and the conductors 102, 104, and 106 are deposited, so that the resistive NiChrome material of the strips 100 provides a resistive interconnection between those portions of the printed circuit interconnected by the deposited strips 100.

In each case the width of the gap determines the effective length, and thus the resistance value, of each portion of the resistive material, which is deposited in a strip of uniform width and thickness. The various conductors 30, as shown in FIG. 5 may be connected directly to one of the horizontal conductors 26, as at 108, where that particular conductor 26 is thus made to be a controlled impedance signal line, interconnected with the surrounding deposited metal of a ground plane area 110, by a segment of the strip 100 extending from the conductor 26 to the base plane material 110 on either side of it. Alternatively, a conductor 30 may be connected as at 112 to a horizontal conductor 26 which is a non-controlled impedance signal line, entirely isolated from the ground plane area 110, as in the case of an active signal transmission line. At junction 114 a lead 30 extends from the integrated circuit chip 22 to a pad 116 which is resistively interconnected with the ground plane 110, while a jumper 118 also connects the nearest horizontal conductor 26 to the pad 116 to provide a controlled impedance signal line equivalent to that at 108, by again providing a resistive connection to the ground plane 110 by a pair of short segments of the deposited NiChrome resistive material of the strip 100. It will be appreciated that the total resistance between the pad 116 or the junction 108 and the ground plane 110 will be half the resistance of a single length of the strip 100 long enough to bridge the gap between the pad 116 and the closest portion of the ground plane conductor material, and that in designing the layout of the conductors deposited atop the base member 16, the resistance for each terminal may be determined by the width of the gap provided to be bridged by a particular portion or portions of a strip 100. In normal manufacturing practice, the NiChrome strips 100 would be deposited on the base member 16, while the printed circuit including the conductors 26, 102, 104, 106, and 110 would be deposited atop the strips 100 in electrical contact with them.

As may be seen with reference to FIG. 7, the bottom, or contacting side of the integrated circuit chip is electrically insulated from the printed circuit including the conductors 102, 104, 106 and the ground plane 110 by a protective insulated layer 120, upon which is an additional conductive layer 122 whose dimensions closely correspond to those of the integrated circuit chip 22, so that the integrated circuit component 22 can be attached mechanically to the base member 16 by conventional attachment techniques such as eutectic attachment, reflow solder, or conductive epoxy, etc. Preferably, the protective electrically insulative layer 120 is of a material such as glass.

Figure 8:
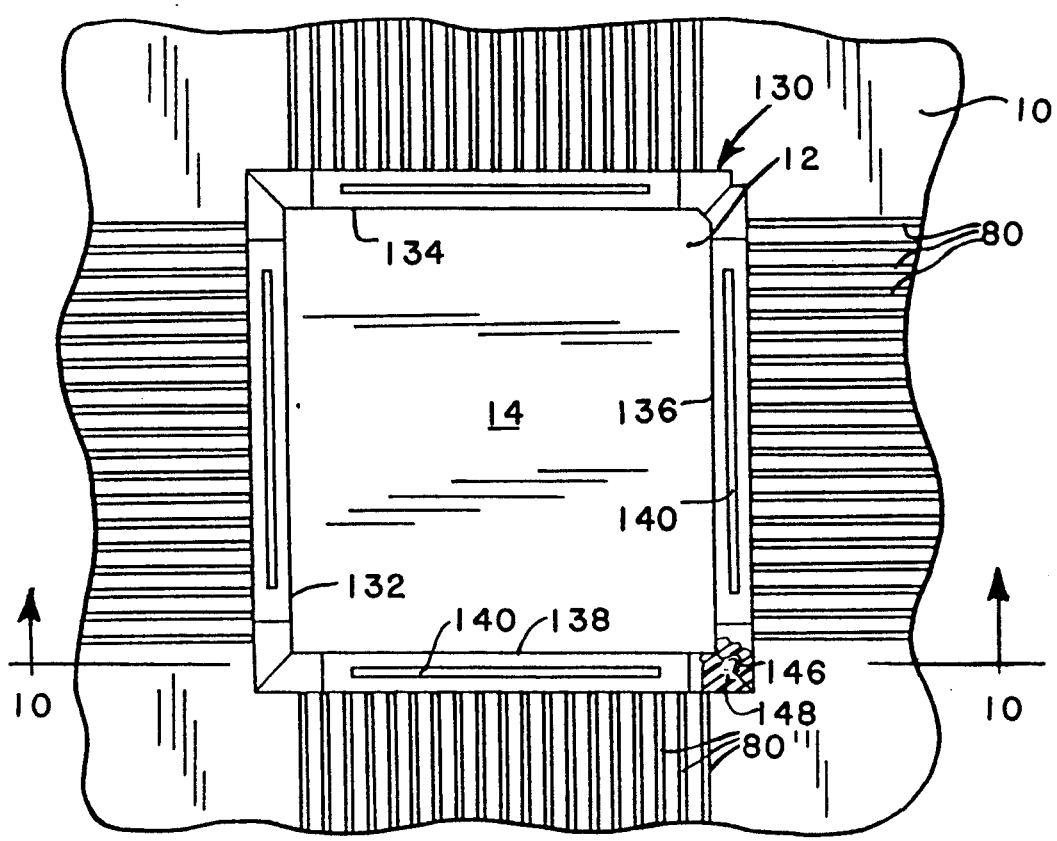
FIG. 8 is a top plan view of the electronic circuit component housing and portion of a printed circuit shown in FIG. 1, with a circuit testing probe assembly in place on the electronic component housing.
Figure 9:
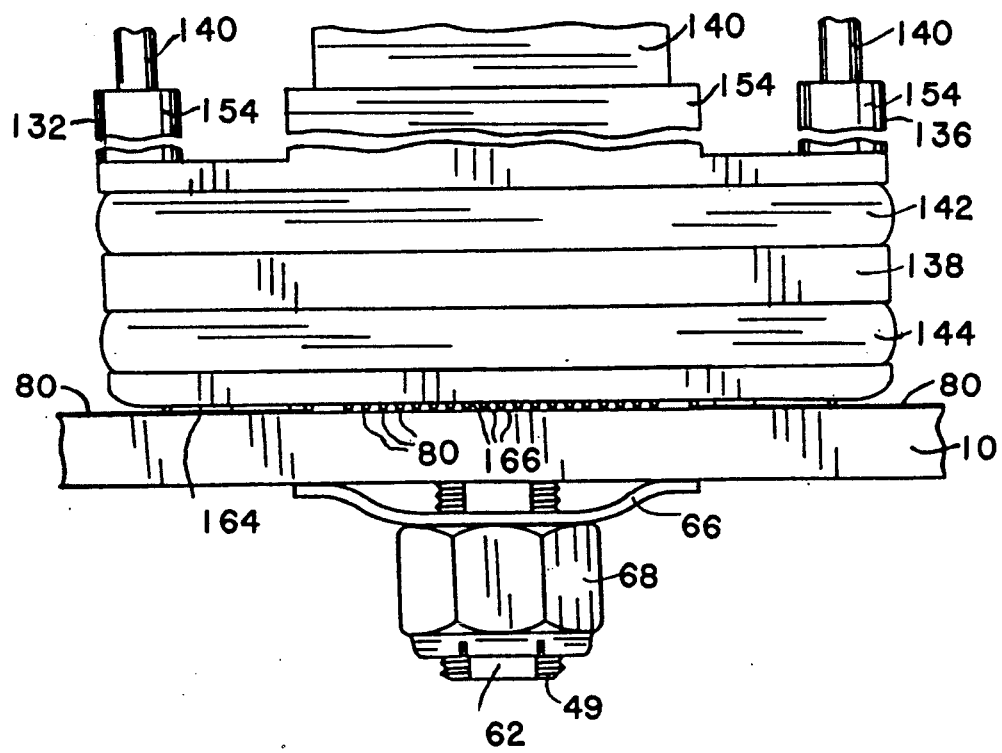
FIG. 9 is a side elevational view of the electronic circuit component housing and probe shown in FIG. 8.
Figure 10:
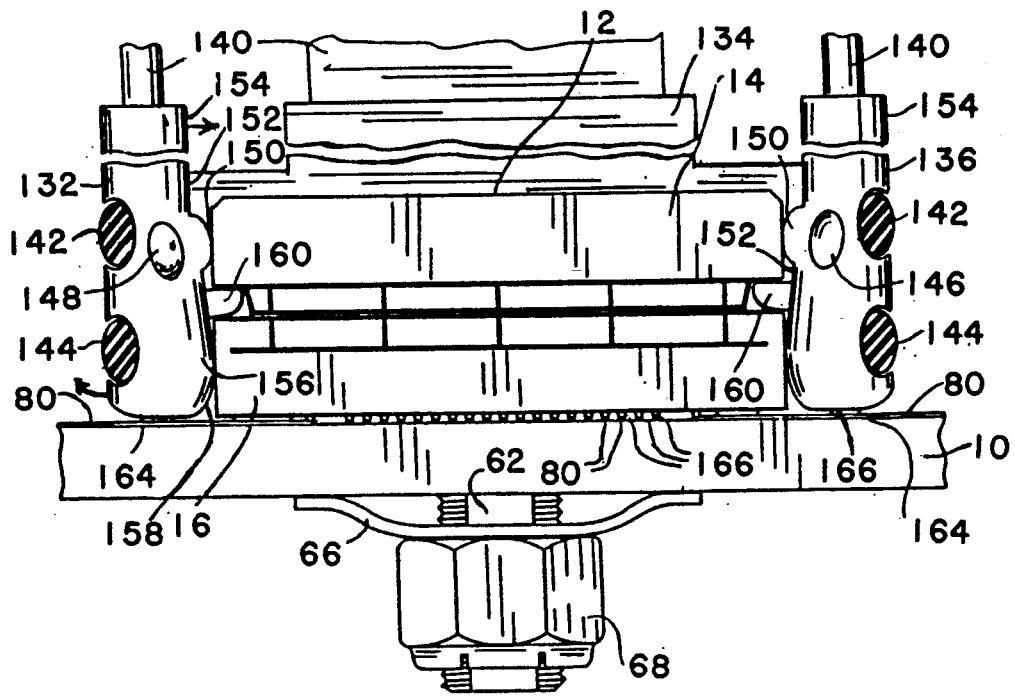
FIG. 10 is a sectional side view, taken along the line 10—10 of the electronic circuit component housing and probe shown in FIG. 8.

In order to obtain electrical connection with the circuitry contained within the electronic circuit component housing 12, a probe assembly 130 shown in FIGS. 8, 9 and 10 is provided for use in conjunction with the electronic circuit component housing 12. The probe assembly includes a set of four probe sections 132, 134, 136, and 138 each having an internal face configuration adapted to fit matingly against a corresponding face portion of the electronic circuit component housing 12, so that the probe assembly 130 surrounds the electronic circuit component housing 12 as shown in FIG. 8, with a respective set 140 of output leads extending from each of the probe sections 132, 134, 136, and 138 to provide connection to appropriate electronic testing and measuring equipment (not shown). A pair of elastic bands 142 and 144 under tension hold the probe sections snugly against the respective sides of the electronic circuit component housing 12, while the ends of adjacent probe sections abut against one another in diagonal surfaces which preferably include bores 146 which are parallel with the sides of the housing 12 and thus perpendicular to each other, so as to receive a bent wire 148 which acts as a dual-axis hinge. The mouth of each bore 146 is enlarged as at 149 to provide clearance for the probe sections to pivot about the bend of the wire 148 which permit the probe sections to pivot with respect to one another about their adjacent end portions. A pivot fulcrum, such as a rib 150, which may be continuous or interrupted, extends along an inner face 152, or attaching side, of each probe section, preferably aligned approximately vertically even with an upper elastic band 142. The rib 150 acts as a linear fulcrum about which each probe section may be pivoted or rocked, with the rib 150 in contact with a respective generally vertical portion of the periphery of the lid 14 of the circuit component housing 12. An upper portion 154 of each probe section extends away from the printed circuit 10 above the rib 150, so that the respective upper portions 154 of each of the probe sections 132, 134, 136, and 138 may be pressed together manually, pivoting the probe sections with respect to one another about their ribs 150 and/or the pivotal joints defined by the bores 146 and bent wires 148, urging the lower portions of the probe sections to part from one another against the tension in the elastic bands 142 and 144, to permit installation or removal of the probe assembly 130 with respect to the electronic circuit component housing 12. To aid further in installation of the probe assembly 130, each of the probe sections includes, preferably, a beveled or chamfered lower inner margin portion 158.

Located along the inner face 152 of each of the probe sections is a probe reference contact 160 having a shape adapted to fit between the upper surface of the base member 16 and a portion of the lid 14, preferably within a channel 162 defined by the shape of the lower marginal portion of the lid 14. Within the channel 162 a reference electrical potential is available, preferably through the electrically conductive material forming the hermetic seal 18, so that reference potential is available to be sensed through the probe reference contact 160. Along a lower margin 164, or tip, of each of the probe sections 132, 134, 136, and 138, are a plurality of compliant electrically conductive contact nodules 166, each similar to the nodules 56. The nodules 166 are connected electrically with respective conductors of the output lead set 140 of the respective one of the probe sections. Each of the nodules 166 is so located as to contact physically, and thus electrically, a respective one of the electrical conductors 80 extending away from the electrical circuit component housing 12 as discussed with reference to FIG. 3.

When the probe sections 132, 134, 136, and 138 are squeezed toward one another and the probe assembly 130 is placed properly about the electronic circuit component housing 12, releasing one's grasp on the upper portions 154 permits the lower portions 156 of the probe sections to be drawn toward one another and the base member 16, and, with the probe reference contact members 160 located properly within the channels 162, the nodules 166 are drawn into physical and electrical contact with the proper ones of the electrical conductors 80 surrounding the electronic circuit component housing 12, permitting measurement of the various electrical signals available and thus enabling performance of the electronic components located within the electronic circuit component housing 12 to be evaluated.

There is an electrical reference contact pad 168 located within the channel 162 on a surface of either or each of the lid 14 and base 16. Pressure is developed against both the reference contact pad 168 and respective ones of the printed circuit conductors 80, etc., as a result of the attachment of the probe assembly 132 to the electronic circuit component housing 12. This force is supported by and transferred through the electrical circuit component housing body 12 and the mechanical fastener, such as the screw 49, which fastens the electronic circuit component housing 12 to the printed circuit 10.

Figure 11:
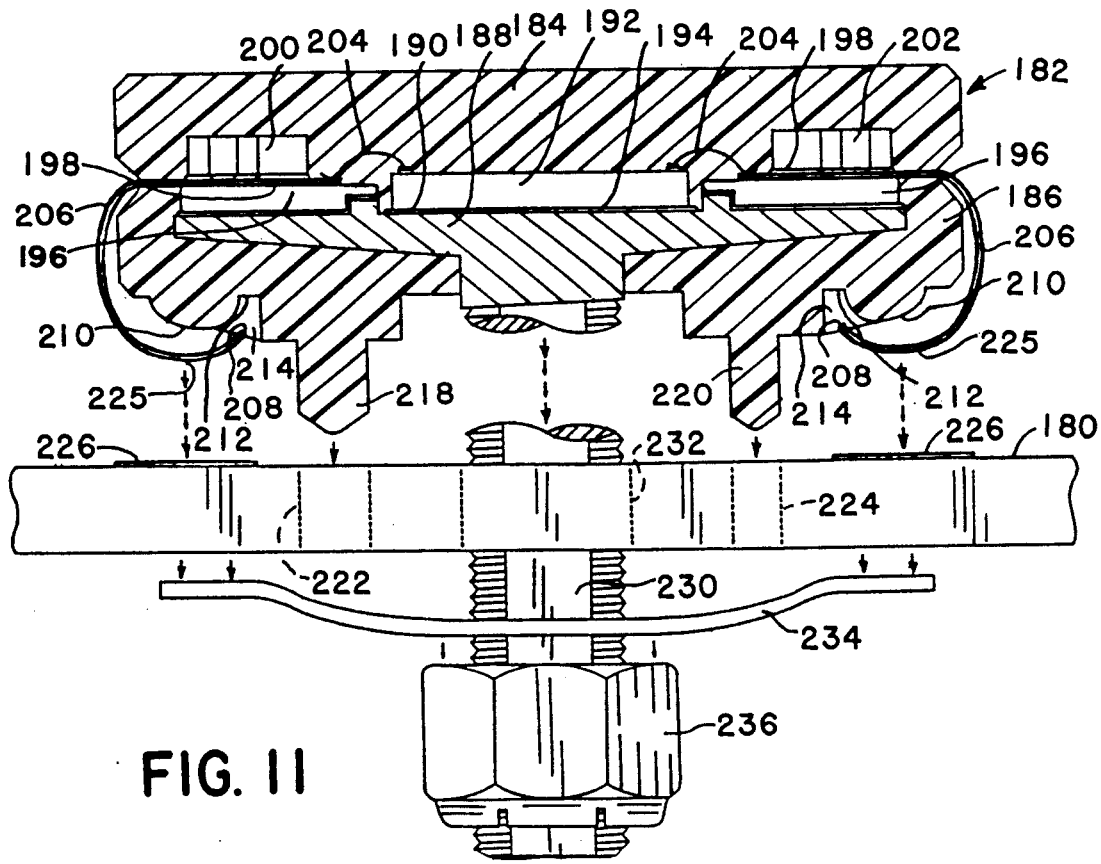
FIG. 11 is a sectional view of a portion of a printed circuit and an electronic circuit component housing mounted thereon which is another embodiment of the present invention.
Figure 12:
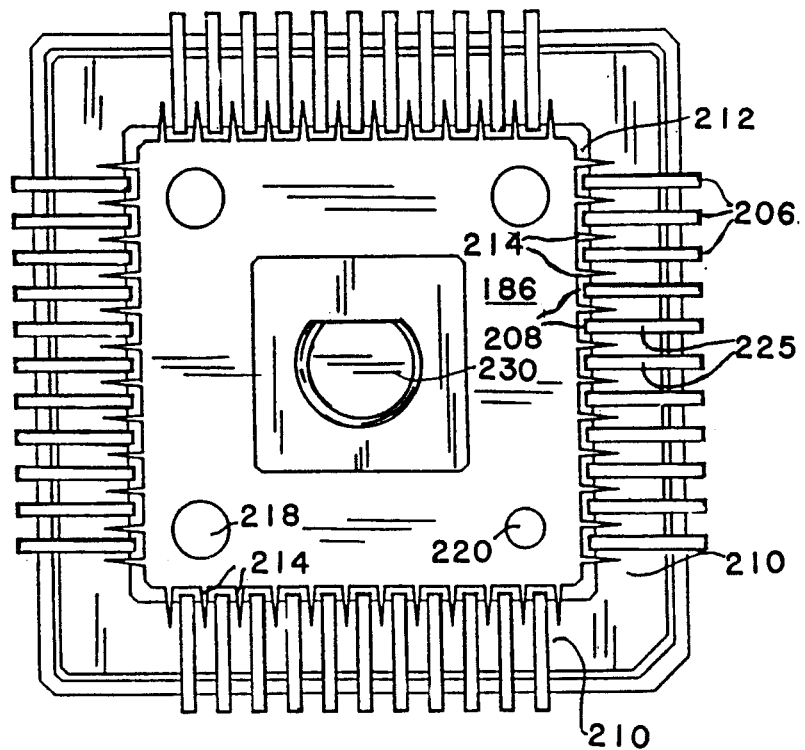
FIG. 12 is a bottom plan view of the electronic circuit component housing shown in FIG. 11.
Figure 13:
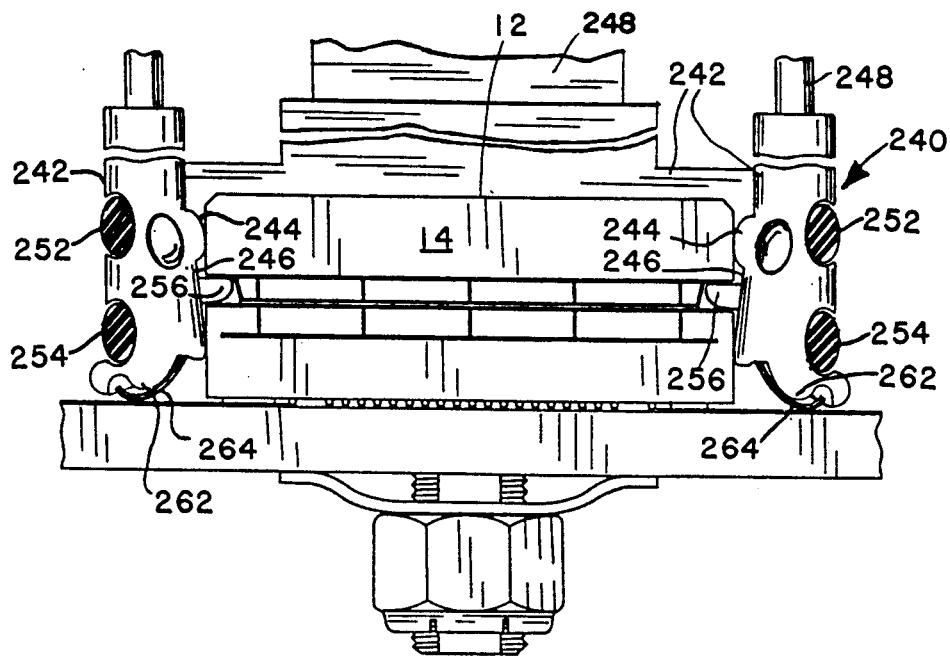
FIG. 13 is a sectional side view similar to that of FIG. 10, showing the electronic component housing shown in FIGS. 1-5, with an associated test probe of a second type in place thereon.

An alternative embodiment of the interconnection system of the present invention is shown in FIGS. 11, 12, and 13, in which a printed circuit 180 is shown, together with an electronic circuit component housing 182 which is adapted for use therewith. The electronic circuit component housing 182 includes a top portion 184, shown in section view in FIG. 11, which is molded together with a base portion 186. The base portion 186 encloses a head portion 188 of a mechanical fastener which extends downwardly through the bottom of the base portion 186 in a central location thereon. An integrated circuit chip 192 is attached to an upper surface of the head 188 by conventional electrically conductive adhesive means such as reflowed solder 194. A ring 196 of insulative material is adhesively attached to the upper surface 190 of the head 188, surrounding the integrated circuit chip 192. A conductive compliant lead frame 198 is attached adhesively to the upper side of the insulating ring 196. Preferably, the lead frame assembly 198 is attached to the insulative ring 196 in a flat condition. Thereafter, additional electronic components, either active or passive in nature, such as the components indicated as 200 and 202 may be adhesively attached to the upper side of the lead frame assembly 198 using well-known techniques. The lead frame 198 is made, preferably, of a metal alloy such as a copper-nickel-tin alloy which has good conductivity and sufficient stiffness to be self-supporting and resilient.

The several terminals of the IC chip 192 are connected by respective conductors 204 to respective individual ones of the several leads 206 of the lead frame assembly 198, using conventional techniques for making the electrical connections. Similarly, the components 200 and 202 are connected electrically to respective ones of the individual leads 206. When this has been accomplished, the top 184 and base 186 are molded in place about the components mounted atop the head 188, preferably using a thermoplastic insulating material.

Thereafter, leads 206 are trimmed and bent to the shape shown in FIGS. 11 and 13, resulting in a complex lead frame assembly including the head 180, the leads 206, and the insulator 196. Each of the individual leads 206 is trimmed so that its outer end 208 is able to fit around a convexly arcuate lower rim portion 210 of the base member 186 toward a channel 212 which limits the possible extent of travel of each lead 206. Dividers 214 are provided to maintain separation between the individual leads 206 to prevent them from coming into electrical contact with adjacent ones. The leads 206 are, for example, 0.005–0.018 inch thick and 0.008–0.025 inch wide, and may be spaced at least as closely as to provide about 0.015 inch lateral separation.

Alignment pins 218 and a keying alignment pin 220, and corresponding alignment apertures 222 and a keying alignment aperture 224 are located, respectively, on the base member 186 and defined in the printed circuit 180, although their positions could be mixed or reversed as described previously in connection with the electrical circuit component housing 12 and printed circuit 10. When the alignment pins and apertures are properly mated, a contact portion 225 of each of the individual leads 206 is properly positioned to come into electrical contact with a corresponding terminal contact pad 226 of a respective conductor of the printed circuit 180. As with the conductors 80 of the printed circuit 10, the conductors 228 of the printed circuit 180 extend parallel with one another away from the mounting site of the electrical circuit component housing 182. When the ends 208 contact the bottom of the channel 212 an outward wiping movement of the contacts 225 against the terminal pads 226 occurs, contributing to good electrical contact.

An elongate portion, such as the "D" shank 230 is connected with the head 188 and extends through a hole 232 defined in the printed circuit 180, where a spring washer 234 and a locknut 236 perform the same functions as described previously in connection with the spring washer 66 and locknut 68 of the electronic circuit component housing 12.

A probe assembly 240 is similar in function to the probe assembly 130, as shown in FIG. 13, and includes a probe section 242 adapted to mate with each individual side of the electronic circuit component housing 12 uniquely to assure that the probe assembly 240 can mate in only one way with the electronic circuit component housing 12. Each probe section 242 defines a fulcrum in the form of a rib 244 located on an inner face or attaching side 246. An output lead set 248 extends from an upper portion 250 and elastic tension members 252 and 254 surround the probe sections 242 to hold them physically against the peripheral surfaces of the electronic circuit component housing 12, as in the probe assembly 130. As described previously with respect to the probe assembly 130 of FIGS. 8 and 10, the ends of the probe sections 242 abut against each other at diagonal end faces, and are hingedly connected to each other, by bent wires 258 inserted in respective bores 259 having enlarged mouths 260, corresponding with the bent wires 148, bores 146, and enlarged mouths 149.

A probe reference contact 256 extends inwardly into the channel 160 defined between the lid 14 and the base 16 of the electronic circuit component housing 12, where a reference contact pad 168 may be provided, as described previously. Extending downwardly and arcuately outwardly about the tip or lower marginal rim portion 262 of each probe section 242 are a plurality of spring contacts 264 which are similar to the spring contacts 225 of the electronic circuit component housing 182. The spring contacts 264 are located in positions corresponding to the locations of the several conductors 80, so that when the probe assembly 240 is attached to the electronic circuit component housing 12 the spring contacts 264 are held in electrical contact with the conductors 80, making the various voltages detectable by means of the output lead set 248. As with the probe assembly 130, the probe assembly 240 is held with sufficient force toward the upper surface of the printed circuit 10 by tension forces carried by the fastener 49 attaching the electronic circuit component housing 12 to the printed circuit 10.

Figure 14:
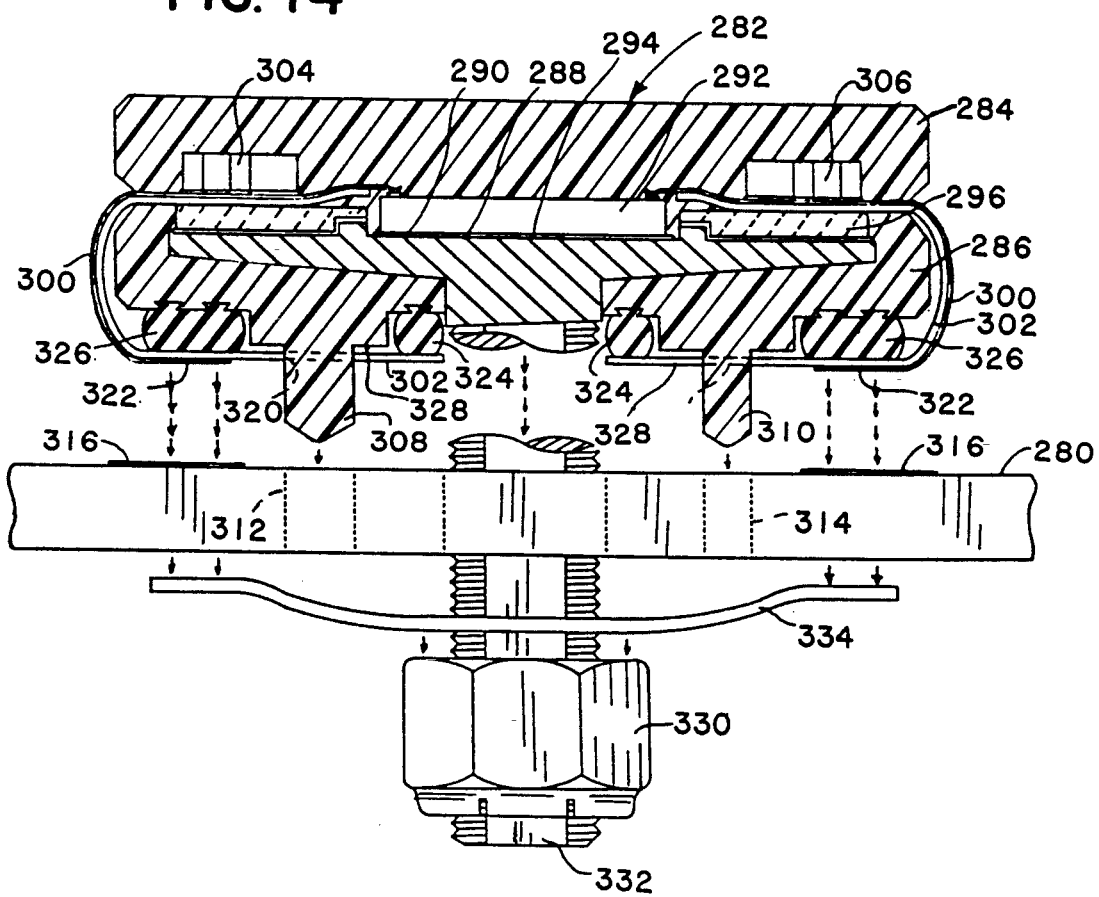
FIG. 14 is a sectional view of a portion of a printed circuit and an electronic circuit component housing mounted thereon which is a third embodiment of the present invention.
Figure 15:
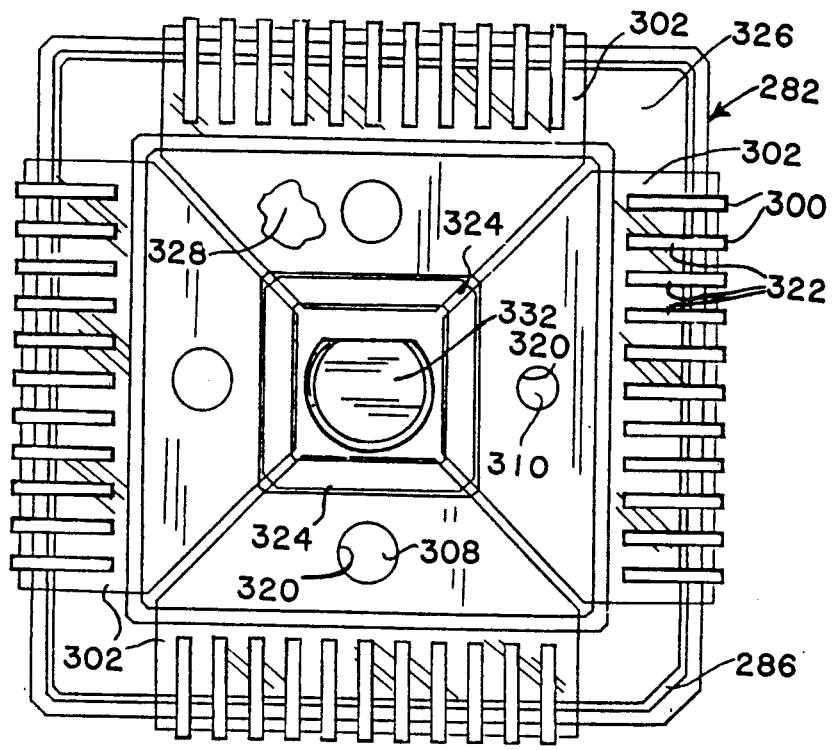
FIG. 15 is a bottom plan view of the electronic circuit component housing shown in FIG. 14.
Figure 16:
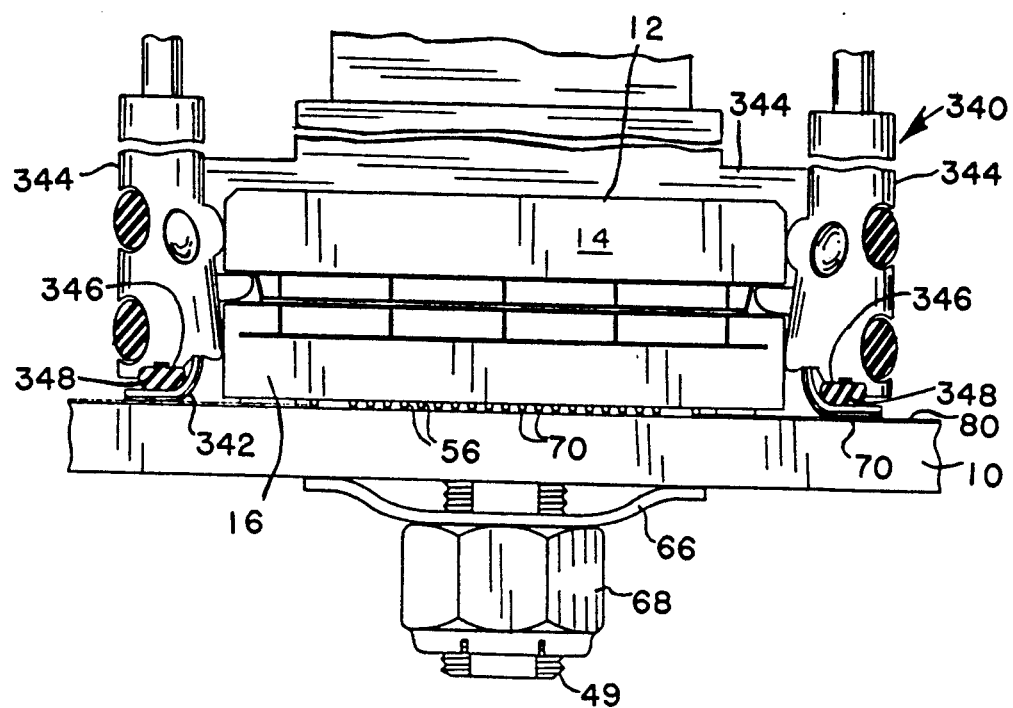
FIG. 16 is a sectional side view similar to that of FIGS. 10 and 13, showing the electronic circuit component housing assembly of FIGS. 1-5, together with a circuit test probe attached thereto.

A third embodiment of the electronic component interconnection mechanism according to the present invention is shown in FIGS. 14, 15, and 16, in which an electronic circuit component housing 282 is similar in many respects to the electronic circuit component housing 182, and is mounted on a printed circuit 280 in a similar fashion. A top portion 284, as is the top portion 184, is concurrently molded with a base portion 286 retaining a head 288 of a mechanical fastener as described previously in connection with the electronic circuit component housing 182. The head 288 includes an upper surface 290, and an integrated circuit chip 292, or another active electronic circuit assembly, is adhesively attached to the upper surface 290 by conventional means such as reflowed solder 294. A ring 296 of electrically insulating material is adhesively attached to the upper surface 290 and surrounds the integrated circuit chip 292.

The third interconnection mechanism, according to the present invention, resides in the provision the complex lead frame assembly of the electronic circuit component housing 282, which comprises a multi-layered "tape" lead frame 298 of flexible conductors including a plurality of closely-spaced individual conductors 300 deposited on a flexible supportive backing of sheet material 302, such as a polyimide plastic.

While this method of providing conductors in electronic circuits is well known as the tape automated bonding connection, in the present invention only one end of each of the conductors 300 is connected in the usual tape automated bonding method. Each of the several conductors 300 is connected either to a respective appropriately located terminal of the integrated circuit chip 292, or to respective conductors of other electronic components, either passive or active, such as the components 304 and 306, which are adhesively attached atop the flexible tape conductors of the lead frame 298. As with the electronic circuit component housing 182, both the lid portion 284 and the base portion 286 are concurrently molded of thermoplastic material surrounding the head 288 and the components which are mounted thereon. Respective alignment pins 308 and a key alignment pin 310 are provided as a part of the form of the base 286, and corresponding alignment sockets 312, 314 are defined through the support strata of the printed circuit 280 to ensure proper orientation of the electronic circuit component housing 282 when it is installed upon the printed circuit 280.

Terminal contact pads 316 and associated conductors extending away from the contact pads 316, are provided as a part of the printed circuit on the upper surface of the printed circuit 280. The contact pads 316 are located to correspond with the locations of the individual compliant conductors 300 which extend downwardly along the peripheral surface of the base member 286. The supporting insulative flexible material of the sheet backing 302 extends inwardly beneath the base member 286, where it is held appropriately in position by the provision of appropriately located apertures 320 through which the alignment pins 308 and key alignment pin 310 extend to retain the sets of conductors 300 properly located with respect to the base 286 so that horizontal, downwardly facing portions of each of the conductors 300 are available in the form of compliant electrically conductive contact portions 322.

Arranged along the bottom surface of the base member 286, and held in place preferably by being molded in place with the dovetail interconnecting portions, are respective inner and outer resilient, elastomeric support members 324 and 326 which extend downward beneath the base member 286 below the height of an alignment surface 328 surrounding each of the alignment pins 308 and key alignment pin 310 as a means of assuring that the electrical circuit component housing 282 assumes the proper location with respect to the upper surface of the printed circuit 280 in response to tightening of the locknut 330 on the elongate shank 332. Tightening the locknut 330 urges the spring washer 334 toward the opposite side of the printed circuit 280, placing the elongate shank 332 in tension and urging the electronic circuit component housing 282 into intimate contact against the upper surface of the printed circuit 280. When the elongate shank 332 is placed in tension, the force is distributed by the head 288 and urges the outer support elastomeric members 326 compressively toward the upper surface and the contact pads 316 on the printed circuit 280 urging the contact portions 322 of the compliant leads 300 into physical contact with sufficient force to provide reliable electrical contact between the contact portions 322 and the contact pads 316, thus electrically connecting the active and inactive component contained within the electrical circuit component housing 282 with the remainder of the electronic circuitry of the printed circuit 280. The amount of compression required depends on the material, and 20% compression, in the case of silicone rubber, is sufficient.

A third probe assembly 340 is provided with contacts of similar construction to that of the electronic circuit component housing 282. The probe assembly 340 is generally similar construction and operation with that of the previously described probe assemblies 130 and 240, except that it includes compliant electrically conductive contacts 342 of multilayered flexible tape-supported construction similar to that of the conductors 300, flexible backing sheet 302, and contacts 322 described above in connection with the electronic circuit component housing 282. A lower marginal portion 346 of each probe section 344, of which there is one for each side of the electronic circuit component housing 12, is provided with an elastomeric, compressible support portion 348 which is preferably molded in place along the lower marginal portion 346, so that each of the compliant contacts 342 is held in electrical contact with the respective conductor 80 extending outwardly away from the contact pads 72 surrounding the mounting site for the electronic circuit component housing 12. Also as described previously with respect to the probe assembly 130 of FIGS. 8 and 10, the ends of each probe section 344 abut against each other at diagonal end faces, and are hingedly connected to each other, by bent wires 350 inserted in respective bores 352 having enlarged mouths 354, corresponding with the bent wires 148, bores 146, and enlarged mouths 149.

Figure 17:
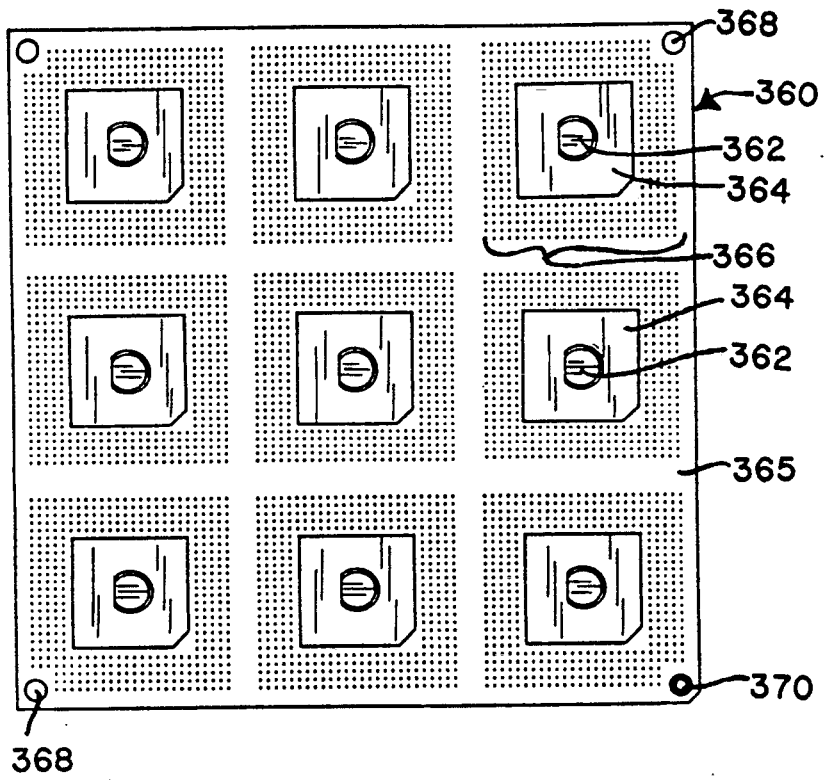
FIG. 17 is a bottom plan view of an electronic circuit component housing containing several electronic component assemblies and embodying the interconnection mechanism of the present invention.

The construction described above for each of the electrical circuit component housings 12, 182, and 282 provides compliant electrical contacts located appropriately close to one another to provide improved contact point density for easily mounting electronic circuit assemblies on printed circuits appreciably more densely than has previously been possible, making it possible to mount such components as integrated circuit chips in a space which may be as small as only 40% as large as that which would have been required to mount the same chip using previously employed interconnection and physical attachment systems, while also providing a path for conduction of thermal energy away from the active electronic components such as integrated circuit chips carried within the electronic circuit component housings. While the use of a single mechanical fastener has been disclosed in connection with attachment of single integrated circuit chips and associated discrete components, the mounting system and closely spaced compliant electrical contacts according to the invention can also be provided in a larger electrical circuit component housing 360, as shown in FIG. 17, where several integrated circuits, each mounted on a respective mechanical fastener 362 having a broad generally planar head 364 with an associated array of contacts 366, preferably of the deformable nodule type used in the electrical circuit component housing 12, are provided with respect to each individual one of the several active circuit components and their associated discrete active and/or passive components. When several integrated circuit components, each mounted on a separate mechanical fastener 362, are provided on a single base member 365, it is necessary to provide only a single set of alignment pins 368 and a single orientation-enforcing key alignment pin 370. Alternatively, a similar mechanism, such as a non-symmetrical arrangement of the fasteners 362 may be used to ensure proper orientation of the multiple component assembly 360 on a printed circuit, with each of the many compliant individual contacts located properly with respect to respective contact pads on the printed circuit, and with an appropriate amount of compressive force provided by tension in the individual mechanical fasteners 362.

Figure 18:
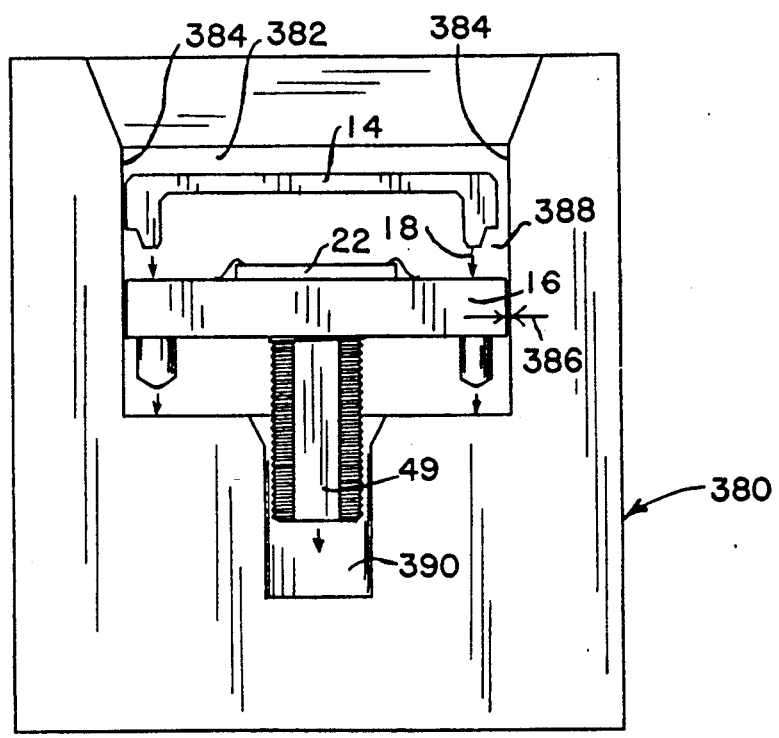
FIG. 18 is a sectional side view of an exemplary assembly alignment device and an electronic circuit component housing similar to that shown in FIGS. 1-5, showing the manner of assembling the circuit component housing with its lid properly aligned with its base.

As shown in FIG. 18, the electronic circuit component housing 12 is preferably assembled most conveniently, so as to ensure accurate alignment and hermetic sealing of the lid 14 to the base 16, by the use of an assembly guide 380 which may, for example, be a crucible capable of being heated in an oven to provide the required temperature for fusing a eutectic sealing material or reflowed solder to form the hermetic seal 18 between the lid 14 and base 16. The assembly guide 380 includes parallel vertical sides 382, 384 defining a cavity 388 to receive the base portion 16 and lid 14 properly aligned with respect to one another, and with a lateral gap 386 great enough to permit a freely sliding movement of the base 16 into and out of the cavity 388. The lateral gap 386, however, must be small enough to assure alignment of the lid 14 to the base 16 within the limits of tolerance imposed by the small size of the electrical conductors 80 in order that the probe assembly 130 can be properly aligned with the electrical conductors 80 when the rib 150 is held in contact with the lid 14 as previously described.

Depending upon the type of mechanical fastener used in conjunction with the electronic circuit component housing 12, a cavity 390 may need to be provided to receive a shank portion of a screw 49 in order to provide a stable location of the electronic circuit component housing 12 within the cavity 388. It should be noted that the alignment cavity 388 need not have continuous solid walls 382, 384 to accomplish the required alignment but need only constrain key portions of the outermost geometry of both the component housing lid 14 and the component housing base 16.

Figure 19:
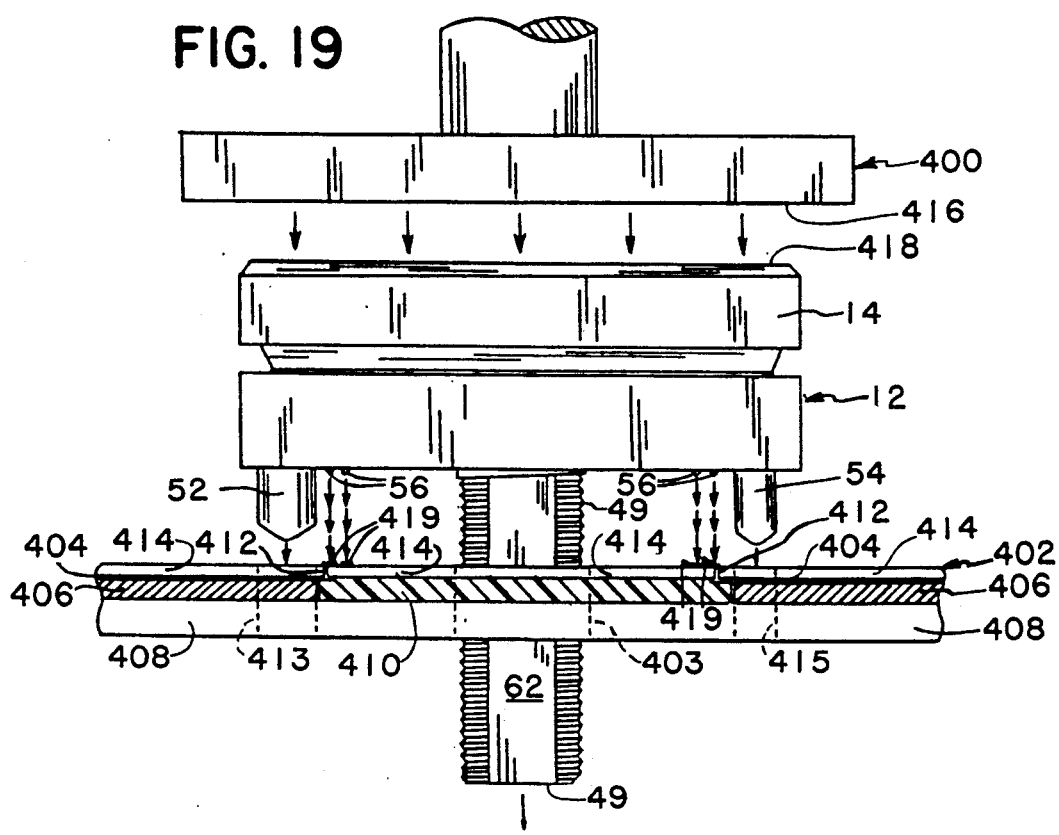
FIG. 19 is a side view of the electronic circuit component housing of FIG. 1, together with a sectional side view of a portion of a printed circuit board and a piston, for use in testing.

Referring now to FIG. 19 of the drawings, the electronic circuit component housing 12 is preferably and conveniently tested using the compliant printed circuit 402 and the piston 400. The screw 49 is inserted through the aperture 403, and the alignment pins 52 and the keying alignment pin 54 are respectively inserted through the apertures 413 and 415 of the compliant printed circuit 402, and where the bottom face of the piston 416 is brought into contact with the top face of the lid 418 and a downward force is applied against the electronic circuit component housing 12. This downward force brings the conductive compliant contact nodules 56 into contact with the terminal pads 419. The compliant printed circuit 402 is an assembly constructed of a top layer 414 on which the terminal pads 419 reside and are electrically connected each to an individual printed circuit conductor 404. This connection may be made to the bottom side of the top layer 414 through a via 412. The compliant printed circuit is also composed of a complex second layer consisting of an elastomeric supporting member 410, residing directly beneath and supporting the terminal pads 419. This elastomeric supporting member 410 may be made of silicone or other elastomeric material, and the second layer may also consist of an adhesive member 406, such as a pre-preg, whereby this adhesive member would capture and secure the top layer 414 to preserve alignment with the bottom layer 408. The bottom layer 408 is also a supportive layer such that the force exerted by the piston 400 causes the conductive compliant contact nodules 56 to firmly contact the terminal pads 419 with sufficient force to provide an electrical connection between all pads and nodules of the electronic circuit component housing 12, and the elastomeric supporting member 410 adequately complies with the coplanarity existing across all conductively compliant contact nodules 56, without permanently distorting the conductive compliant contact nodules 56, thereby preserving their shape for later insertion and attachment to the printed circuit 10 of FIG. 1. The top layer of the compliant printed circuit 402 will typically be fabricated from a polymer, such as a polyimide, and the supporting layer 408 may also be made of the same material, or an epoxy-glass material, either alone or in a complex combination with a reinforcement material, such as a metal, as a backing or as an insert within the third supportive layer 408.

Figure 20:
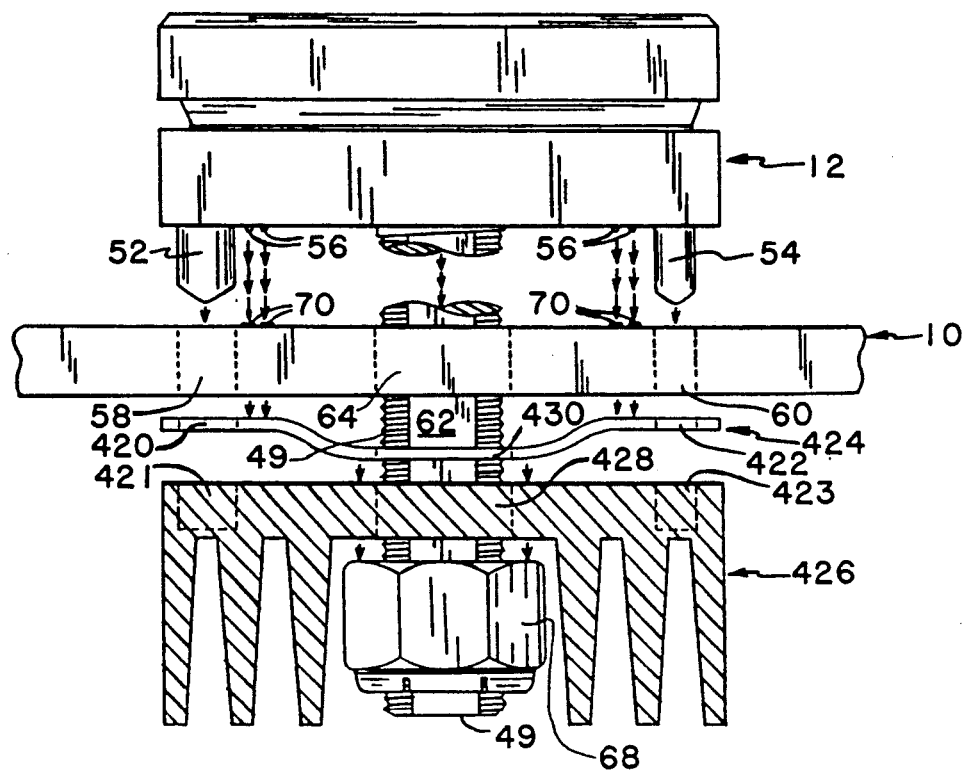
FIG. 20 is a side view of a portion of a printed circuit and an electronic circuit component housing and a sectional view of a convection heat dissipation member for use together with the circuit component housing according to the invention.

FIG. 20 shows an alternative embodiment of the interconnection system of the present invention, as shown in FIG. 1, in which the printed circuit 10 is shown together with an electronic circuit component housing 12, a tensioning member such as spring washer 424, and a convection heat dissipation member 426. This embodiment enables the electronic component 22 of FIG. 1, which may be a heat generating element such an an integrated circuit chip, to conductively dissipate such heat through thermal conduction vias 44, and the head 48, and down through the screw shank 49 as also shown in FIG. 1, and conductively to transmit this heat further to the convection heat dissipation member 426 whereby it may in turn be dissipated into the surrounding environment. The spring washer 424 is shown to contain aperture 430 for insertion of the screw stud 49 plus apertures 420 and 422 for insertion of alignment pins 52 and key alignment pin 54 respectively, thereby enabling the spring washer 424 to be in optimum alignment with the electronic component housing 12. Heat sink mating alignment pin cavities 421 and heat sink mating keying alignment pin cavity 423 provide an alignment mechanism to enable the convection heat dissipation member or heat sink 426 to be aligned to the electronic component housing 12 fastened to the printed circuit board 10, so as to minimize the total amount of footprint area required for the entire assembly. The lock nut 68 acts in concert with the complementary member of the mechanical fastener, in this case the screw shank 49, and the spring washer 424 to provide electrical interconnection of the conductive compliant contact nodules 56 with the terminal contact pads 70 as discussed for the assembly of FIG. 1, except as this force is also applied through the convection heat dissipation member 426.

Figure 21:
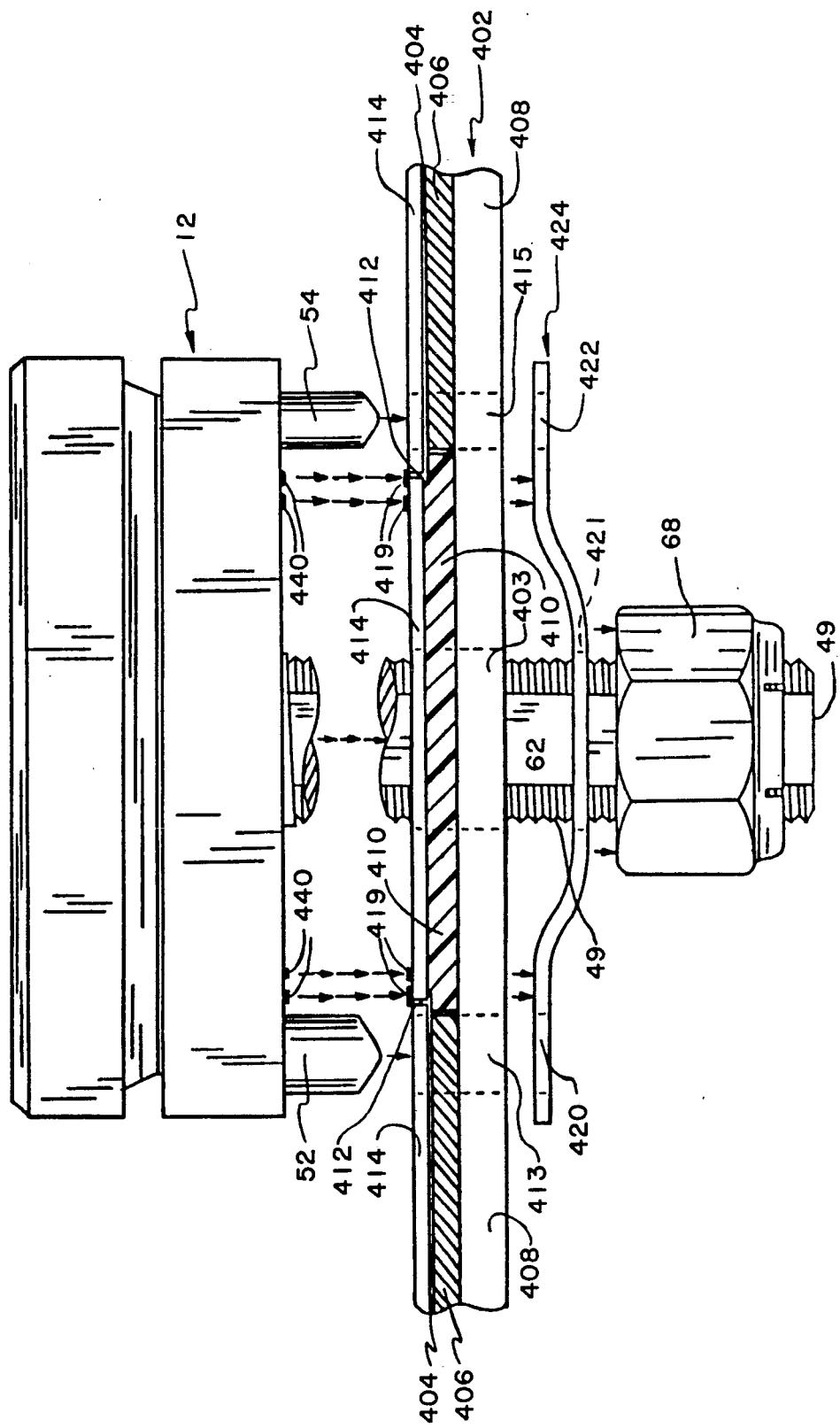
FIG. 21 is a sectional side view of a portion of a printed circuit together with an electronic circuit component housing according to the invention.
Figure 22:
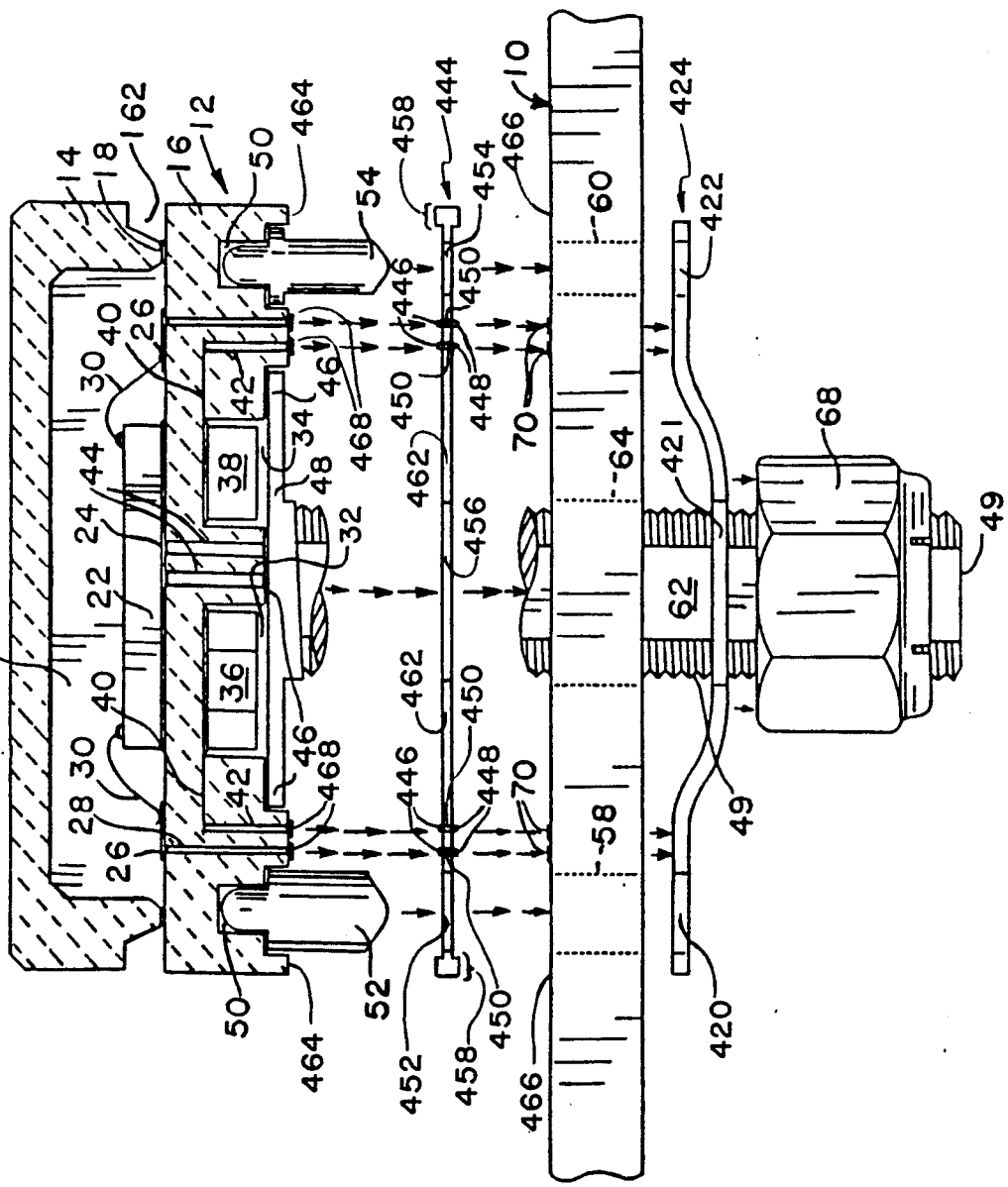
FIG. 22 is a sectional side view of a combination including an electronic circuit component housing and a portion of a printed circuit together with a nodule contact array assembly according to the invention.

Referring now to FIG. 21 of the drawings. This figure depicts another embodiment of the present invention comprising an electronic circuit component housing 12, a compliant printed circuit 402, a spring washer 424 and a mechanical fastener, such as a screw 49, and the complementary mechanical fastener component, such as a locknut 68. The compliant printed circuit 402 containing the elastomeric supporting member 410 enables the nodules 440 to be constructed of a material having a lower degree of compliance than the nodules 56 of FIG. 1, such as a gold plated copper. This is accomplished by enabling the compliant printed circuit 402 to provide the compliance necessary to achieve the coplanarity required for interconnecting of the nodules 440 to the terminal pads 419 according to the tensioning structure previously discussed in connection with FIG. 1. This embodiment provides for the compliance required for achieving adequate electrical contact, between all terminal pads 419 of the printed circuit 402 and all respective contact nodules 440 residing on the electrical circuit component housing 12, to be provided by the elastomeric supporting member 410 of the printed circuit 402, thus, additionally embodying the compliant interconnection mechanisms for electronic components according to the present invention.

Referring now to FIGS. 22, 23, 24, 25, 26, 27, 28, 29, and 30 of the drawings. Consider first the nodule contract array assembly 444 of FIG. 22 and FIG. 24. The nodule contact array assembly 444 is composed of upper electrically conductive compliant contact nodules 446 and lower electrically conductive compliant contact nodules 448, as attached to a base substrate assembly 462 which contains electrically conductive material 450 vertically interconnecting all or selected ones of the upper conductive compliant contact nodules 446 to respective ones of the lower conductive compliant contact nodules 448, so as to provide electrical continuity from the upper nodules 446 to the lower nodules 448. A compression limiting step member 458 may optionally be included as an integral portion of the base substrate assembly 462. The embodiment of FIG. 22 enables the conductive compliant contacts 446 and 448 of the base substrate assembly 462 to provide interconnection between the contact pads 468 of the electronic circuit component housing 12 and the terminal pads 70 of the printed circuit 10. This interconnection is accomplished by placing the nodule contact array assembly 444 in alignment with the electronic circuit component housing 12 and the printed circuit 10 such that alignment pins 52 and keying alignment pin 54 respectively pass successively through apertures 452 and keying aperture 454 of the nodule contact array assembly 444, and through apertures 58 and keying aperture 60 of the printed circuit assembly 10; and where the mechanical fastener screw 49 successively passes through aperture 456 of the nodule contact array assembly 444 and through aperture 64 of the printed circuit 10 and aperture 421 of the spring washer 424, thereby allowing the spring washer 424 to be compressed by the mechanical fastener assembly simultaneously engaging the top nodule contacts 446 of the nodule contact array assembly 444 with the contact pads 468 of the printed circuit housing 12 and the bottom conductive compliant nodule contacts 448 with the terminal pads 70 of the printed circuit 10. Further, the tension exerted by the spring washer 424 may be limited in its compressive force by the action of the compression limiting member 458 acting against the bottom surface 464 of the electronic component housing 12 in conjunction with the top surface 466 of the printed circuit 10 so as to limit the vertical compression of the conductive compliant contact nodules 446 and 448 to an optimum compressive force. In this manner, the coplanarity between each contact pad 468 and each respective terminal pad 70 is achieved by the intervening nodule contact array assembly 444 as achieved by the individual compression of each upper and lower conductive compliant nodule contacts 446 and 448, respectively, while simultaneously electrically interconnecting the contact pads 468 and the terminal pads 70. The base substrate assembly 462 may be made of a ceramic material such as alumina and the electrical interconnection 450 may be made of an integral metalization such as tungsten.

Figure 23:
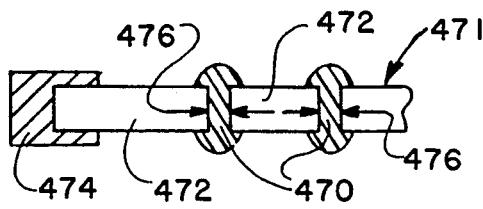
FIG. 23 is a sectional side view of a portion of a nodule contact array assembly usable in the combination shown in FIG. 22.

FIG. 23 shows a second nodule contact array assembly 471 embodying the invention. In the contact array assembly 471 the base substrate assembly 472 is made of a polymer, such as a polyimide, incorporating apertures 476. Conductively compliant contact nodule assemblies 470, having an upper nodule, a lower nodule, and an intermediate interconnection between the upper and lower nodules, are attached to the base substrate assembly 472 through the apertures 476 and provide the mechanism for electrical interconnection between the upper and lower nodules. Additionally, a compression limiting stop member 474 may be attached to the base substrate assembly 472 at the outer edge. The conductively compliant nodule assemblies 470 may be made of a conductive polymer, such as a conductive silicone, and the compression limiting member 474 may be made of a thermoplastic.

Figure 26:
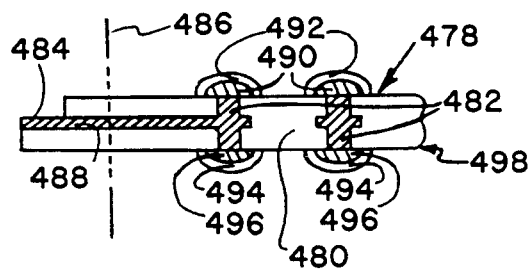

FIG. 26 represents a third nodule contact array assembly 478 which embodies the invention. In this embodiment a base substrate assembly 480 may be made of a ceramic material, such as alumina, containing metalizations 482 and 488 which may be made of a material such as tungsen. Metalizations 482 vertically interconnect the upper nodules, comprised of a base metalization 490 which may be made of a hard material such as nickel and an outer metalization 492 which may be made of a soft metalization such as gold, and where the metalization 482 interconnects the upper nodules with the lower nodules. The lower nodules are also comprised of a base metalization 496, which may also bed made of a hard metalization such as nickel, and an outer metalization 494 which may be made of a soft metalization such as gold. The metalization 488 is a plating tie-bar interconnection which serves temporarily to interconnect each independent vertical metalization 482 to the plating tie-bar 484. This tie-bar provides the electrical connection to each vertical metalization 482 for electrolytically plating the base nodule metalizations 490 and 496, as well as the outer nodule metalizations 492 and 494. Following such plating the nodule contact array assembly 498 is then cleaved along cleavage plane 486 to separate the tie-bar 484 from the vertical metalizations 482 thereby leaving each upper nodule uniquely connected by the vertical metalization 482 to each respective lower nodule and electrically isolated from all other vertical metalizations 482.

Figure 25:
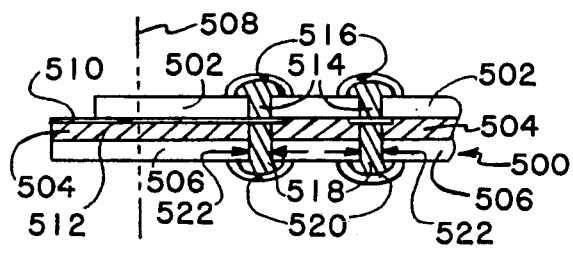
FIGS. 25, 26, 27 and 28 are sectional side views of portions of other nodule contact array assemblies of sorts usable in the combination shown in FIG. 22 according to the invention.

FIG. 25 represents a fourth nodule contact array assembly 500 which is yet another embodiment of the invention. A three layer structure of the contact array assembly 500 comprises an upper layer 502 which may be made of a polymer such as epoxy or polyimide, and an intermediate adhesive layer 504, which may be made of similar polymers, which laminate together the upper layer 502 and a bottom layer 506 which is similar to the upper layer 502. Apertures 522 are placed through all three layers and each aperture is interconnected with the plating tie-bar 510 by a plating metalization 512 which is unique for each vertical via 522. The conductive compliant nodules consist of the upper nodules, which are comprised of a hard base metalization 514, which may be a plate nickel having an outer metalization 516 which may be a plated gold, and also consist of the bottom nodules, which are also comprised of a hard base metalization 518, which also may be a plated nickel having an outer soft metalization 520 which may be a plated gold. These nodules are preferably electrolytically plated using the plating tie-bar 510. The vertical nodule pairs are then electrically separated from each other by shearing the nodule contact array assembly 500 along the shear plane 508, leaving each upper nodule electrically connected to each lower nodule, but not otherwise connected electrically except as desired for the circuit design involved.

Figure 28:
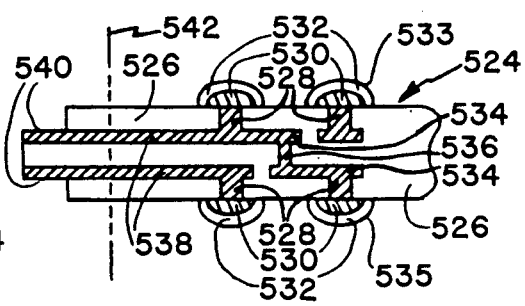

FIG. 28 shows a fifth nodule contact array assembly 524 which is yet a further embodiment of the invention. This nodule contact array assembly 524 is similar to assembly 498 of FIG. 26 with the exception that the upper nodules 533 may be routed through the substrate 526 for interconnection to lower nodules 535 which are not positioned immediately opposite the upper nodules 533, but which may be electrically interconnected by a metalization via 536 to metalization routing lines 534 which comprise a printed circuit to electrically interconnect certain ones of the upper nodules 533 with respective ones of the lower nodules 535. The vertical metalizations 528 and the plating interconnect tie-bar metalizations 538, plus the printed circuit routing metalizations 534 and the via metalizations 536, may all be of tungsten, and the nodule base metalizations 530 may be a plated nickel with the outer nodule metalizations 532 being of plated gold. Plating of these materials is facilitated by the plating tie-bars 540 and where separation of the interconnections between the nodules as made by tie-bars 540 is accomplished by cleaving aling cleavage plane 542. Such cleaving leaves electrically separate all nodules not interconnected through the use of interconnection vias 536 and interconnection metalizations 534.

Figure 27:
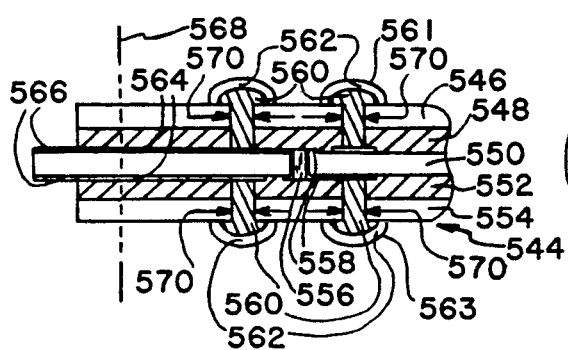

FIG. 27 shows a sixth nodule contact array assembly 544 which also embodies the present invention. Array assembly 544 is a five layer assembly consisting of an upper layer 546, a center layer 550, and a bottom layer 554, all of which may be made of a polymer such as epoxy or polyimide. Inner layers 548 and 552 are adhesive layers laminating together the upper layer 546 and the bottom layer 554 to the center layer 550. Vias 570 extend vertically through the assembly 544 and cross interconnection of the upper nodules is accomplished with the use of via 556 and interconnection circuitry 558. Each upper nodule 561 and lower nodule 563 is similarly interconnected to the tie-bars 566 using the tie-bar interconnecting metalizations 564. The nodule base metalizations 560 are typically plated using nickel in the vias 570 with the outer nodule metalizations 562 being plated on top of these base metalizations, typically using gold. The nodules are then separated from the plating tie-bars 566 by cleaving along cleavage plane 568 leaving the upper nodules 561 selectively connected to respective ones of the lower nodules 563, such interconnection not being limited to a lower nodule located directly opposite an upper nodule.

Figure 24:
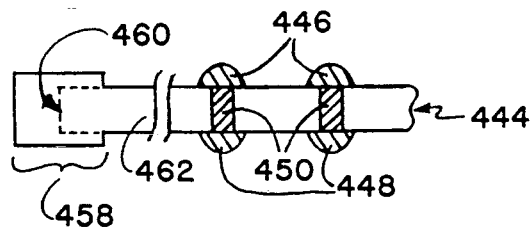
FIG. 24 is a sectional side view of a portion of the nodule contact array assembly shown in FIG. 22.
Figure 29:
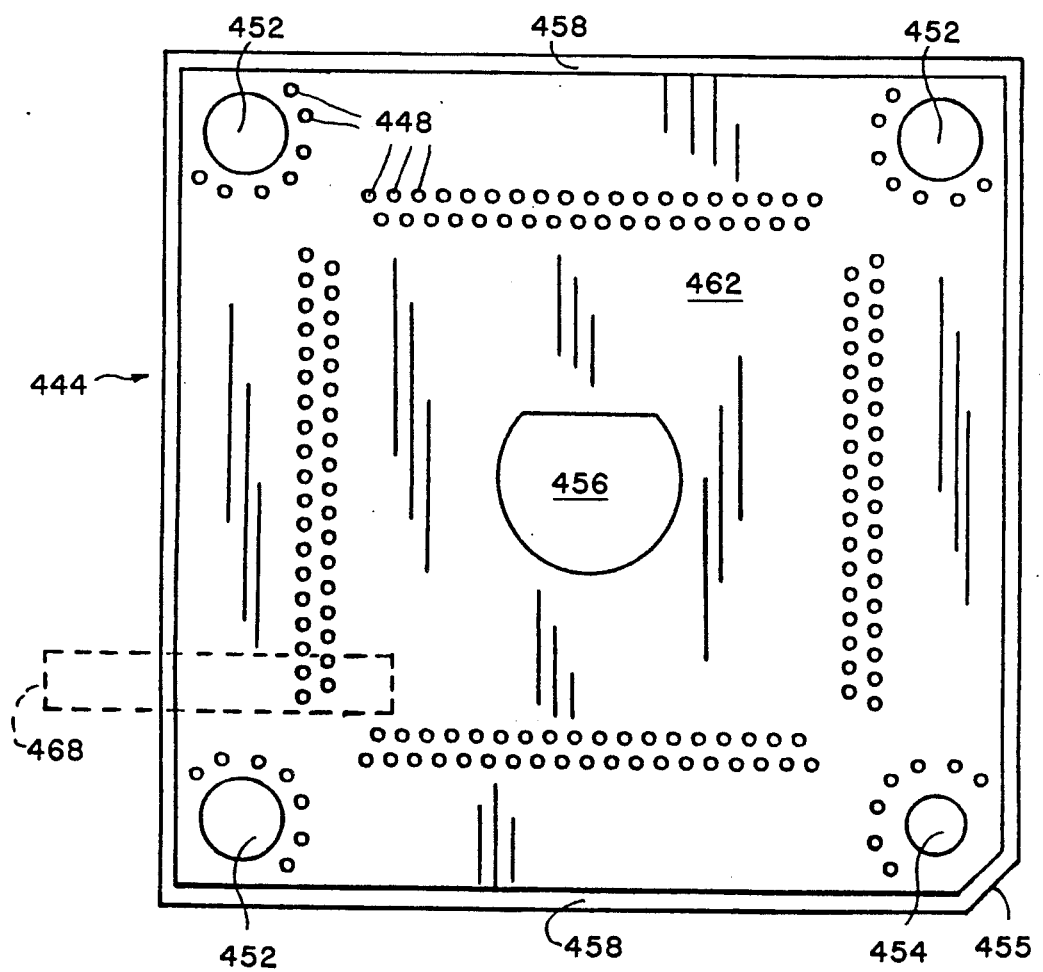
FIG. 29 is a bottom plan view of the nodule contact array assembly shown in FIG. 24.
Figure 30:
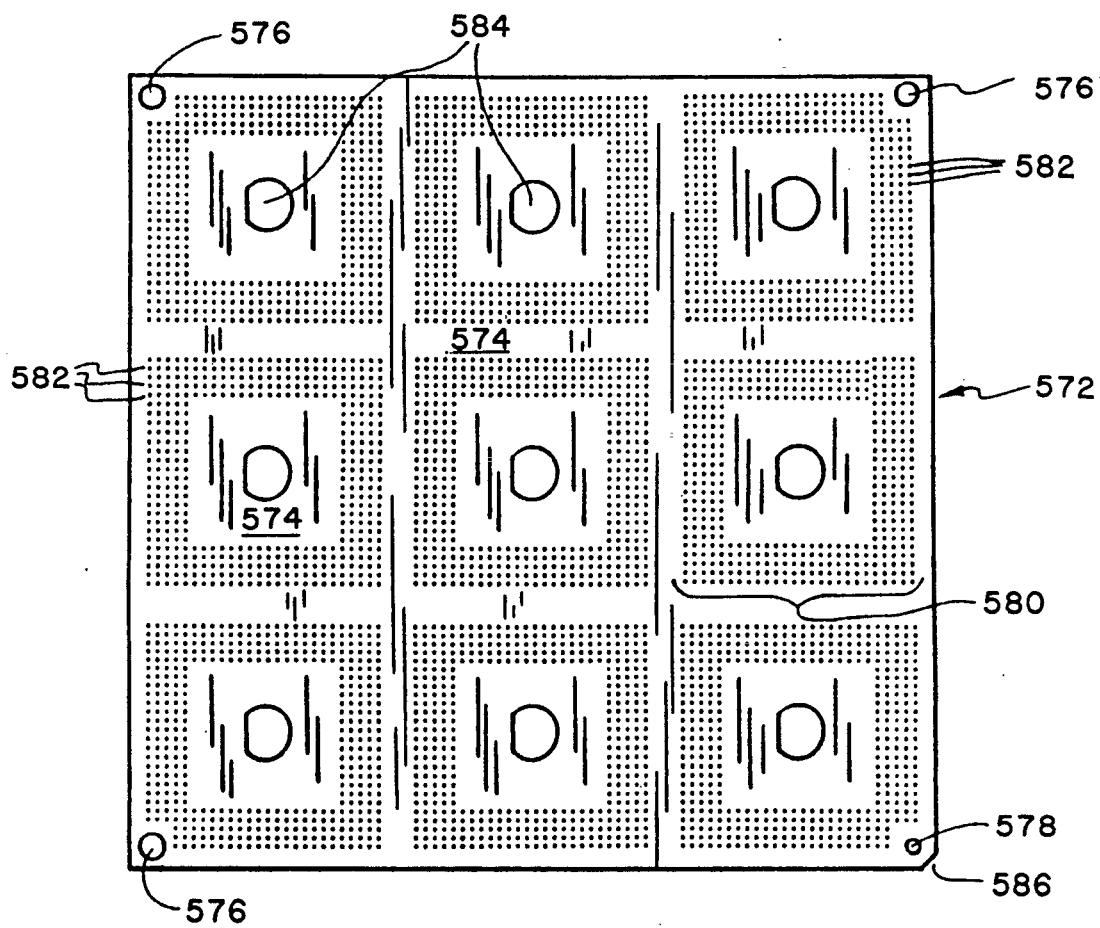
FIG. 30 is a bottom plan view of a nodule contact array assembly for accommodating an electronic circuit component housing containing several electronic component assemblies and embodying an interconnection mechanism according to the present invention.

FIG. 29 is a bottom plan view of the nodule contact array assembly 444, a portion 468 of which is shown in FIG. 24. Nodule contact array assembly 444 of FIG. 29 would uniquely mate the electronic component housing 12 of FIG. 2 with the printed circuit 10 of FIG. 3. Keying alignment aperture 454 is uniquely positioned with respect to the D-hole 456 and the clipped corner 455, so that D-hole 456 provides a mechanism for automatic mechanical orientation of the assembly 444 for electrically interconnecting the electronic component housing 12 with the printed circuit 10. Additionally, the clipped corner 455 provides visual indication of correct alignment after assembly.

The compression limiting stop member 458 may be an integral portion of the base substrate assembly 462. Either or both of the stop member 458 and the base substrate assembly 462 may be made of a polymer or of a ceramic. When compression stop limiting member 458 is not employed a well defined edge 460 remains exposed. The upper nodules 446 and the lower nodules 448 may be made of a resilient electrically conductive material, such as a silicone conductive elastomer, or of a non-resilient electrically conductive compliant material, such as gold. The conductive elastomer may be attached using wet printing techniques, and the conductive compliant material may be attached using electroplating techniques or may be directly bonded to the base substrate assembly 462 using ball bonding techniques. Both the upper nodules 446 and the lower nodules 448 may attach to electrical conductors 450 which electrically interconnect selected upper and lower ones, respectively.

The nodule contact array assembly 444 is for use with a single mechanical fastener. However, a mounting system according to the invention disclosed can also be provided for a larger electrical circuit component housing, such as is shown in FIG. 17, using the nodule contact array assembly 572 shown in FIG. 30. The array assembly 572 is configured to accommodate several mechanical fasteners 362 whereby these fasteners would apss through apertures 584, with the alignment pins 368 passing through apertures 576, and the keying alignment pin 370 passing through the keying aperture 578. The keying aperture 578 is uniquely identified by its proximity to the clipped keying corner 586. The individual conductive compliant contacts 582 may be mounted in arrays 580 about each mechanical fastener aperture 584 and these arrays 580 may populate the substrate 574 according to the unique configuration required by the respective larger electrical circuit component housing.

Figure 31:
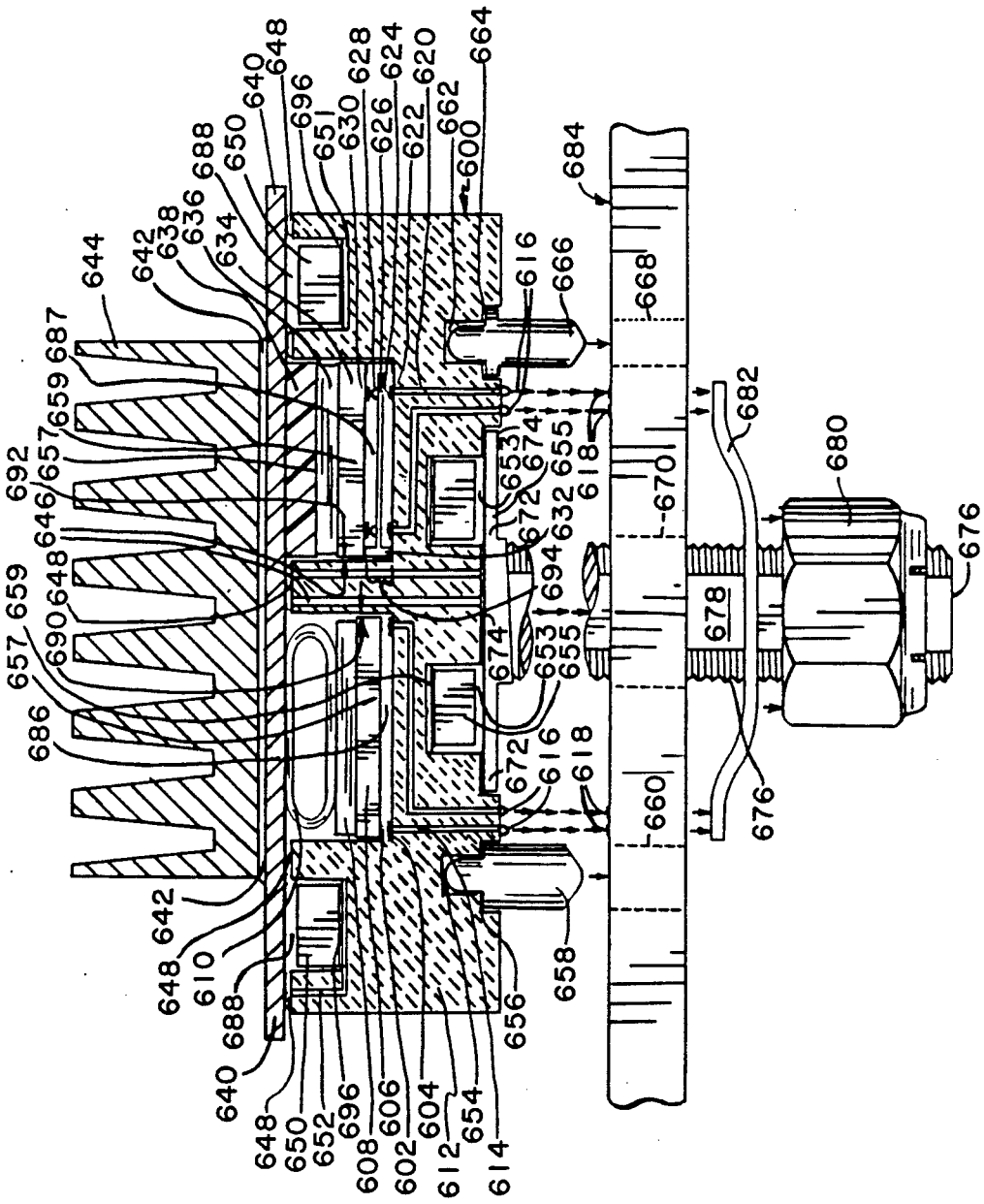
FIG. 31 is a sectional side view of a portion of a printed circuit and an electronic circuit component housing embodying an interconnection mechanism according to the present invention.

Referring now to FIG. 31, which presents another embodiment of the present invention, an electronic circuit component housing 600, which may be made of a ceramic material such as alumina, contains multiple cavities 686, 687 for active components, such as integrated circuits 606 and 634, and multiple cavities 688 for housing passive components such as the decoupling capacitors 650. These cavities may be sealed with a lid 640 using a hermetic seal formed of a fusible adhesive 648, as by soldering. A convection heat dissipation member 644 may be physically and thermally attached to the lid 640 by a metallic adhesive, such as a nickel-copper-silver brazing alloy 642. Additional cavities 662 and 654 may also be a part of the electronic circuit component assembly 600 where alignment pins 658 are fixedly held in place within cavities 654 by brazing alloy 656, and where keying alignment pin 666 is also fixedly held in place within cavity 662 by brazing alloy 664. Electronic components 655 are housed within cavities 653 which are hermetically sealed by a head portion 672 of tensionable fastner 676 similar to the assembly of FIG. 22. A head 672 of a mechanical fastener such as a screw 676 is fixedly attached to electronic circuit component body 612 by an adhesive 674, such as by being brazed. Electronic components 655, which may be capacitors, are physically and electrically attached to conductors 657 by conductive adhesive 659, which may be a solder. Similarily, electronic component 650 is physically and electrically attached with electrically conductive adhesive 696 to electrical conductor metalization 651. Upon insertion of the electronic component housing 600 into the printed circuit 684, alignment pins 658 mate with alignment holes 660 in the printed circuit assembly 684, and keying alignment pin 666 mates with keying alignment hole 668, to provide accurate positioning of the conductive compliant contact nodules 616 with the terminal pads 618. The shank of screw 676 has a flat side 678 creating a D-shank for uniquely and automatically positioning the electronic component housing for automated mechanical insertion of the housing 600 into the printed circuit 684. The spring washer 682, in conjunction with the locknut 680, provides the force required to conform the conductive compliant contact nodules 616 with the coplanarity presented at the terminal pads 618 of the printed circuit 684, thereby enabling all contracts 616 to physically and electrically mate with all respective terminal pads 618.

The electrical conductors of the electronic components 606 and 634 are interconnected with their respective electrical conductors 614 and 620, within the electronic circuit component housing 600, by two different mechanisms embodying the invention, as is also shown in FIG. 31. The first of these mechanisms employs conductive compliant contact nodules 602 attached to the electronic component 606 within a cavity 686, as shown in FIG. 31. Conductive compliant contact nodules 602 may be made of a resilient electrically conductive material, such as a silicone conductive elastomer, or of a non-resilient electrically conductive compliant material, such as gold. The conductive elastomer may be attached to the electronic component 606 using wet printing techniques, and the conductive compliant material may be attached using electroplating techniques or directly bonded to electrical conductors residing on the electronic component using ball bonding techniques. The alignment of the conductive compliant contact nodules 602 of the electronic component 606 with terminal pads 604 of the electronic component housing 600 is accomplished by defining the cavity 686 to be a predetermined size with respect to the electronic component 606, whereby a lateral gap 690 between the wall of the interior of the cavity and the outside of the electronic component 606 is large enough for insertion of the electronic component 606, yet small enough to constrict the travel of the conductive compliant contacts nodules 602 to remain within the alignment tolerance imposed by the dimensions and locations of the terminal pads 604. Additionally, the force required to achieve coplanarity and electrical contact between all conductive compliant contact nodules 602 and all mating terminal pads 604 within cavity 686, respectively, is provided by a spring mechanism 610, compressed by the lid 640 and fixedly held in compression by the sealing adhesive 648, which may be a solder. The force exerted by the spring 610 is spread evenly across the electronic component 606, on the side opposite the conductive compliant contact nodules 602, by a rigid force spreading member 608. Additionally, excess heat may be transferred to the convection heat dissipation member 644 by conduction through the force spreading member 608, the spring 610, the lid 640, and the adhesive 642. The heat dissipated by the electronic component 606 may also be convected by the atmosphere within cavity 686 to the walls of the cavity, and conducted through the conductive compliant contacts 602 and the terminal pads 604, to be absorbed by the body 612 of the electronic component housing 600. This additional dissipated heat may be collected by thermal conductors 646, metalizations extending through the body 612, and conducted by them to the head 672 of the mechanical fasteners by way of the adhesive 674, which may be a brazing alloy. This heat is thereby conducted from the electronic circuit component housing 600 by way of the screw 676, and by being conducted to the convection heat dissipation member 644 by way of the lid sealing adhesive 648, through the lid 640, and on through the adhesive 642, to the convection heat dissipation member 644.

Another mechanism for connecting an electronic component within the housing 600 employs a nodule contact array assembly 632 to interconnect the terminal pads 630 of an electronic component 634, which may be an integrated circuit, to terminal pads 622 located within a cavity 687 of the electronic component housing 600, by way of upper conductive compliant contact nodules 628, interconnection metalizations 626, and bottom conductive compliant contact nodules 624. This is accomplished by locating the nodule contact array assembly 632 within the electronic component cavity 687, the sizes, respectively, of the cavity 687 and the component 634 providing no greater than a predetermined maximum lateral gap dimension 692 which restricts the freedom of movement for both the electronic component 634, and the nodule contact array assembly 632 to be within predetermined tolerances for aligning the upper conductive compliant contact nodules 628 with the electronic component terminal pads 630, and the bottom conductive compliant contact nodules 634 with the electronic component housing terminal pads 622. A compression limiting member 694 of the nodule contact array assembly 632 restricts the compression applied to the conductive compliant nodule contacts 628 and 624 to a predetermined range. The force required for pressing the electronic component 634 and the nodule contact array 632 toward and against the terminal pads 622 is derived from the spring member 638 which may be of an elastomeric material such as a silicone. The force of the spring member 638 is applied to a rigid force spreading member 636 which causes the force to be evenly applied across the electronic component 634 on the side opposite the terminal contacts 630. This force is applied during the attachment of the lid 640 to the electronic circuit component body 612. The lid is then fixedly held in place by the adhesive 648 which may be a heat conductive material such as solder.

In contrast to these two ways of securing and connecting electronic circuit components 606 and 634, electronic components 650, which may be decoupling capacitors, are mechanically and electrically connected to the circuit conductors included in the electronic component body 612, by use of a conductive adhesive 696, which may be a solder. The electrical interconnection of the electronic component 650 to the printed circuit conductor 652 at the left side of FIG. 31, may be made such that the printed circuit conductor 652 would electrically charge the lid 640 by way of the adhesive 648 which may be a conductive metallic solder.

The importance of the two interconnection mechanisms just discussed arises from the ease of repairability and replacement of electronic components 606 and 634. Heating the electronic component housing 600 to a temperature high enough to cause the adhesive 648 to melt would release the lid 640, which would separate from the body 612 due to the force exerted on the underside of the lid by the springs 610 and 638. Following the removal of the lid 640 the electronic components 606 and 634 would be selectively removed and replaced with new components should a failure in either or both components have occurred. Such replacement, because of the use of the connecting mechanisms of the present invention, is simple and quick and does not require cumbersome and expensive cleaning and redeposition of adhesives such as the adhesive 696.

The two ways discussed for interconnecting electronic components 606 and 634 to the printed circuit conductors 614 and 620 of the electronic component housing body 612 enable these components to be electrically interconnected with the printed circuit 684 by way of the printed circuit conductors 614 and 620, respectively, and the compliant contact nodules 616 and the terminal pads 618. These connection mechanisms result in reduced inductive and capacitive parasitic interconnection effects as compared with the use of previously available tape automated bonding and wire bonding.

Figure 34:
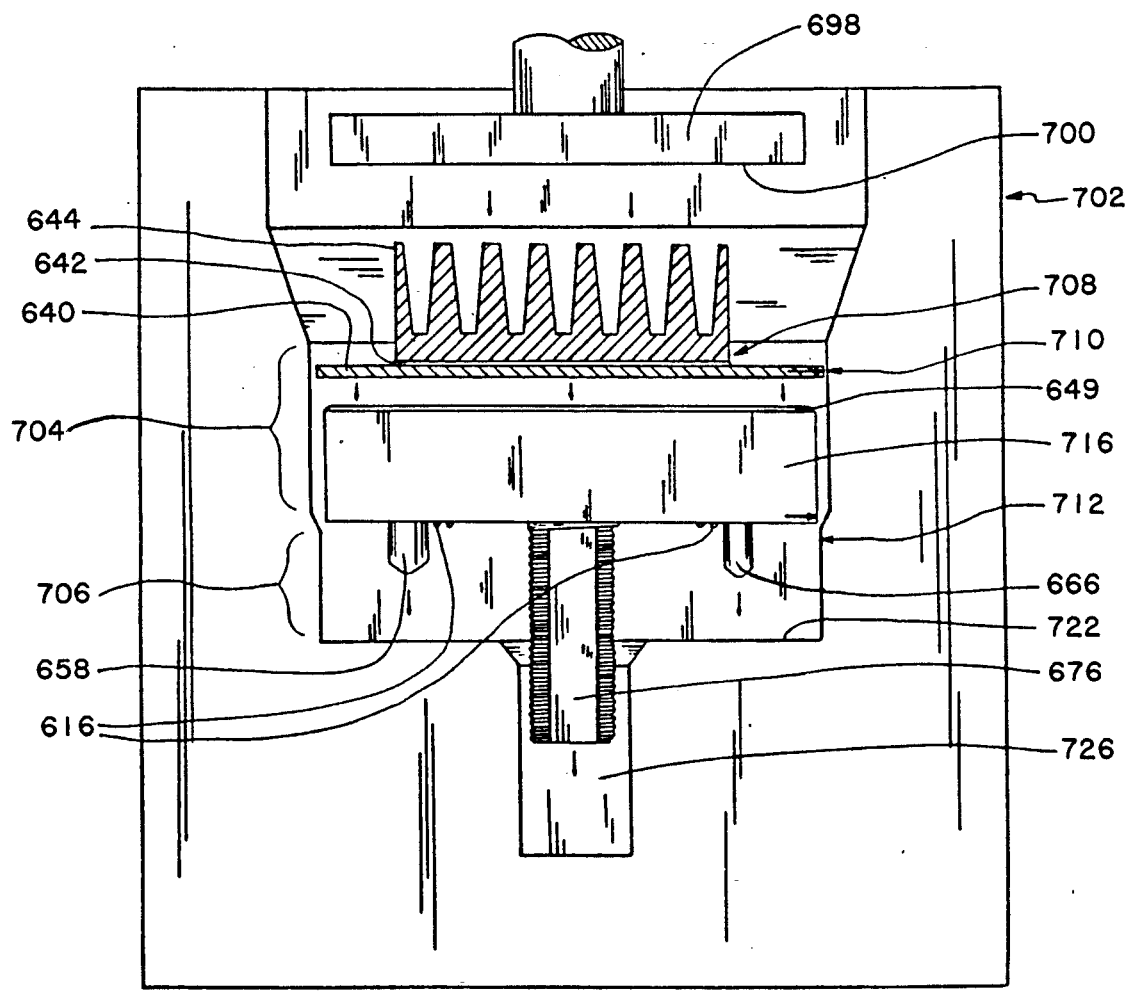
FIG. 34 is a sectional side view of an exemplary assembly alignment device, showing the manner of assembling a circuit component housing similar to that shown in FIG. 31.

Referring now to FIGS. 31 and 34, an electronic circuit component housing 600 is assembled most conveniently using the assembly guide 702 which may, for example, be a crucible capable of being heated in an oven to provide the required temperature for fusing an adhesive material 648, such as a reflow solder, to form a hermetic seal. This fusible adhesive material 648 is placed between the lid assembly 708, comprising the convection heat dissipation member 644 as attached to the lid 640 by the adhesive 642, and the body 612 of the electronic circuit component housing 716. The body 612 of the electronic circuit component housing is placed in the lower cavity 706 of the assembly guide 702, and the lid assembly 708 is automatically aligned to the housing 716 by subsequently placing assembly 708 within the upper cavity 704. The upper and lower cavities 704 and 706 are formed with sufficient precision that the maximum dimension of each of the gaps 710 and 712 is small enough to keep the lid assembly 708 aligned properly with the body 612. The shank of the screw 676 fits into the cavity 726 with the depth of insertion of the body 612 being limited by alignment pins 658 and 666 when they come to rest against the bottom portion 722 of the lower cavity 706. In this manner the conductive compliant contact nodules 616 are kept away from contact with the bottom surface 722 of cavity 106 so as to not cause distortion of their shape when a force is applied to piston 698. The downward force of piston 698 engages the lid assembly 708 with the electronic component housing 716 such that the bottom portion of the piston 700 contacts the top portion of the convection heat dissipation member 644 compressing the spring members 610 and 638 shown in FIG. 31 with the lid assembly 708 until the lid 640 engages the hermetic seal material 649. This compression, in turn, forces contact to be made by the conductive compliant contacts residing within cavities 686 and 687 according to the mechanisms previously described. The hermetic seal is then made by fusion and adhesion of the adhesive 648, to join the lid assembly 708 fixedly with the electronic component housing body 612 resulting in the sealed electronic circuit component assembly 600 of FIG. 31.

Figure 32:
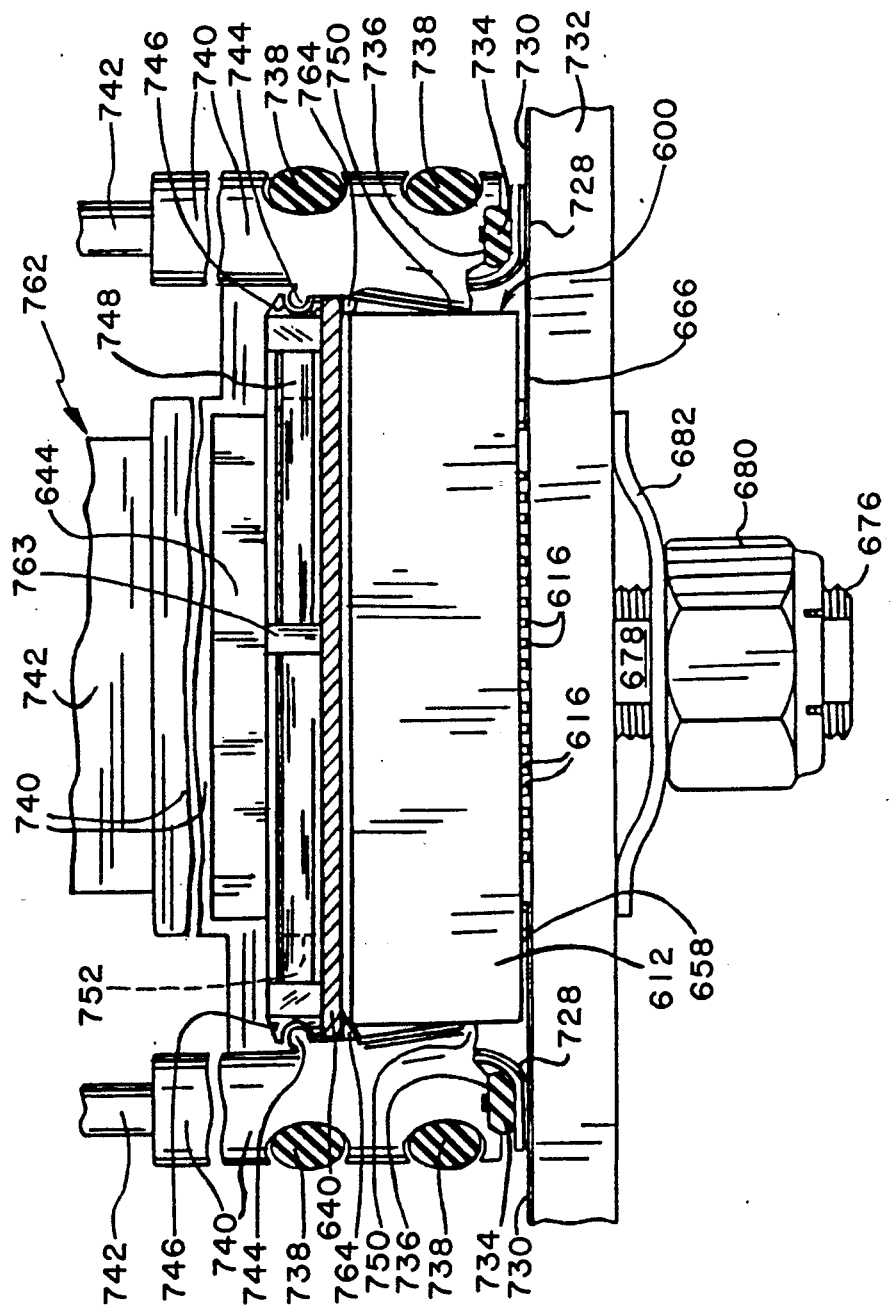
FIG. 32 is a sectional side view taken along the line 32—32 of FIG. 33, showing the electronic circuit component housing shown in FIG. 31 together with a probe assembly shown in FIG. 33.
Figure 33:
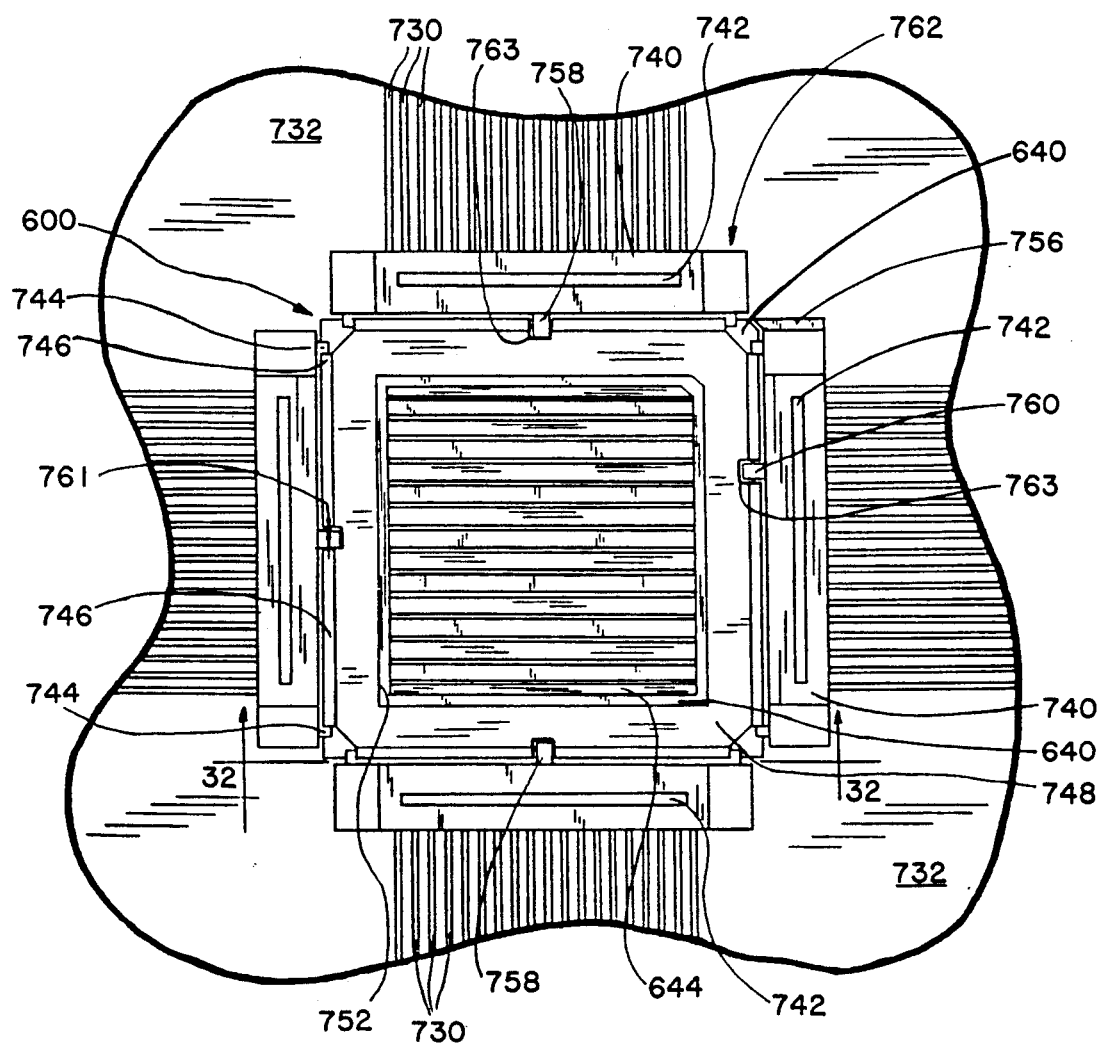
FIG. 33 is a top plan view of the electronic circuit component housing and a portion of the printed circuit shown in FIG. 31, with a circuit testing probe assembly in place on the electronic component housing.

Referrring now to FIGS. 32 and 33, a probe assembly 762 is used in connection with the printed circuit 732 to obtain electrical connection with the circuitry contained within an electronic circuit component housing 600. This probe assembly includes a set of three probe sections 740, and a fourth probe section 740a, arranged as the sides of a rectangle, each having an inner face configured to fit matingly against the corresponding outer face portion of the electronic circuit component housing body 612 such that the probe assembly 762 surrounds the electronic circuit component housing body 612 as shown in top view in FIG. 33. A resepective set of output leads 742 extend from each probe section 740, to provide connection to appropriate electronic testing and measurement equipment (not shown). A pair of elastic bands 738, under tension, urge the probe sections inward and hold them snugly with their lower portions 750 against the respective sides of the electronic circuit component housing 612, while the upper portion of the probe sections are hinged to a probe hinge ring 748 through the use of hinge pins 744, which interconnect the ends of adjacent ones of the probe sections 740, 740a. The hinge pins 744 fit matingly within a hinge socket 746 defined by the hinge ring and having the form of a horizontal sound-bottomed groove, to provide a pivot for attaching the entire probe assembly 762 to the electronic component housing 600. The probe hinge ring 748 defines an interior aperture 752 through which the convection heat dissipation member 644 extends while the probe assembly 762 is in place on top of the electronic circuit component housing 600. The probe assembly 762 is clamped in place by the action of the elastic bands 738 about probe sections 740, 740a, with a rigid probe reference contact 764 being located below the bottom side of the lid 640. Electrical connection is made between the lid 640 and the reference contact 764 by the pressure exerted by an elastomeric member 734 held in a cavity 736 in reaction to its compression against the top face of the printed circuit 732 upon attachment of the probe assembly 762, in combination with the tension of the elastic bands 738. This provides electrical contact with the lid 640, which has a potential as supplied by the printed circuit conductor 652 which resides within the electronic circuit component housing body 612 as shown in FIG. 31. Additionally, electrical contact is made similarly between each compliant probe contact 728 and a respective printed circuit conductor 730 of the printed circuit 732, again held in contact by the force exerted by the compressed elastomer 734.

To align the probe assembly 762 accurately to the circuit 732 and circuit component housing 600, the probe section 740a is fitted with a keying structure 756 which conforms to the diagonal bevel located at only one of the corners of the housing 600, so as to require the probe 762 to be placed in the proper orientation with respect to the electronic component housing 600. To aid in the precise alignment of the probe sections 740, 740a with the electronic component housing 600, hinge guides 758 and 760 are provided along the hinge pins 744 and fit matingly, in respective openings 673 defined within the groovelike sockets 746 defined by the hinge ring 748, and are of a mating size to leave only a minimal gap 761, thus aligning the probe section 742 to the housing. The hinge guide 760 resides on the fourth probe section 740a containing the unique alignment feature 756, and is itself positioned differently with respect to the hinge guides of the remaining three sections, so that only the probe section 740a containing the unique alignment feature 756 may be attached to the fourth side of the probe hinge ring 748. In addition, alignment of the probe 762 to the housing 600 is facilitated by the outer dimensions of the probe hinge ring 748, which closely match those of the lid 640 of the electronic probe component housing 600.

Figure 35:
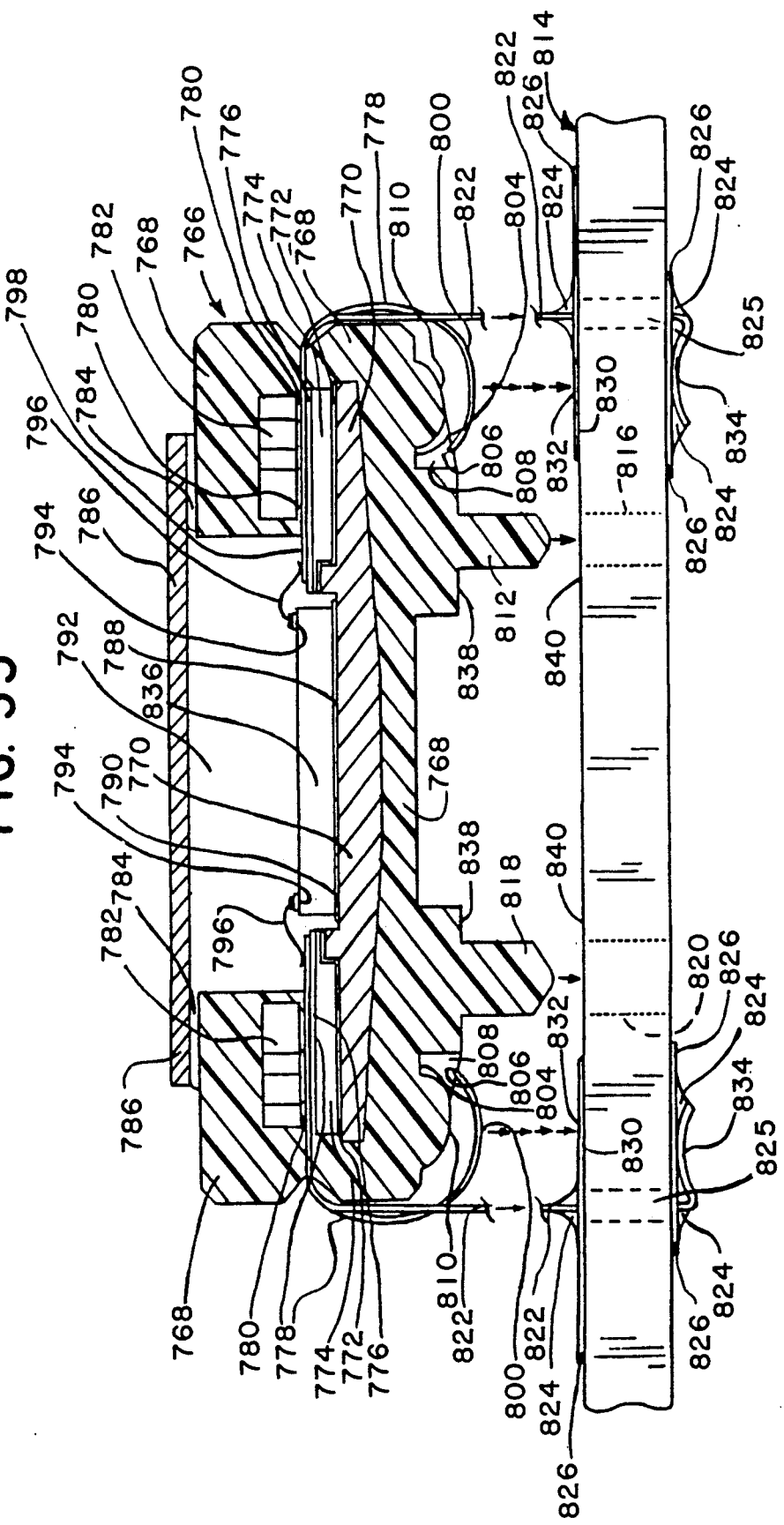
FIG. 35 is a sectional side view of a portion of a printed circuit and an electronic circuit component housing mounted thereon which is another embodiment of the present invention.

Three additional circuit component housings which are embodiments of the present invention are shown in FIGS. 35, 36, 37 and 38. FIG. 35 details an electronic circuit component housing 766, which is another embodiment of the present invention. Electronic circuit component housing 766 is attached to printed circuit assembly 814 by attachment leads 822 which also serve to help align electronic circuit component housing 766 to printed circuit assembly 814. Electronic circuit component 836 is attached to support member 770, which may be made of a thermoplastic insulating material, by use of adhesive 790, which may be an epoxy or a eutectic solder when mounting surface 788 is metalized. An insulative ring 774 is also attached to support member 770 by adhesive 772, which may be an epoxy, and lead frame 778 is also attached to insulative ring 774 by a non-conductive adhesive 776. Lead frame 778 is composed of very fine spring metal contact leads having end portions 806 which fit into respective individual alignment cavities 808 to help maintain their correct spacing relative to one another and base member, or body portion 768 of electronic component housing 766. The individual members of lead frame 768 are attached to insulative ring 774 by non-conductive adhesive 776 and electronic components 782, which may be resistors or capacitors, are selectively attached to respective ones of the individual lead members of frame 778 by conductive adhesives 780, which may be epoxies or solders. Prior to the attachment of electronic circuit component 836 to supporting member 770 the remainder of the base member or body 768 of electronic component housing 766 is molded, preferably of a thermoplastic, so as to create the features shown in FIG. 35. Of particular importance are cavities 808, alignment pins 818, keying alignment pin 812 and electronic circuit component cavity 792. Prior to this molding, attachment leads 822 are also attached to the insulative rings 774. The attachment leads may be made of the same material as the lead frame contact fingers 778 or of a different material providing greater strength. After the molding of body 768 the individual contact leads 778 are cut and formed to take on the shape shown in FIG. 35. The downwardly exposed contact portions 800 of the leads 778 may be plated with a quality finish material such as gold, to provide a good contact with the mating site 832 with individual conductors 830 which also may be plated with material such as gold. Simultaneous with the forming of individual contact fingers 778 of the lead frame attachment leads 822 are formed so as to point downward parallel with the sides of electronic circuit component housing 655. Following the insertion and attachment of the electronic circuit component 836, including the bonding of bond wire 796 to connect the loading pad 794 of electronic circuit component 836 with the bonding contact site 798 of the lead frame 778, the lid 786 is adhesively attached to the body 768 using adhesive 784, resulting in a sealed cavity 792. It is important to point out that cavity 792 is non-hermetic due to the porosity of the materials used to create the body 768 and the lid and adhesive 786 and 784 respectively. The completed assembly 766 including the electronic circuit component 836 is attached to the printed circuit assembly 814 by inserting alignment pins 818 into alignment apertures 820 and simultaneously inserting keying alignment pin 812 into keying alignment aperture 816 and all attachment leads 822 into attachment apertures 825. While maintaining a compressive force on the individual lead frame contacts 778 the attachment leads 822 are folded over on the opposite, or bottom, side of printed circuit assembly 814, creating retaining ends 834 which provide sufficient tensile force in the leads 822 to create a reliable electrical connection between contact portions 800 and contact pads 832. During this insertion process the lead frame contact finger ends 806, while being retained within cavities 808, are forced against the bottoms 804 of cavities 808 so as to require individual leads 778 to move laterally outward, away from the center of electronic component housing 766 and creating a wiping action of contact face 800 against contact face 832 so as to clean this face and promote the quality of the contact. At a later point in the assembly process adhesive 824, which may be a solder, fixes the attachment leads 822 and especially the retention ends 834 of these leads to respective retaining metalizations 826 located on both sides of the printed circuit assembly 814. So as not to deform individual contact leads 778 permanently, limiting surfaces 838 are integrally formed in the body 768 of the housing 766 and contact the upper surface 840 of the printed circuit assembly when the component housing 766 is mounted on the printed circuit assembly 814, to establish a predetermined insertion depth. It should be noted that although the finished electronic component housing 766 becomes attached to the printed circuit assembly 814 by the adhesive connection of the attachment leads 822, this attachment is limited to the lesser number of attachment leads 822 that are required to engage the non-adhesive electrical contacts 800 to electrical contacts 832 of the majority of leads of the lead frame 778, rather than adhesively connecting each of a larger number of conductor leads. As a result, replacement of a defective electronic circuit component as housed within the housing 766 is greatly simplified over the prior art techniques requiring adhesive attachment and unattachment of each interconnecting lead. This both improves the probability of a successful repair and minimizes the time required to exchange a component on the printed circuit assembly 814. Furthermore, the conformability required across all contact faces 800 for each lead of the lead frame 778 with respect to the surface configuration of the mating contact faces 832 is significantly improved over the prior art due to the range of contact movement allowed by this structure. It should also be noted that omitting alignment pins 818 and keying alignment pin 812 would still provide a unique orientation of the device by cooperation of attachment lead 822, with attachment apertures 825, although alignment with the printed circuit assembly 814 might be less precise.

Figure 36:
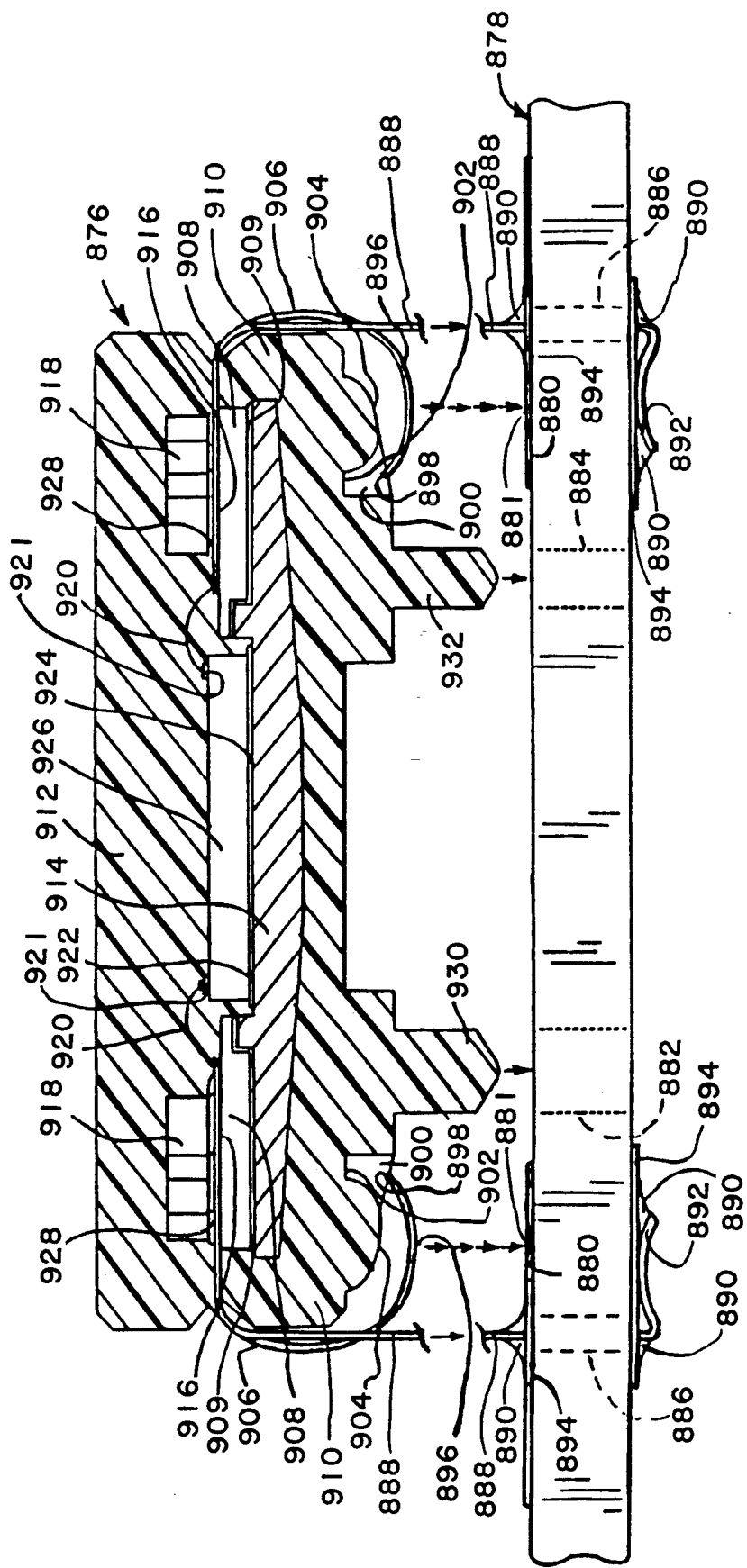
FIG. 36 is a sectional side view of a portion of a printed circuit and an electronic circuit component housing mounted thereon which is another embodiment of the present invention.

A housing 876 for an electronic circuit component, shown in FIG. 36, is similar in function to the electronic component housing 182 shown in FIG. 11. The electronic component housing 876 includes a top portion 912, which may be made of a thermoplastic material and may be molded together with a base portion 910, which may also be made of a thermoplastic. The base portion 910 encloses a mounting member 914, which may be made of a thermoplastic and which may be metalized on its upper surface 922, a support surface for an electronic circuit component 926. The electronic circuit component 926, which may be an integrated circuit, is attached to support member 914 by adhesive 924, which may be an epoxy or a eutectic solder. An insulative ring 908, which also may be made of a thermoplastic material, is attached to the upper surface 922 of the supporting member 914 by a layer of an adhesive 909, such as an epoxy. A lead frame 916 is preferably made of a metal alloy, such as copper-nickel-tin, which has good electrical conductivity and sufficient stiffness to be self-supporting and resilient. Contact pads 921 of the electronic circuit component 926 are connected by respective conductors 920 to respective individual ones of the several leads 906 of the lead frame assembly 916, preferably using conventional wire bonding techniques. The leads 906 extend arcuately around an arcuate lower rim 904 of base portion 910. Additionally, electronic circuit components 918, which may be decoupling capacitors, may be attached to the lead frame 916 by the use of a conductive adhesive 928, such as a solder.

A plurality of metal fastening leads 888, which may be constructed of a material different from the electrical connection leads 906, are also considered a part of the lead frame. Following the assembly of the electronic circuit component 926, lead frame assembly 916, electronic components 918, and fastening leads 888, the top portion 912 and the base portion 910 are molded in place about the assembly, preferably using a thermoplastic insulating material. Alignment pins 930 and a simple keying alignment pin 932, preferably located near respective corners of the base portion 910, are molded as integral elements of the base portion 910 of the electronic component housing 876.

The lead frame 916 is constructed so that the relative positions of the fastening lead members 888 and the contact lead members 906 are established within a predetermined tolerance. The top portion 912 and the base portion 910 are molded with a predetermined dimensional accuracy and in a predetermined position with respect to the lead frame 916 and fastening leads 888 to form the electronic circuit component housing 876. The relative positions of alignment pins 930 and keying alignment pin 932 with respect to the contact leads 906 are thus established with a predetermined accuracy.

Additionally, alignment of the circuit component housing 876 and contacts 896 with the printed circuit 878 may be facilitated by several alignment pins 930 and a unique keying alignment pin 632 formed as parts of the electronic component housing 876, with respective alignment holes 882 and keying alignment hole 884 being provided in the printed circuit 878. Alignment pins 930 and 932 are optional when fastening leads 888 are positioned about the electronic circuit component housing 876 in a nonsymmetrical pattern, and alignment holes 886 are also provided in a printed circuit 878 to correspond with this positioning. Placement of the attachment leads 888 in such alignment holes 886 provides alignment of respective contacts 896, portions of the individual conductor leads 906 of the electronic circuit component housing 876, with the respective and intended contact pads 881 of individual conductors 880 residing on the printed circuit 878. To mate the electronic circuit component housing 876 to the printed circuit 878, the mechanical attachment leads 888 are inserted through apertures 886 of printed circuit 878 and the ends of these leads 892 are crimped in place.

Electrical connection is made betwen the contacts 896 and the printed circuit conductors 880 at the contact pads 881. Contact is maintained by the spring force of the contact leads 906 urging the contacts 896 toward the contact pads 881 when the electronic component housing 876 is retained in position on the printed circuit 878 by crimping the fastening leads 888. The contacts 896 of the leads 906 are proferably plated with highly conductive material such as gold and the contact pads 881 of the printed circuit conductors 880 are also preferably plated with the same highly conductive material. The contact force is enhanced by capture of the lead ends 898 when these ends are compressed into respective lead alignment cavities 900, similar to the cavities 808 shown in FIG. 35, and limited by the cavity bottoms 902. In this manner, tension force is developed and stored along the length of lead 906 when the electronic circuit component housing 876 is mounted on the printed circuit 878, and an 8-16 gram compressive contact force is maintained against the contact faces 896 and 881 by each contact lead 906. The mechanical fastening leads 888 are fixed to an attachment metalization 894 of the printed circuit 878 by an adhesive 890, which may be a solder, and the crimped end 892 of the mechanical fastening lead 888 may similarly be attached to an attachment metalization 894 on the opposite side of the printed circuit 878.

Figure 37:
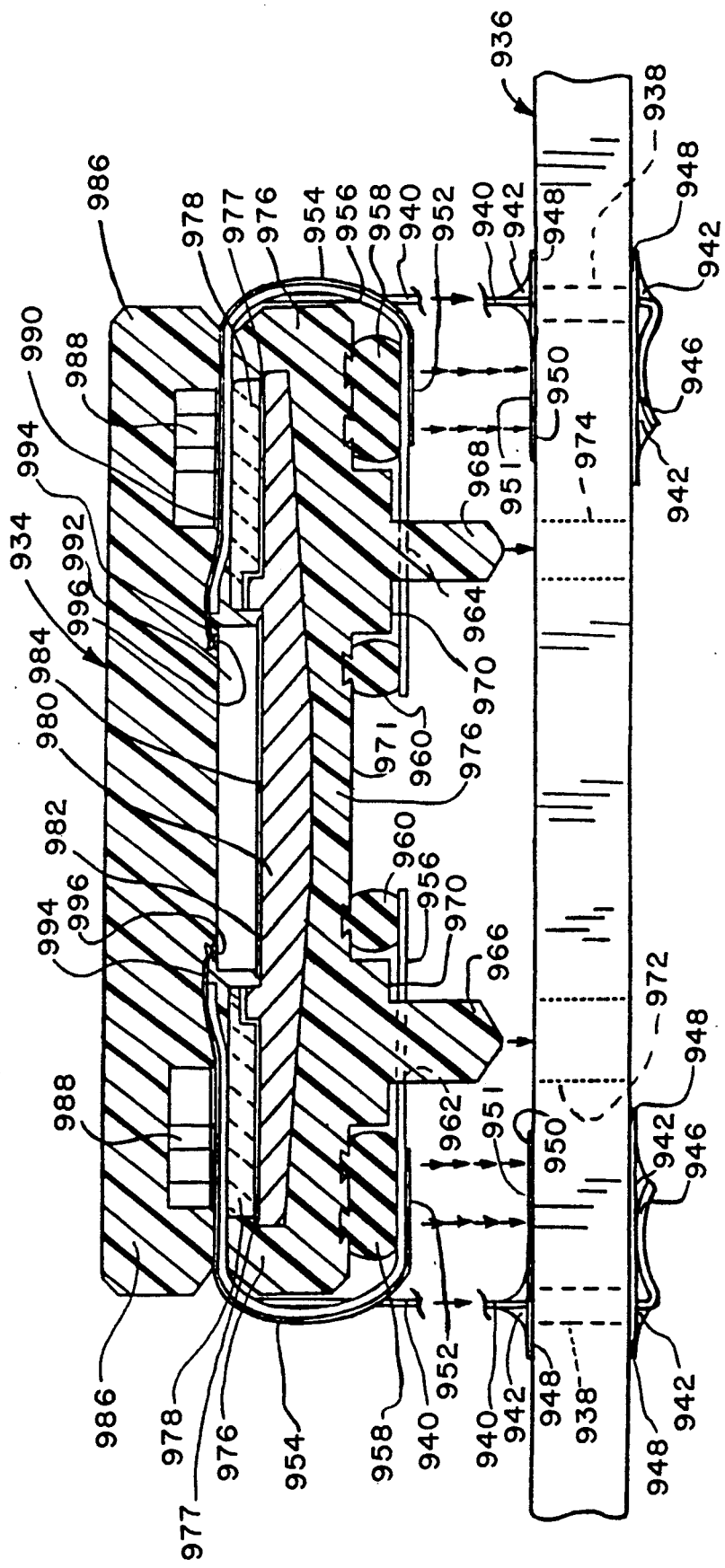
FIG. 37 is a sectional side view of a portion of a printed circuit and an electronic circuit component housing mounted thereon which is another embodiment of the present invention.

FIG. 37 depicts an electronic component housing 934 according to the present invention and similar in function to the electronic circuit component housing 282 of FIG. 14, in which mechanically tensionable fastening leads 940, similar to the fastening leads 888, are provided. The electronic component housing 934 is comprised of a supporting member 980, which may be of a thermoplastic, whose top surface 982 may be metalized in part. An electronic component 992, which may be an integrated circuit, is attached to the supporting member 980 using an adhesive 984 such as an epoxy or a eutectic solder. An insulative ring 978, which may also be made of a molded thermoplastic material, is attached to the supporting member 980 using a layer of an adhesive 977, such as an epoxy, and a metalized and patterned tape, consisting of a supporting flexible polymer sheet 956 and metalized conductors 954, is supported by the insulative ring 978. Bonding metalizations 994, which are electrically continuous with the pattern metalizations of the conductor leads 954, are attached using conventional bonding techniques to respective terminal pads 996 of the electronic component 992. Also, electronic components 988, which may be decoupling capacitors or termination resistors, may be adhesively attached using the adhesive 990, such as a conductive epoxy, to respective individual conductors 954 of the pattern metalized tape. Tensidnable metal fastener leads 940 may be attached to the insulating ring 978, by molding this ring about these leads, and the metal fastening leads 940 may be constructed separate from the pattern metalized tape leads 954. Once these several elements of this assembly have been constructed, the top portion 986 and the base portion 976 of the electronic component housing 934 may be molded, also of a polymer such as a thermoplastic, about the assembly so as to protect it from the environment. The flexible polymer tape or sheet material 956 supporting metalized and patterned conductors 954 is wrapped around the base 976, and the contact portions 952 of the conductors 954 are supported by an elastomer 958, which may be a silicone, fastened to the bottom of the base portion 976. The individual conductors 954 are aligned with respective contact portions 951 of the printed circuit conductors 950 residing on printed circuit 936. Preferably, the confronting portions of the contacts 951 and 952 are plated with a high quality conductive surface material such as gold. The mechanical tensionable fastening leads 940 may be arranged in a unidirectional pattern about the electronic component housing 934, and their placement is known within predetermined tolerances, relative to the locations of mating contact surfaces 952 and 951.

Interconnection and alignment of the printed circuit housing 934 to the printed circuit 936 are facilitated by alignment pins 966 and keying alignment pin 968, which may be integrally molded as part of the base portion 976 of the electronic component housing 934, and which are intended to mate with respective ones of alignment apertures 972 and keying alignment apertures 974. Electrical connection is maintained between contacts 952 and 951 by the compressive force stored in elastomer 958 when the electronic component housing 934 is mounted tightly on the printed circuit 936 and fixedly attached to same, preferably by securing the tensionable fastening leads 940 through apertures 938 and to the lead retaining metalizations 948, by adhesive 942. Crimped ends 946 of the leads, such that a force of approximately 8-16 grams is maintained at the contact faces 952 and 951 to provide a reliable electrical interconnection. The ends of the tape 956 may be attached to the bottom portion 976 of the electronic component housing 934, also by the use of an elastomeric adhesive 960, which may be a silicone. Apertures 962 and 964 within the tape base 956 may be used to align the tape to alignment pins 966 and keying alignment pin 968 respectively. The bottom portion 976 of electronic component housing 934 may contain a bottom surface 970 located a predetermined height 969 beyond the attachment plane 971. This bottom surface 970 serves to act as a compression limiting surface to limit the compression of elastomers 958, as attached to the base portion 976, to a predetermined distance when the electronic component housing 934 is inserted into and attached to the printed circuit 936.

Figure 38:
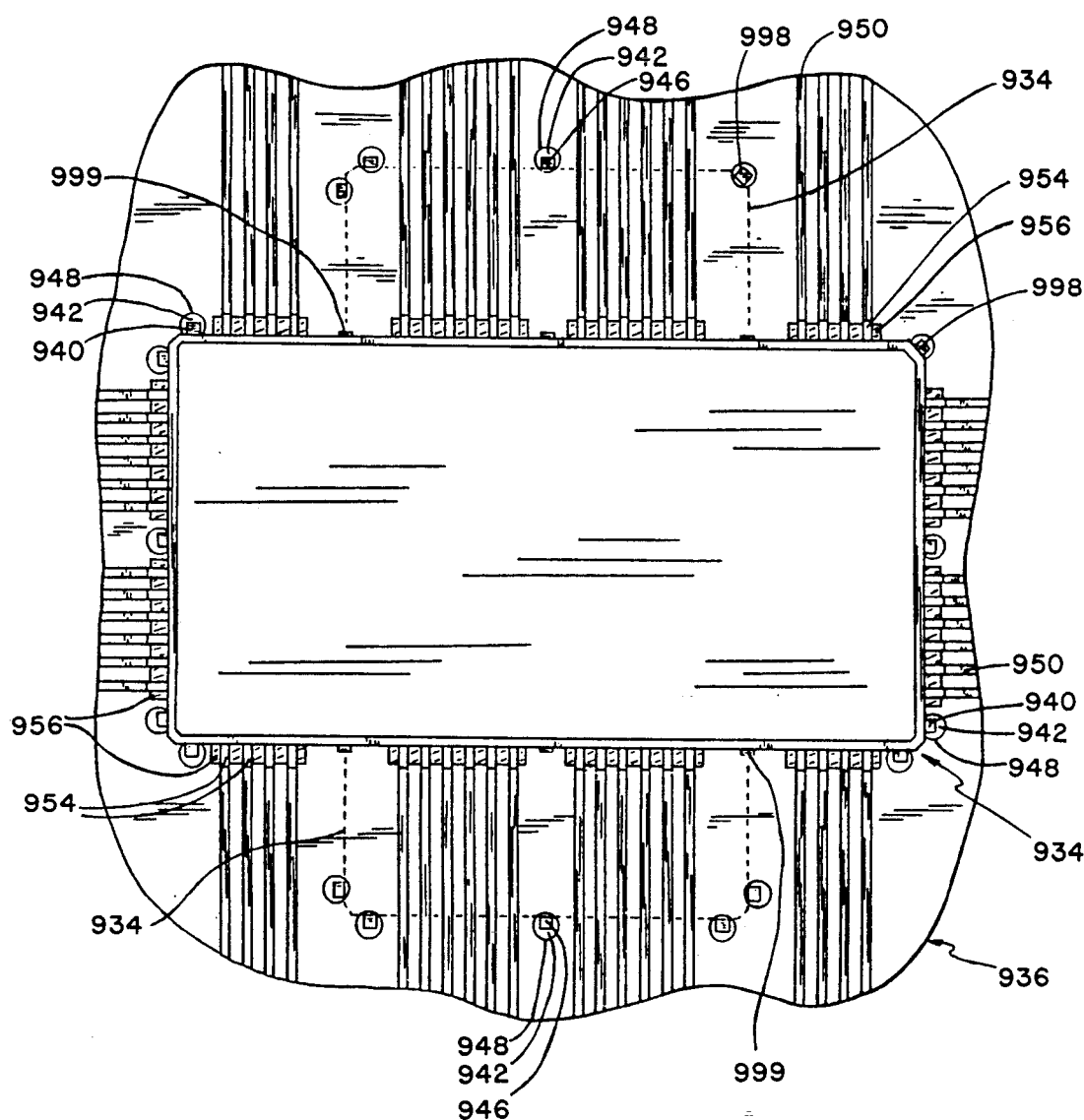
FIG. 38 is a top plan view of the electronic circuit component housing and a portion of the printed circuit shown in FIG. 37 and a similar and second electronic circuit component housing attached to the opposite side of the printed circuit.

FIG. 38 is a top plan view of electronic component housing 934, as mounted on the printed circuit 936. The location of a second electronic component housing 934 having similar dimensions, is located on the bottom face of printed circuit 936 as shown in broken line. The mechanical tensionable fastener leads 940 are placed about the electronic component housing 934 such that insertion of each housing 934 into printed circuit 936 may only occur with one unique orientation on each side of the printed circuit 936. Specifically, in the housing 934 which is the preferred embodiment showing the tensionable fastener lead 998 is a keying fastener lead and the aspect ratio of the electronic component housings 934 accommodates insertion of both housing simultaneously onto both sides of the printed circuit 936. The sites 999 are provided for additional mechanical tensionable fastener leads should an electronic component housing 934 be used in a manner specifying additional points of attachment for single sided mounting of the electronic component housing 934 to the printed circuit 936.

Figure 39:
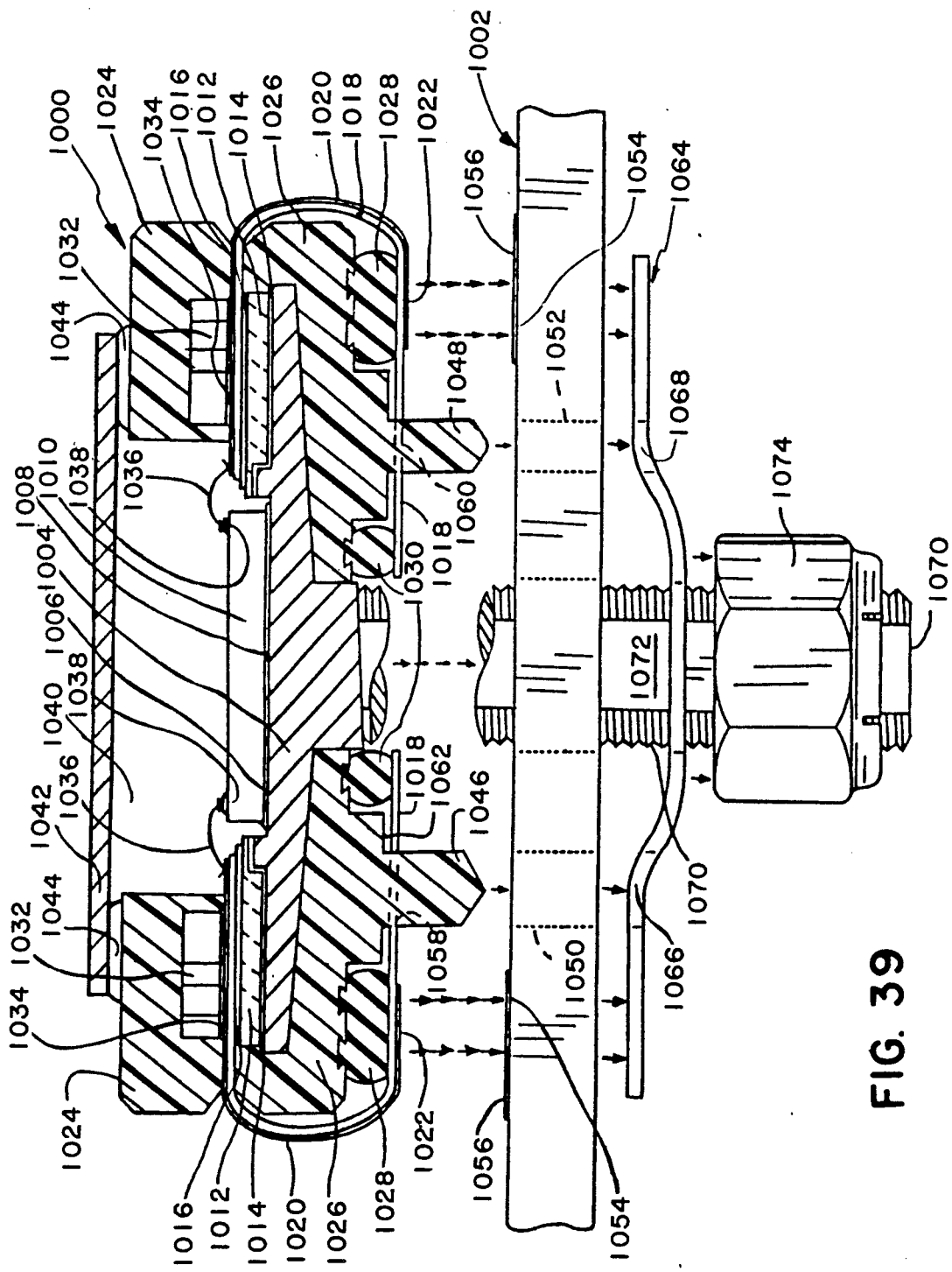
FIG. 39 is a sectional side view of a portion of a printed circuit and an electronic circuit component housing mounted thereon which is another embodiment of the present invention.

FIG. 39 shows an electronic component housing 1000 according to the present invention. In this embodiment a mechanical tensionable fastener 1070 is fitted with a head portion 1004, which may be made of a continuous metal such as a nickel-copper-tin. An electronic component 1010, which may be an integrated circuit, is attached with an adhesive 1008, such as a eutectic solder or an epoxy, to the upper surface 1006, which may be metalized, of the head portion 1004. An insulative ring 1012 is also attached to head portion 1004 using an adhesive 1014, which may be an epoxy, and a patterned metalized conductors 1020, is attached to the insulative ring 1012 using an adhesive 1016, which may also be an epoxy. The terminal pads 1038 of electronic component 1010 are electrically interconnected with the metalized conductors 1020 of the pattern metalized tape using industry accepted interconnection such as metal wire bonds 1036 or tape automated metal bonds. In addition, electronic components 1032, which may be decoupling capacitors or termination resistors, may be adhesively attached to the electronical conductors 1020 using the adhesive 1034, which may be a solder or a conductive epoxy.

An assembly consisting of the tensionable fastener 1070, including head portion 1004, insulative ring 1012, the pattern metalized tape, including the tape backing 1018, metalized conductors 1020, plus the electronic components 1032, is constructed without attaching electronic component 1010 to the supporting head portion 1004, and this assembly is molded with a top portion 1024 and a base portion 1026 so as to create cavity 1040 for later insertion of electronic component 1010. To complete the electronic component housing 1000, electronic component 1010 is inserted into cavity 1040 and attached, as described above, to the supporting head 1004. Next, interconnection is made between terminal pads 1038 and electrical conductors 1020 using the metalized bonds 1036, also as previously described. The cavity 1040 is then sealed with lid 1042, which may be made of a thermoplastic, using a sealing adhesive 1044, such as an epoxy. The metalized pattern tape including conductors 1020 may be wrapped the base portion 1026 prior to attachement of electronic component 1010, and is located so that contacts 1022, portions of conductors 1020, are supported by elastomer 1028 and are disposed downwardly for mating with the contact faces 1056 of conductors 1054 residing on a printed circuit 1002. A plurality of alignment pins 1046 and a keying alignment pin 1048 may be an integral part of base portion 1026 of electronic component housing 1000. Apertures 1058 and keying aperture 1060 within the pattern metalized tape 1018 provide alignment, within a predetermined tolerance, of contacts 1022 with contacts 1056 when the electronic circuit component housing 1000 is inserted into the printed circuit 1002 with alignment pins 1046 and keying alignment pin 1048 mated with respective alignment apertures 1050 and keying alignment aperture 1052. Adhesive 1030, which be an elastomer, fixes the tape backing 1018 to the base 1026 of electronic component housing 1000.

The tensionable mechanical fastener 1070 shown in FIG. 39 has a D-shank with face 1072 for allowing automated mechanical alignment of electronic component housing 1000 with printed circuit 1002. The force exerted by the fastener 1070 is transferred through spring washer 1064 to elastomer 1028, compressing it and thereby forcing together contact faces 1022 and 1056. Preferably, the confronting surfaces of contacts 1022 and 1056 are plated with a quality finish such as gold, to ensure a quality electrical connection between conductors 1020, of electronic component housing 1000, and conductors 1054 of printed circuit 1002. This compressive force may be limited by limiting surface 1062, located on the base portion 1026 of electronic component housing 1000. At installation, locknut 1074 is tightened against spring washer 1064 along mechanical tensionable fastener 1070. During installation, alignment pins 1046 and keying alignment pin 1048 are inserted through apertures 1066 and 1068, respectively, of spring washer 1064 for maintaining alignment of the washer with respect to the electronic component housing 1000, thereby minimizing the size of the printed circuit footprint required by the housing.

Figure 40:
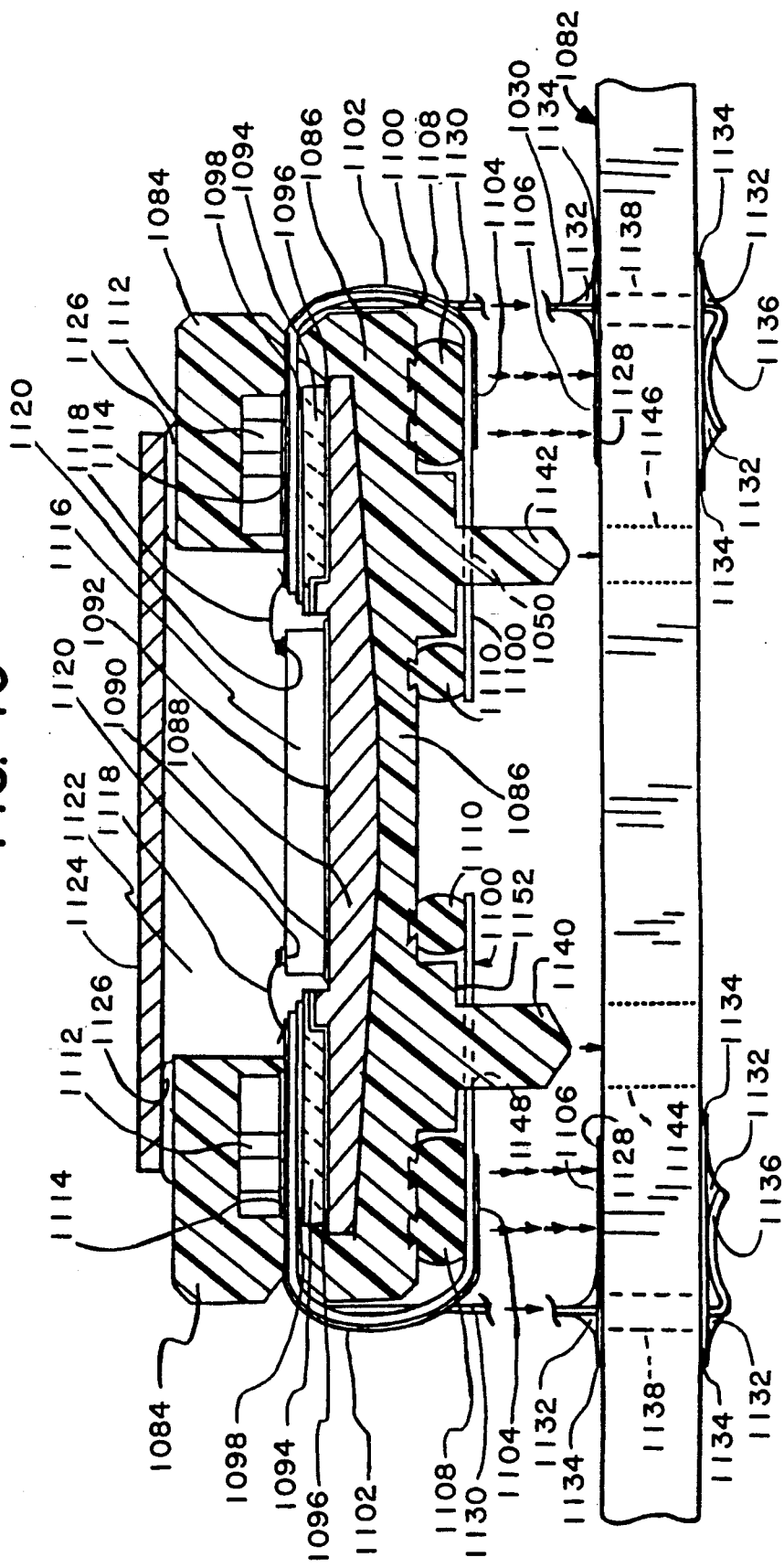
FIG. 40 is a sectional side view of a portion of a printed circuit and an electronic circuit component housing mounted thereon which is another embodiment of the present invention.

FIG. 40 depicts another embodiment of the present invention which includes an electronic component housing assembly to be constructed of a supporting member 1088, which may be made of a thermoplastic, upon which an assembly ring 1094, which also may be made of a thermoplastic, is attached using adhesive 1096, such as an epoxy. Further, a patterned metalized tape, having a tape backing 1100 and patterned metalized conductors 1102, is attached to the ring 1094 using an adhesive 1098, such as an epoxy, and electronic components 1112, such as resistors or decoupling capacitors, may have their respective contact pads attached to respective ones of the metal conductors 1102 of the metalized tape using an adhesive 1114, such as a conductive epoxy. The supporting member 1088 provides a site 1090 for an electronic component 1116, which may be an integrated circuit, for later attachment and innerconnection with the metalized conductors 1102. A base portion 1086 and a top portion 1084 are then molded, preferably using a thermoplastic material, enclosing the above components such that a cavity 1122 is created for receiving and attaching the electronic component 1116. Metal tensionable fastening leads 1130 are provided and made integral parts of the assembly so molded. The leads 1130 extend downward along the outer sides of the base portion 1086 and have heads attached at the assembly ring 1094, typically by embedding the head in the ring 1094 at the time of its molding. The metalized conductors 1102 as attached to the tape 1100 are wrapped around the base portion 1086 and attached at their ends using the elastomeric material 1110, which may be a silicone. Supporting the contacts 1104, portions of the metalized conductors 1102, is an elastomeric member 1108, which may be made of silicone. These contacts 1104 are disposed downward and are positioned relative to the tensionable mechanical fastening leads 1130 within a predetermined tolerance, and are also located at predetermined positions relative to the optional alignment pins 1140 and the keying alignment pin 1142 within a predetermined tolerance. The tensionable mechanical fastening leads 1130 and alignment pins 1140 and 1142 provide for the accurate mating of contacts 1104, of the pattern metalized conductors 1102, to contact faces 1106, of the printed circuit conductors 1128 of the printed circuit 1082, when the metal tensionable fastening leads 1130 are inserted through the respective alignment and attachment apertures 1138 residing within printed circuit 1082, and the alignment pins 1140, 1142 are inserted in alignment apertures 1144, 1146, respectively, until limiting face 1152 abuts the printed circuit 1082. Prior to attaching the electronic component housing 1080 to the electronic circuit 1082, electronic component 1116 is inserted into cavity 1122 and attached to supporting member 1088 using an adhesive 1092, such as a conductive epoxy. The contact pads 1120 of the electronic component 1116 are then electrically interconnected to respective ones of the pattern metalized tape conductors 1120 using conventional connections, which may be wire bonds 1118 or a tape metal bonds. The cavity 1120 is then sealed with lid 1124 using a sealant 1126, such as an epoxy. The compressive force exerted by elastomers 1108, as derived from fastening the leads 1130 under tension when the electronic component housing 1080 is attached to the printed circuit 1082, maintains electrical contact between contact faces 1104 and 1106. Attachment adhesive 1132, which may be a solder, serves to fasten the tensionable metal fastening leads 1130 to the metalized attachment sites 1134 of printing circuit 1082. The ends of tensionable metal fastening leads 1136 may be crimped and bonded by adhesive 1132 to the attachment sites 1134 to facilitate this process. Apertures 1148 and 1150, respectively, provide alignment of the patterned metal conductors 1102 to alignment pins 1140 and keying alignment pin 1142, respectively, when optionally used.

Figure 41:
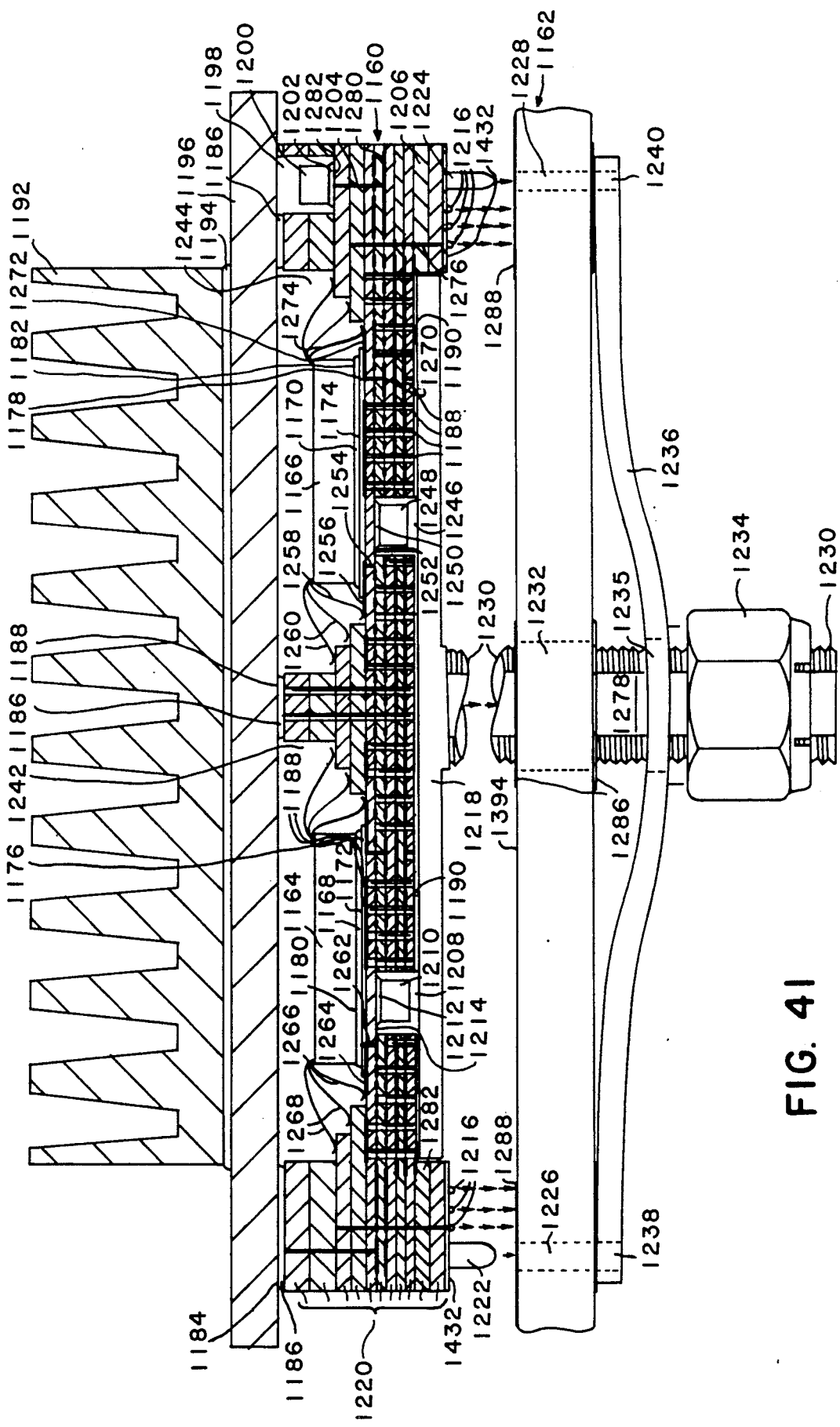
FIG. 41 is a partially exploded sectional side view of a portion of a printed circuit assembly and an electronic circuit component housing for multiple electronic circuit components mounted thereon which is another embodiment of the present invention.
Figure 42:
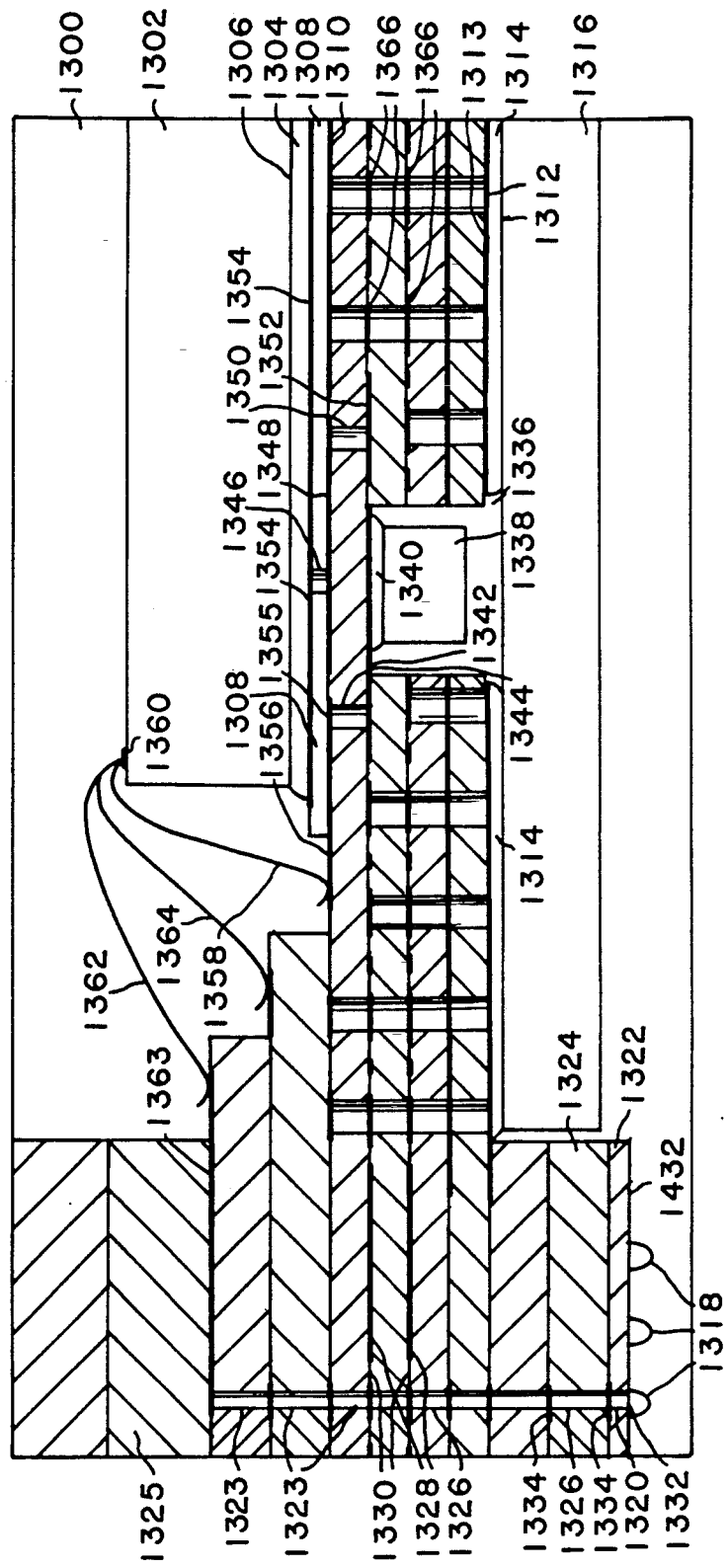
FIG. 42 is a sectional side view, at an enlarged scale, of a portion of an electronic circuit component housing similar to the housing of FIG. 41.

Referring now to FIG. 41 of the drawings, an electronic circuit component housing 1160 includes a multilayered base member 1206, which includes various conductors and vias and which houses multiple electronic circuit components 1164 and 1166, each residing in a respective one of individual cavities 1242 and 1244. Each electronic circuit component is respectively attached using electrically conductive adhesives 1168 and 1170 to support metalizations 1172 and 1174 of the housing. These support metalizations are selectively electrically isolated from the other metalizations within the housing 1160. As is seen in FIG. 41, a support metalization 1172, similar to a support metalization 1354 shown in FIG. 42, is selectively biased through the electrically conductive via 1180 such that the electrical potential available through a conductor 1214 and via 1262 can provide an electrical bias for the backside of electronic circuit component 1164. This electrical potential is also supplied to the main circuitry of electronic component 1164 using electrical conductor 1264 and wire bond 1266. Thus, an electronic component 1210, which may be a capacitor, located within a cavity 1208 defined by the base member 1206, can be connected to accomplish decoupling of the supply current provided by wire bond 1266 when the capacitor 1210 is electrically connected to the conductor 1214 using adhesive 1212, which may be a solder. Electronic components 1210 and 1248 are respectively housed in cavities 1208 and 1246 which are defined in the base member 1206 of the electronic circuit component housing 1160. These cavities may be hermetically sealed when the head portion 1218 of the tensionable fastener 1230 is inserted into cavity 1282 on the underside of the housing and adhesively attached, preferably by brazing as at 1190. Electronic component 1248, which may also be a capacitor, performs a similar function for an electronic circuit component 1166 by providing a source voltage to this electronic circuit component through a conductive adhesive 1250, which may also be a solder, attaching the component 1248 to a conductor 1252. The electrical potential on conductor 1252 is carried through a via 1254 to an electrical conductor 1256, which provides a bonding contact site for a bond wire 1258 which is interconnected with an electrical conductor of electronic circuit component 1166.

The physical proximity of components 1248 and 1210 to the electronic circuit components 1166 and 1164, respectively, is especially relevant in order to keep to a minimum the amount of inductance encountered in the conductors between the decoupling devices 1210 and 1248 and their respective electronic circuits. By lowering the inductance of these interconnecting conductors it is possible to achieve the maximum benefit of decoupling devices such as the components 1248 and 1210, minimizing the electrical noise which may be generated on the source lines 1264 and 1256, respectively, by the devices themselves.

A backside electrical bias potential for device 1166, which may be different from the bias potential for device 1164, is provided to the support attachment metalization 1174 from electrical conductor 1270 by conductive via 1182. As is shown, this bias potential may also be supplied to the electronic circuit component 1166 using electrical conductor 1272 and wire bond 1274.

Thermally conductive vias 1188 are also provided in close proximity to the electronic circuit components 1166 and 1164 and to an electronic component housing lid 1196. This physical proximity is also an important feature of the electronic circuit component housing 1160. The thermally conductive vias 1188 are typically made of the same metalization as the electrical conductors residing within the base member 1206 of electronic component housing 1160. This metalization is screened onto each layer 1220 of the electronic circuit component housing base member 1206 during the fabrication process. As shown in FIG. 41, the base member 1206 contains 12 layers of dielectric material, which may be alumina, allowing for up to 13 layers of metalization to be included in base member 1206 during the fabrication process. Numerous thermal vias 1188 are provided in the base member 1206 as a thermal via array which provides a mechanism for even distribution of the heat generated by all components existing within the housing.

Thermal vias 1188 are thermally interconnected to one another by the head portion 1218 of tensionable fastener 1230 which is attached to the base member 1206 of the housing 1160 by adhesive 1190, preferably a brazing alloy of nickel-copper-silver. The head 1218 uniformly distributes the heat collected by individual thermal vias 1188. This heat is collected and distributed from the electronic circuit components 1164 and 1166 due to the close proximity of some of these vias with respect to these components, and, equally important, is conducted from or to the extremities of the electronic circuit component housing 1160 so as to evenly distribute all heat generated within the housing 1160 for the effective thermal management and control of the thermal expansion of the housing. Vias 1188 also conduct heat to the lid 1196 and the shank portion of tensionable fastener 1230 allowing these extremities of housing 1160 to facilitate the dissipation of heat from the housing 1160. A heat sink 1192 may be attached to lid 1196 by brazing or another thermally conductive adhesive 1194, to further facilitate the dissipation of heat from the housing 1160. The lid 1196, which may be of metal, is both physically and thermally connected to the base member 1206 by an adhesive 1186, which may be a solder. Adhesive 1186 also provides an electrical connection to bias the lid 1196, thermal vias 1188, and tensionable fastener 1230 by electrical interconnection with electrically conductive via 1184. The electrical bias provided by electrically conductive via 1184 is selectively independent from all other electrical biases which may be provided to circuit components contained within housing 1160. In this manner, metal portions extending from electronic circuit component housing 1160 may be selectively biased to match the electrical biases when the housing 1160 is attached to printed circuit assembly 1162 to become part of a higher level assembly.

Conductive nodules 1216 are provided in appropriate locations to mate with respective contact pads 1288 of the printed circuit assembly 1162 when tensionable fastener 1230 is inserted through aperture 1232 of printed circuit assembly 1162. The aperture 1232 is preferably reinforced by metalization rings 1286 when printed circuit assembly 1162 is of a flexible construction. Prior to inserting electronic circuit component housing 1160 into printed circuit assembly 1162, housing 1160 is coarsely oriented by using the flat face 1278 of tensionable fastener 1230 to position alignment pins 1222 and keying alignment pin 1224 roughly with respect to their respective apertures 1226 and keying alignment aperture 1228 of printed circuit assembly 1162. Also, a force distributing members 1236 of spring material containing aligning apertures 1238 and keying alignment aperture 1240, is also coarsely aligned with tensionable fastener 1230 by a D-shaped aperture 1235 corresponding with the shape and size of the shank of tensionable fastener 1230. The force distributing member 1236, as the previously described spring washer 66, is shaped to press upward on the bottom of the printed circuit 1162 opposite the nodules 1216. The force distributing member 1236 is placed over said stud portion and secured with lock nut 1234 to complete the assembly process. Electrical interconnection is made between the conductors of housing 1160 and the conductors of the printed circuit assembly 1162 as the lock nut 1234 is tightened against tensioning member 1236 causing nodules 1216 to press against contact pads 1288, which are, in turn, attached to corresponding electrical conductors of printed circuit assembly 1162. The margins of the force distributing member 1236 support contact pads 1288 as the locknut 1234 is tightened by distributing the force being generated in tensioning member 1236 to support the area of printed circuit assembly 1162 located directly opposite the contact pads 1288.

Figure 46:
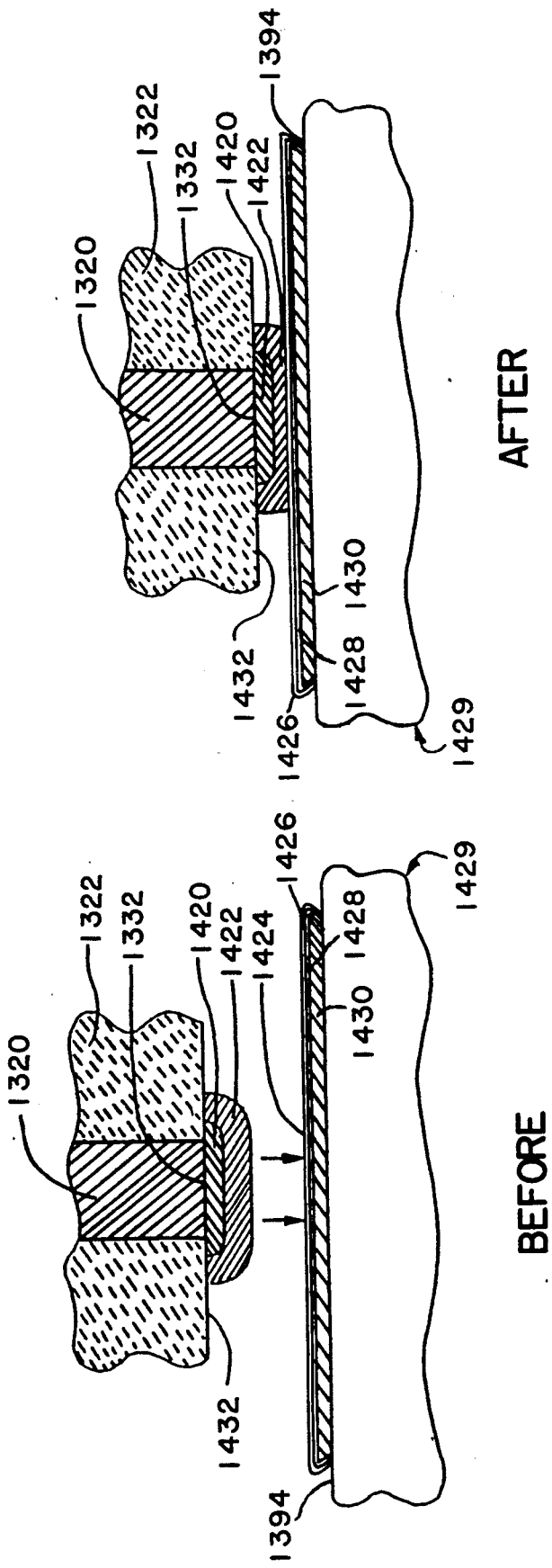
FIGS. 46A and 46B are sectional side views, at a greatly enlarged scale, of a portion of a printed circuit assembly, and a portion of an electronic circuit component housing shown in FIG. 42, detailing the nodule contact interconnection mechanism according to the present invention.

Referring to FIG. 42 and FIGS. 46A and 46B, it will be seen that nodules 1318 may be solid and may be of built-up composite construction. As shown in FIGS. 46A and 46B, via metalization 1320, which may be of tungsten, is shown as it has been screened and fired into the outermost dielectric layer 1322 of the base member 1206 of an electronic component housing. Following the firing process in the fabrication of the base member 1206, the entire bottom surface of base member 1206 is lapped flat to aid in achieving the coplanarity required between the housing and the printed circuit assembly 1429. This lapping process leaves only the flat face 1332 of via 1320 exposed and fully surrounded by dielectric 1322. Using electroforming techniques, via 1320 is electrically charged in a metal plating bath and a substantially uniform first layer of metal 1420 is self-aligningly electrically formed at the site of the via conductor face 1332. The material 1420 may be a relatively hard material such as nickel, on top of which is plated a layer 1422 of soft metal such as gold or silver or a soft metal alloy such as solder.

Printed circuit assembly 1429 is fabricated using industry standard techniques to fabricate the foundation metal conductors 1430, which may be made of copper. On top of foundation metal conductors 1430 a harder metal 1248, which may be nickel, is electroplated, followed by the plating of a layer 1426 of metal having a corrosion-resistant electrically conductive finish, such as gold. As the nodules 1318 of the electronic component housing are brought into contact with the contact pads of the printed circuit assembly 1429 by the use of a tensionable fastener, sufficient force is applied through tension in the fastener to reshape the nodule 1318 as shown in FIG. 46A to a deformed condition such as that shown in FIG. 46B. The deforming action shown in FIGS. 46A and 46B occurs at each nodule 1318 to adjust the configuration of the many nodules 1318 distributed over the bottom surface 1432 of the electronic component housing to conform to the shape of the top surface 1424 of each mating contact pad of the printed circuit assembly. By physically distorting the shape of soft layer 1422 of each nodule 1318 during installation of the circuit component housing, an exact mating of the component housing with the printed circuit assembly is achieved.

Applying the construction of FIGS. 46A and 46B to the electronic component housing of FIG. 41, it will be appreciated that when via 1320 is approximately 0.004 inches in diameter, and hard metalization 1420 is electroformed to a height of approximately 0.001 inches, with soft metalization layer 1422 being electroformed to a thickness of approximately 0.0015 inches, then the diameter of the resulting nodule will be approximately 0.009 inches. With this diameter, the force required to distort the soft metalization 1422 is approximately 800 grams per nodule. This large force per nodule when accumulated for the large number of nodules addressed by the method of the present invention requires the electronic component housing base member 1206 to be constructed of a strong and rigid material, such as alumina, and requires a force distributing member 1236 also be of a strong material, such as a spring nickel material, to be applied at the opposite side of the printed circuit assembly 1162, so that the simultaneous distortion of a large number of nodules may occur. Without the force distributing member 1236, the applicability of the interconnection mechanism for an electronic circuit component housing as shown in FIG. 41 would be severely limited by the type of printed circuit assembly which would be required to support the forces required to be exerted by the tensionable fastener.

Following the nodule forming process discussed above, the nut 1234 may be backed off slightly to reduce the pressure between the nodules and the contact pads so that this mating pressure no longer remains at the threshold of deformation. Such a reduction may be on the order of 25% allowing the original 800 grams of force per nodule, required for forming the nodules to be reduced to 600 grams, thereby insuring that the coplanarity originally established by the attachment and deformation process is not disturbed over the application life of the assembly.

Figure 43:
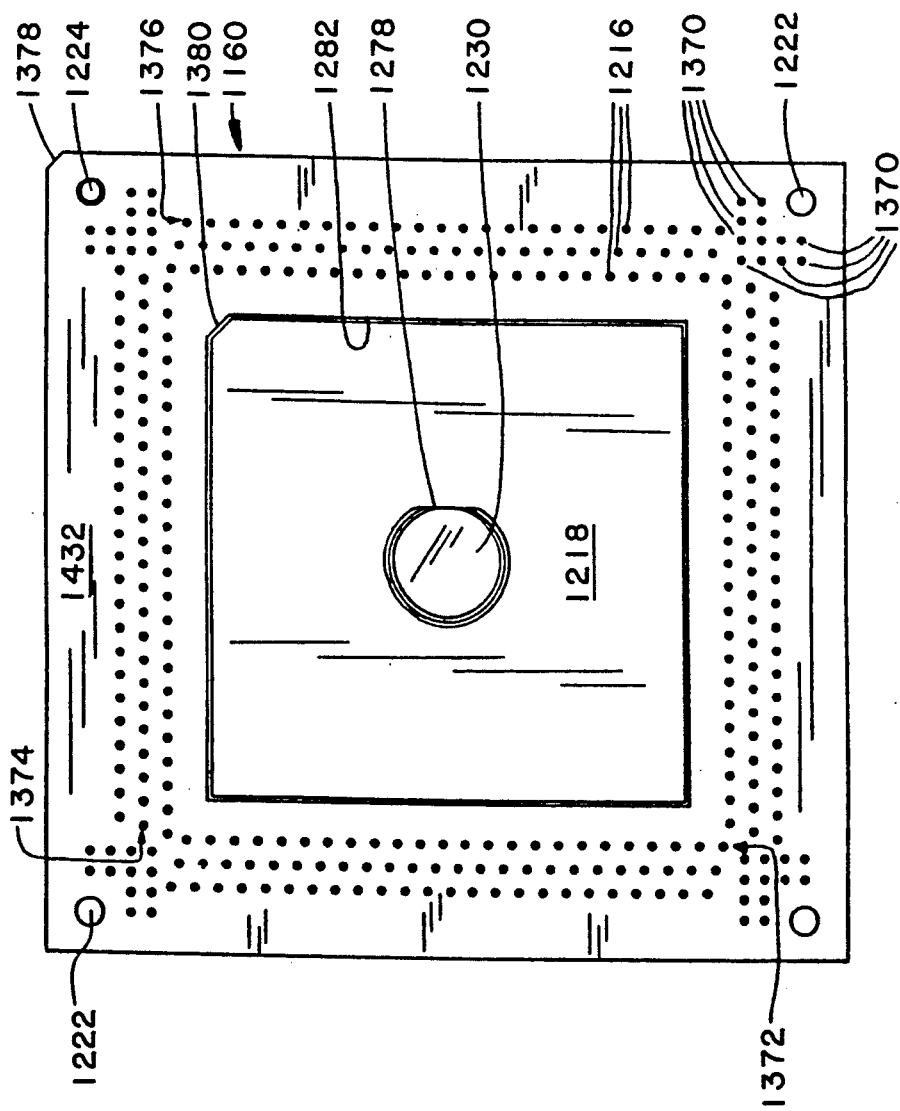
FIG. 43 is a bottom plan view of the electronic circuit component housing of FIG. 41, shown at a smaller scale.

FIG. 43 provides a view of the lapped and electroformed surface 1432 of the electronic circuit component housing 1160 of FIG. 41, including alignment pins 1222, keying alignment pin 1224, and the bottom side of the head portion 1218 of tensionable fastener 1230 with flat orientation face 1278 on its shank. The head portion 1218 of tensionable fastener 1230 is shown aligned to cavity 1282 by keying beveled corner feature 1380. In the housing 1160 a total of 336 conductive compliant contact nodules are shown, with nodules 1216 being signal input/output nodules of which there are 288. The remaining 48 nodules 1370, which are preferably reserved for power supply interconnections, being located in sets of twelve in each corner of housing 1160.

Figure 44:
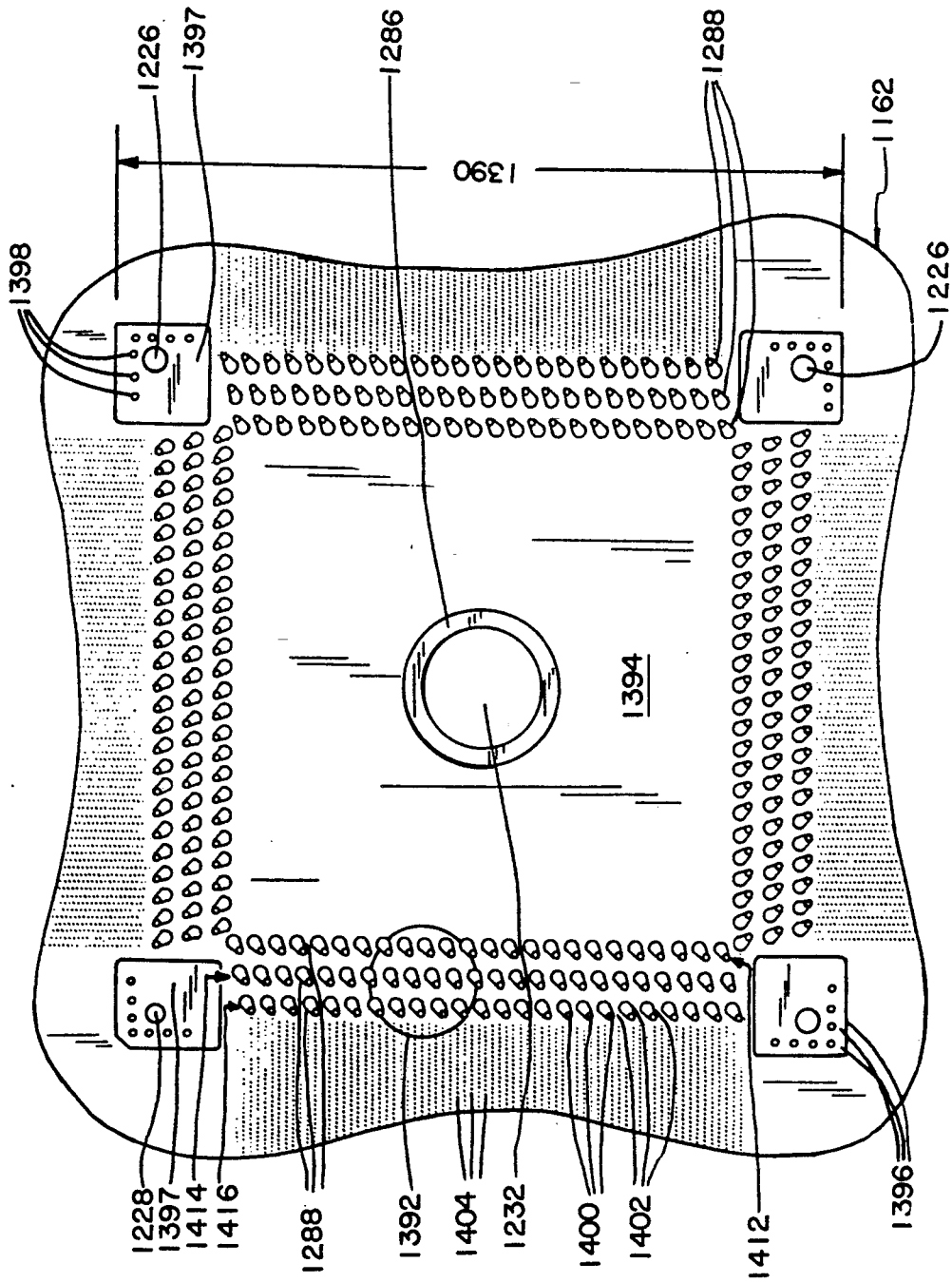
FIG. 44 is a top plan view of a portion of the printed circuit assembly shown in FIG. 41, showing the mounting site which is available on the printed circuit assembly to be occupied by the electronic circuit component housing assembly of FIG. 41.

Referring also to FIG. 44, it is seen that this particular arrangement allows electronic component housing 1160 to be mated with the contact footprint of printed circuit assembly 1162 in a unique orientation. Alignment pins 1222 can thus be mated with alignment apertures 1226 and keying alignment pin 1224 can be mated only with keying alignment aperture 1228, to achieve a precise alignment affording a high contact interconnection density. Each set of 12 power nodules located at the corners of housing 1160 of FIG. 43 mates with a large single contact pad 1397 correspondingly situated at one of the corners of the contact footprint pattern shown in FIG. 44. These large contact pads 1397 are intended to provide individual electrical power potentials for the electronic circuit components housed within electronic circuit component housing 1160. The electrical potential to be placed on each of these corner contact pads 1397 is supplied from internal layers of the printed circuit assembly 1162 by vias 1398 and 1396, and the potential on each of these sets of vias may be different.

Figure 45:
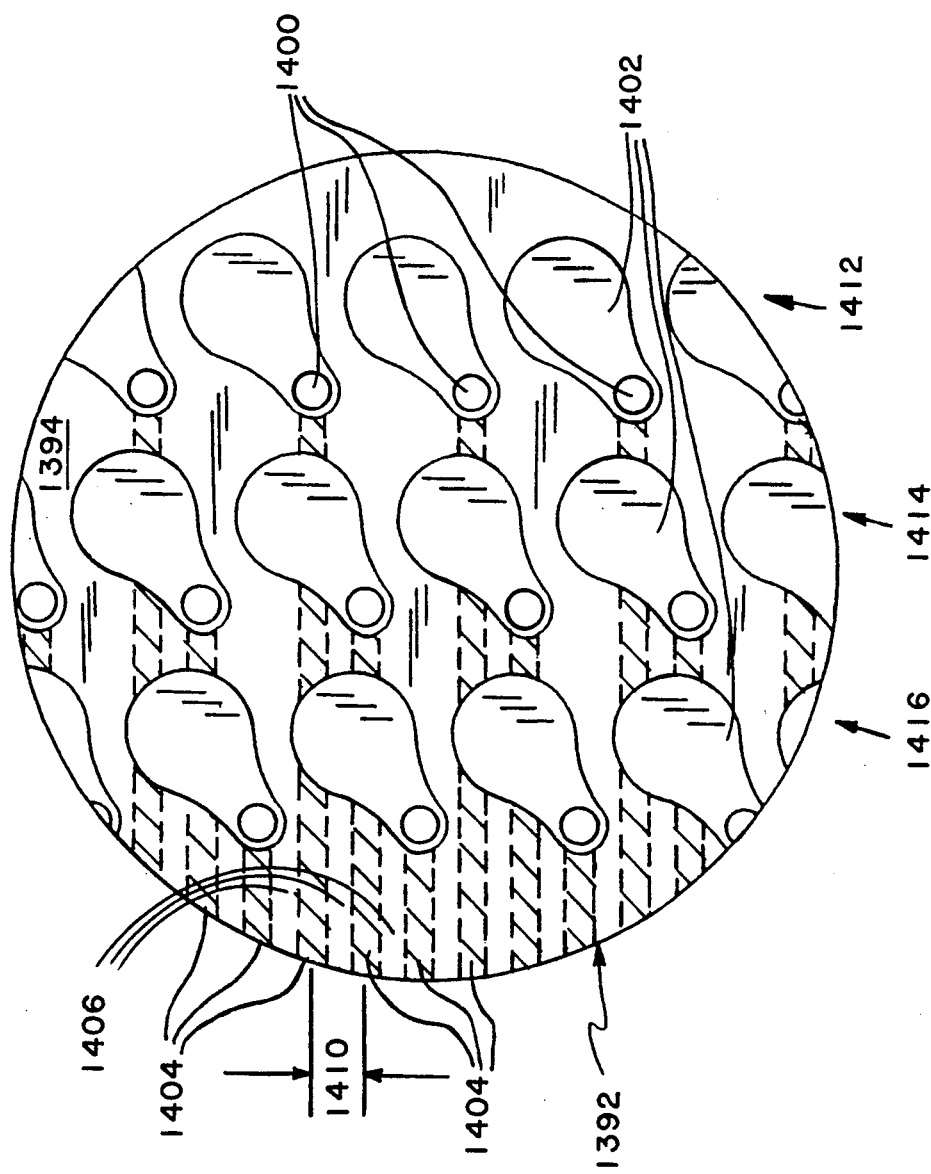
FIG. 45 is a top plan view, at an enlarged scale, of a detail of the printed circuit assembly shown in FIG. 44, showing some of the contact sites for receiving an electronic circuit component housing according to the interconnection mechanism of the present invention.

To accommodate such a high number of input/output contacts, the nodule contacts 1216 and mating contact pads 1288 have been arranged in rows which are slightly offset from one another. Referring to the enlarged portion 1392 shown in FIG. 45 it is seen that this offset allows signal lines 1404 to be closely situated, separated only by small spacings 1406, such that a uniform and minimal center-to-center spacing 1410 may be obtained at the periphery of the contact footprint depicted in FIG. 44. This center-to-center spacing 1410 may be as small as 0.010 inches or less for the electronic component housing 1160 of FIG. 41 when signal lines 1404 and spaces 1406 between signal lines are each made to be 0.005 inches in width or less. The offset rows of pads 1412, 1414, and 1416 are interconnected to signal lines 1404 by staggered vias 1400 which mate signal lines 1404 to the flat contact portions 1402 on the flat surface 1394 of the printed circuit assembly 1162. Additional rows of pads 1402 and vias 1400 could be added to increase the input/output count by increasing the density of conductor routings of the conductor routing layer shown located immediately below contact portions 1402 by incorporating additional internal routing layers in printed circuit assembly 1162, which are interconnected using vias on multiple routing layers, to achieve contact with the contact portions 1402. Using this technique it needs to be emphasized that the largest dimension 1390 of the footprint shown in FIG. 44 is designed to match the area consumed by electronic component housing 1160. The overall area consumed on the printed circuit assembly for a given number of contacts interconnecting housing 1160 with the printed circuit assembly 1162 is thereby minimized, maximizing the number of electronic circuit component housings that may be incorporated on a single printed circuit assembly,.

It is important to note that the printed circuit contact footprint of FIG. 44 and the corresponding mating nodule arrangement of FIG. 43 differ in electrical performance from the printed circuit footprint shown in FIG. 3 and the corresponding mating contact nodule arrangement of FIG. 2. The combination shown in FIGS. 43 and 44 is intended to address signals with frequency components which are much lower in frequency than the frequency components of signals that may be accommodated by the arrangement of FIGS. 2 and 3. Typically, the contact footprint topology of FIGS. 43 and 44 is intended to accommodate electronic circuit components employing signals with frequency elements below approximately 250 MHz. However, the very high performance electronic components intended to be housed in electronic circuit component housing 12 of FIG. 1, et al. will typically require the contact arrangement shown in FIGS. 2 and 3, where these electronic components, which may be made on gallium arsenide substrates, are capable of addressing a high number of input/output signals each incorporating frequency components up to and beyond 1000 MHz. To accomodate this broad range of signal frequencies a controlled impedance electrical environment is required to be incorporated in the electronic circuit component housing. The structure of electronic circuit component housing 12 may provide this specialized environment for a large number of signals and the particular contact interconnection arrangement shown in FIGS. 2 and 3 facilitates the interconnection of controlled impedance signal conductors. Specifically, printed circuit contact conductor 86 enables the controlled impedance reference plane, which is associated with the microstrip controlled impedance signal lines 80 and is located on an internal layer of printed circuit assembly 10 (not shown), to be interconnected with the reference contacts of row 74, when interconnection of row 76 signal contacts is made with controlled impedance conductors 80 so as to provide a minimal controlled impedance discontinuity at the point of interconnection due to the particular interconnection arrangement shown in FIGS. 2 and 3.

FIG. 42 shows an alternate organization of the internal metalizations within the dielectric used in the formation of the base for an electronic component housing. In this embodiment of the invention a base member 1325 houses in cavity 1300 an electronic component 1302 which is attached to base portion 1325 with conductive adhesive 1304, which may be a eutectic gold alloy, to supporting surface 1306 which is metalized with conductor 1354. Dielectric layer 1308 separates electronic circuit component mounting metalization 1354 from metalization 1310 which electrically interconnects thermal vias 1312. Mounting metalization 1354 may be selectively and independently biased, however, using via 1346 to interconnect metalization 1348 with via 1350 which, in turn, interconnects the electrical potentials supplied by electrical conductor 1352, which may be selectively routed to any nodule contact located on base portion 1325, such as a nodule contact 1318. In this manner the bias potential applied to the thermally conductive vias 1312 and the backside bias applied to electronic circuit component 1302 may remain separate and independent.

Cavity 1300 is similar in function to cavity 1244 of FIG. 41 which becomes hermetically sealed when lid 1196 is attached to body portion 1206 of electronic circuit component housing 1160. Cavity 1336 is also similar to the cavity 1246 of FIG. 41 in that it too becomes hermeticaly sealed, protecting component 1338 from the environment when adhesive 1314, which may be a brazing alloy, fixes the head portion 1316 of the tensionable fastener to body portion 1325. As was mentioned previously, the positioning of component 1338, which may be a capacitor, close to electronic circuit component 1302 is extremely important for minimizing the electrical noise on the electrical source interconnection bond wire 1358, which may be generated by the electronic circuit component. The electrical length of the interconnection between electronic circuit component input/output pad 1360 and the electrically conductive adhesive 1340 of the electronic component 1338 is critical for minimizing noise on the power source line. This electrical noise phenomenon is commonly known to be aggravated by the inductive effect of interconnection wiring between an electronic circuit component, such as 1302, and its corresponding noise decoupling source, such as electronic component 1338. To reduce the length of interconnection wiring associated with high performance electronic components, such costly and extreme measures as thinning the electronic circuit component device 1302 substrate have been employed to shorten the length of bond wire 1358 required to interconnect contact pad 1360 with power source bonding contact 1356. Therefore, minimizing the total power source interconnection length, comprising for the example of FIG. 42 the bond wire 1358, interconnection conductor 1355, via 1344, and interconnecting conductor 1342, is very important for optimizing utility of the high performance characteristics of an electronic circuit component as 1302 when this component is housed in a protective housing, and is a key object of the present invention. Thus, the ability to place decoupling component 1338 directly beneath electronic circuit component 1302 is a key advantage of the interconnection mechanisms disclosed.

Additional bond wires 1362 and 1364 provide interconnection of individual signals to electronic circuit component 1302 by routing these signals along the internal metalizations of base member 1325. A signal originated by electronic circuit component 1302 is transmitted from bond wire 1362 along interconnection conductor 1363 to vertically stacked upper vias 1323 and subsequent lower via conductors 1326 until the signal reaches one of the nodules 1318. Vias 1323 and 1326 need not be of the same diameter, where this diameter is largely determined by the thickness of dielectric the via must penetrate. Also, via 1320 need not be of the same diameter as vias 1326 or 1323 and because of the very thin outer dielectric layer 1322, which may be less than 0.005 inches thick, the diameter of via 1320 may be made very small so as to minimize the size of nodules 1318 when they are precisely electroformed to the face portions 1332 of the via 1320. The vias 1320, 1323, and 1326 need not be vertically stacked, and the largest diameter vias therefore do not determine the minimum spacing of vias 1320 and, hence, nodules 1318. Connection between the bottom most via 1326 and via 1320 may be made by an additional interconnection metalization along the interface of dielectric layers 1324 and 1322 to decrease the center-to-center spacing attainable for vias 1318. In the preferred embodiment, via 1320 may be made to be less than 0.004 inches in diameter and the upper vias 1323 and lower vias 1326 may be made to be less than 0.008 inches in diameter. By minimizing the diameter of via 1320, the diameter of nodules 1318 are, in turn, minimized when self-aligning electroformed onto via contact face 1332, allowing these nodules to be closely spaced and thereby increasing both the density that can be achieved for the corresponding input and output signal lines of a single circuit component and the number of housings that be accomodated by a single printed circuit assembly.

As can be seen in FIG. 42 head portions 1334 of the via metalizations exist at each interface of the individual dialectric layers when they are laminated according to current practice to form the single body 1325. It will be appreciated that the larger head portions similar to 1334 are absent at the exposed surface of the layer 1332 because of the lapping procedure performed to produce the flat surface 1432, which, in turn, facilitates the fabrication of extremely small and very closely spaced nodules 1318. Further, the interconnection conductor metalizations, such as 1328, are electrically insulated from the via metalizations by dielectric spaces 1330 allowing a high density routing of conductors to be incorporated in the electronic circuit component housing body 1325.

The metallized web formed by the array of thermal vias 1312 which extend substantially throughout the base member 1325 serves to strengthen the naturally strong material of which the dielectric base member 1325 is made. When thermal vias 1312 are formed head portions 1366 are also formed for these vias at the interfaces of adjacent dielectric layers. These head portions 1366 may be made of the same tungsten or molybdenum metalization as thermal vias 1312. When head portion 1316 of the tensionable fastener is attached to metalization 1313, typically by brazing alloy adhesive 1314, head portions 1366 act as anchoring members to provide additional strength for the distribution of mechanical force generated by the tensionable fastener through body portion 1325 of the electronic component housing.

Figure 47:
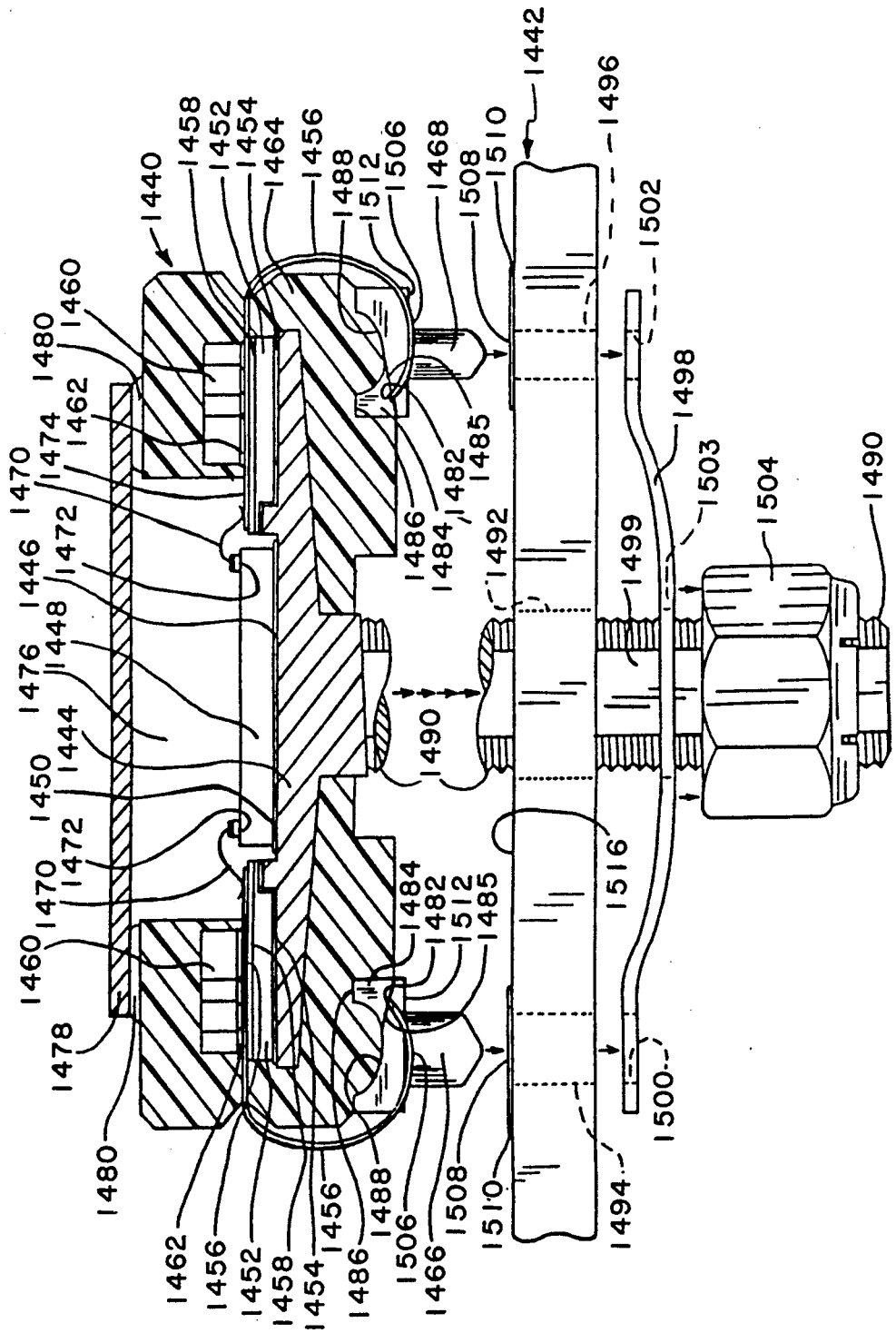
FIG. 47 is a sectional side view of a portion of a printed circuit assembly and an electronic circuit component housing to be mounted thereon which is another embodiment of the present invention.
Figure 48:
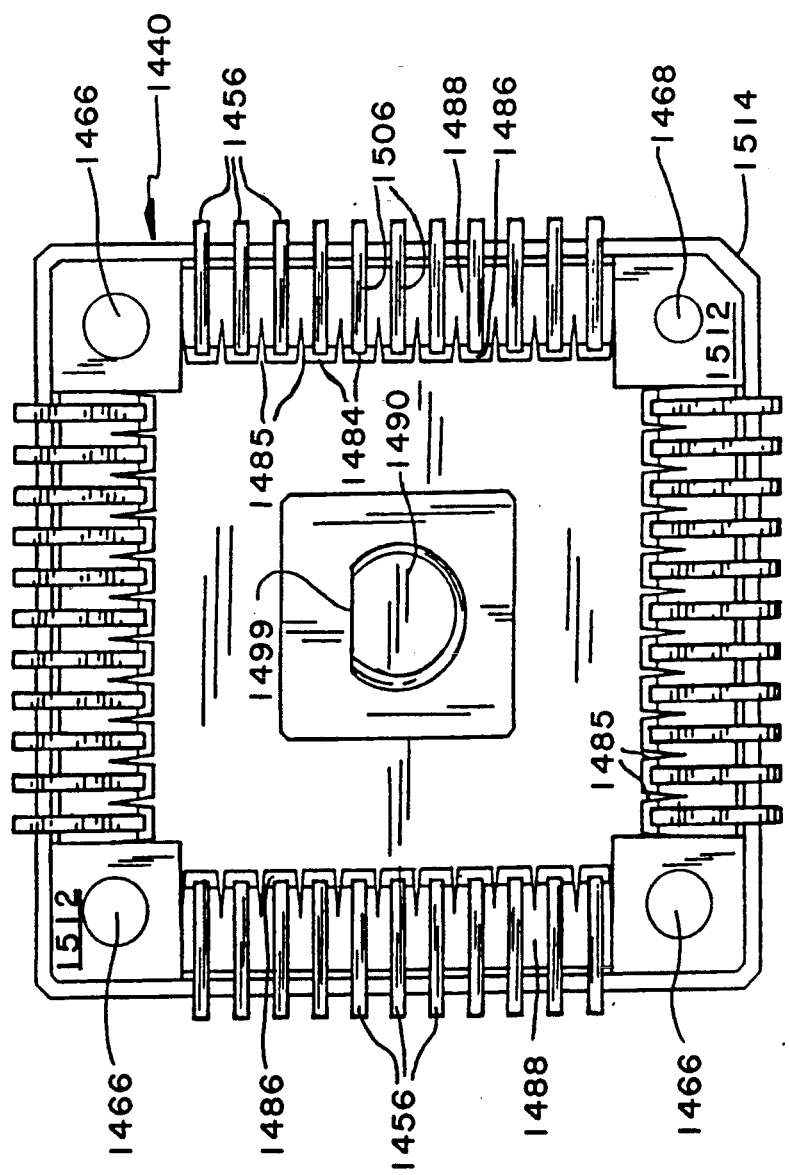
FIG. 48 is a bottom plan view of the electronic circuit component housing shown in FIG. 47, at a somewhat smaller scale.

The electronic circuit component housing 1440 shown in FIGS. 47 and 48 is another embodiment of the present invention which is somewhat similar in construction to the housing of FIGS. 11 and 12, however, having differences in the manner by which housing 1440 is aligned with printed circuit assembly 1442 and in the time at which electronic circuit component 1448 is attached to housing 1440. As in previously described embodiments of the invention, the electronic circuit component housing 1440 is connected to a tensionable fastener 1444, which may be made of metal or a thermoplastic. An insulative ring 1452 is adhesively attached to the head of tensionable fastener 1444 using adhesive 1454, and adhesive 1458 attaches lead frame 1456 to insulative ring 1452. When insulative ring 1452 is also made of a thermoplastic, adhesive 1458 may be omitted and the lead frame 1456 may be directly attached to insulative ring 1452 using heatstaking techniques commonly used within the thermoplastics industry. Following this attachment, electronic components 1460 may be attached to selected conductors of the lead frame 1456 using an adhesive 1462, such as an epoxy or solder. Following the fabrication of this subassembly, body portion 1464 of electronic component housing 1440 is molded around the subassembly to create the features shown in FIGS. 47 and 48. Cavity 1476 is of particular importance and is formed during the molding process allowing electronic circuit component 1448 to be inserted and attached by adhesive 1450 to the head of the tensionable fastener 1444 after electronic component housing 1440 has been fabricated and tested. Adhesive 1450 is typically an epoxy when tensionable fastener 1444 is made of a thermoplastic material but may also be a low temperature solder when mounting surface 1446 is metal. Following this attachment wire bonds 1470 are attached so as to interconnect contact pads 1472 of electronic circuit component 1448 with respective contact ends 1474 of lead frame conductors 1456. Electronic circuit component 1448 is then protected by the sealing of cavity 1476 using lid 1478 and adhesive 1480, which may be an epoxy. To ensure a thermal coefficient of expansion compatibly matched to the material of body portion 1464, the lid 1478 is preferably made of a material having a similar thermal coefficient of expansion, as is also true of the materials used for each element of the previously discussed subassembly. During the molding of body portion 1464, contact alignment cavities 1484 are integrally formed to include dividers 1475 and a convexly arcuate lower rim portion 1488. Alignment pins 1466 and keying alignment pins 1468 are also formed during this molding process.

Electronic component housing 1440 is inserted into printed circuit assembly 1442 in a manner similar to that described in connection with previous embodiments of the present invention, with the threaded shank portion 1490 of tensionable fastener 1444, which contains an orientation flat side 1499, being inserted through aperture 1492 of printed circuit assembly 1442. Simultaneously, alignment pins 1446 and keying alignment pin 1468 are respectively inserted into alignment apertures 1494 and keying alignment aperture 1496, also defined by printed circuit assembly 1442. A force distributing member 1498 is attached to shank portion 1490 of tensionable fastener 1444 when the shank portion 1490 has been inserted through aperture 1503 of tensioning member 1498, with alignment apertures 1500 and keying alignment aperture 1502 of the force distributing member 1498 matingly fitting on alignment pins 1466 and keying alignment pin 1468 of electronic component housing 1440 to properly align the force distributing member 1498 to be located opposite conductors 1510 of printed circuit assembly 1442. Conductors 1510 have contact faces 1508, which may include a corrosion resistant conductive finish such as a layer of gold, where contact faces 1508 are designed to mate with contact faces 1506 of the individual conductors of lead frame 1456. As this mating occurs the end portions 1482 of the conductors of lead frame 1456 are brought into contact with the bottom 1486 of spring lead alignment cavities 1484 limiting the vertical movement of contact faces 1506 and requiring the final mating movement of contact faces 1506 with respect to contact faces 1508 to be primarily lateral in direction, wiping the contact interface and in the process creating a quality metal-to-metal self-socketing interconnection without the use of adhesives such as conductive epoxies or solders. The combination of alignment cavities 1484 with alignment pins 1466 and keying alignment pin 1468 provides the basis for a high density point contact metal-to-metal interconnection system which enables the thin spring lead contacts of lead frame 1456 to be precisely aligned in a high density configuration and to work simultaneously with alignment cavity bottoms 1486 to provide a contact wiping and cleansing action at the contact interface when electronic circuit component housing 1440 is mated to printed circuit assembly 1442. The arrangement disclosed also allows contact faces 1506 to be spaced apart on center-to-center spacings as close as 0.015 inches and to maintain this alignment accurately when the component housing 1440 is mounted on printed circuit assembly 1442. By using a self-socketing metal-to-metal interconnection system as disclosed, without requiring individual contact leads 1456 of electronic component housing 1440 to be bonded to respective conductors 1510 on printed circuit assembly 1442 by a conductive adhesive, such as a conductive epoxy or solder, many of the problems associated with adhesively bonded contacts are eliminated, such as intercontact shorts caused by misalignment and/or adhesive bridging between the contacts. Furthermore, the force distributing member 1498 distributes the force maintained by tensionable fastener 1444 and its lock nut 1504, uniformly and in a focused manner across the contact interfaces formed by contact faces 1506 and 1508. This frees printed circuit assembly 1442 from the requirement of distributing this force, permitting the use of the housing 1440 together with printed circuit assemblies having an arbitrarily selected rigidity which may be a requirement of the intended application.

In addition, alignment pins 1466 and keying alignment pin 1468 are widly spaced in the embodiment of FIGS. 47 and 48 thereby allowing greater alignment precision to be achieved when the intended center-to-center spacings of contact faces 1506 and mating contact faces 1508 are minimized to achieve maximum contact density per unit area occupied by the electronic component housing 1440 when attached to printed circuit assembly 1442.

The finished housing 1440 may contain an orientation identification, such as the truncated corner of 1514 of electronic component housing 1440 as shown in the FIG. 48. This orientation identification is placed in a predetermined position with respect to keying alignment pin 1468 and flat face 1499 of stud portion 1490 of tensionable fastner 1444. In addition, bottom surface 1512 of component housing 1440 serves to act as a force limiting surface when contacting top surface 1516 of printed circuit assembly 1442 thereby preventing overstressing of the spring conductors of lead frame 1456.

Figure 49:
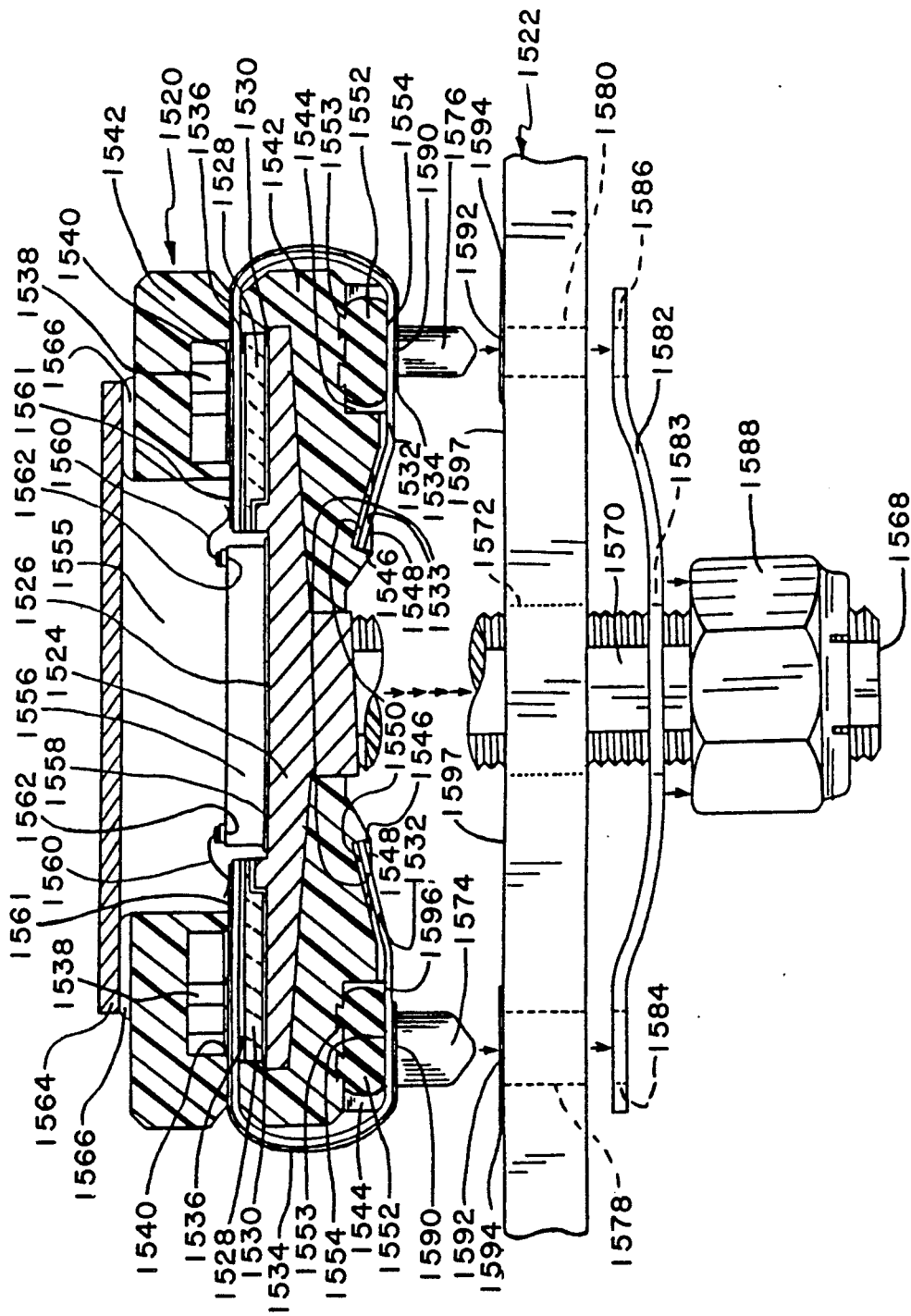
FIG. 49 is a sectional side view of a portion of a printed circuit assembly and an electronic circuit component housing mounted thereon which is another embodiment of the present invention.
Figure 50:
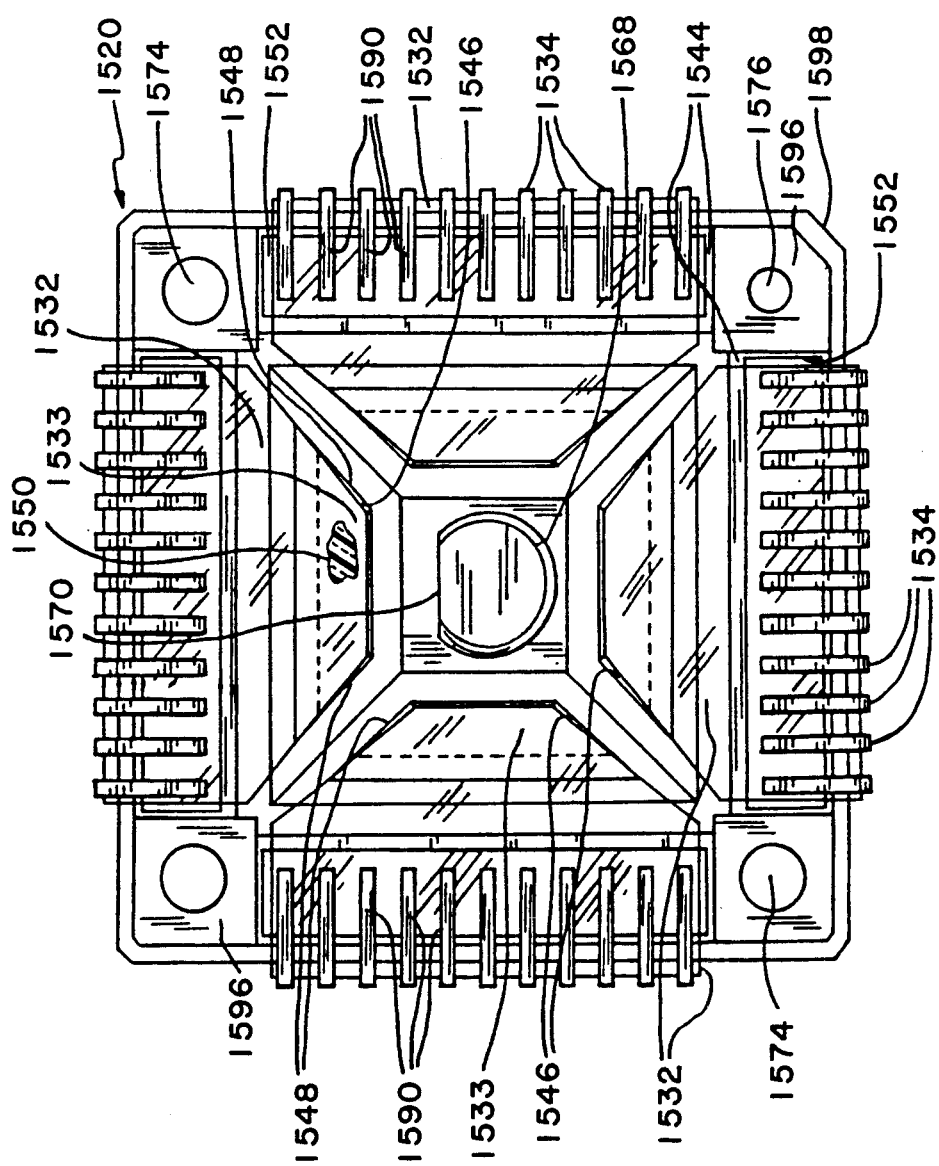
FIG. 50 is a bottom plan view of the electronic circuit component housing shown in FIG. 49.

FIGS. 49 and 50 show an electronic circuit component housing 1520 which is similar in many respects to the housings of FIGS. 14, 15, and 39. The housing is constructed by first preparing a subassembly comprised of tensionable fastener 1524, which may be made of metal or a more economical thermoplastic, to which an insulating ring 1528, which may also be made of a thermoplastic is attached using adhesive 1530, which may be an epoxy. A set of patterned flexible metal conductors 1534 are supported on an insulative flexible sheet backing 1532, preferably a tape of polyimide film or other similar material. The insulative sheet backing 1532 carrying flexible metal conductors 1534 is adhesively attached to insulating ring 1528 by adhesive 1536, which may be an epoxy. Following this attachment, electronic components 1538 are attached to the flexible metal conductors 1534 by conductive adhesive 1540, which may be a solder or conductive epoxy.

Next, a base member or body portion 1542 of housing 1520 is molded about this subassembly, creating the distinctive features shown in FIGS. 49 and 50. Specifically, two sets of cavities 1544 and 1546 are formed on the bottom portion of housing 1520 and cavity 1555 for housing electronic component 1556 is formed on the top side of the housing. Next, a shaped mass 1552 of an elastomeric polymer, such as a silicone, is affixed to base portion 1542 of housing 1520 and securely fastened in retention groves 1553.

The ends of insulative sheet backing material 1532 are precisely cut to match the contour of walls 1548 of cavities 1546. The ends are cut also at a position precisely related to the positioning of patterned metalized conductors 1534 to define cut end portions 1533 of sheet backing material 1532. Cut end portions 1533 are then wrapped around the sides and a portion of the bottom of component housing 1520 and inserted into cavities 1546 such that the edges of cut end portions 1533 of the insulative sheet backing 1532 precisely mate with interior walls 1548 of cavities 1546. This aligns, to a predetermined tolerance, the positioning of pattern metalized conductors 1534 with alignment pins 1574 and keying alignment pin 1576 which were simultaneously molded with cavities 1546. Cut ends 1533 of the insulated sheet backing 1532 are then firmly and precisely attached to base portion 1542 of housing 1520 using adhesive 1550, which may be an epoxy. In this manner the patterned metalized conductors 1534 are positioned to have contact faces 1590 which are located with precision below and facing away from elastomeric material 1552, creating an interface 1554 whereby elastomeric material 1552 supports insulative sheet backing 1532. Interface 1554 may or may not be an adhesively attached interface.

When construction is completed for the above portions of housing 1520, electronic circuit component 1556 may be inserted into cavity 1555 and attached to a mounting surface 1526 of the tensionable fastener 1524 using an epoxy adhesive 1558, or if mounting surface 1526 is metalized, then a solder or eutectic gold may be used as the adhesive 1558. Next, individual contact pads 1562 of electronic circuit component 1556 are connected to contact sites 1561 of patterned metalized conductors 1534, using bond wires 1560 or tape automated bonding techniques (not shown). Following such electrical connection of electronic circuit component 1556 the cavity 1555 is closed sealingly with lid 1564, which may be of a thermoplastic material by an adhesive 1566, which may be an epoxy.

The completed electronic circuit component housing 1520 may be inserted into the printed circuit assembly 1522 by passing shank portion 1568 of tensionable fastener 1524 through aperture 1572 of printed circuit assembly 1522. Automatic coarse orientation of component housing 1520 to printed circuit assembly 1522 may be facilitated by using flat face 1570 of shank portion 1568. More precise alignment is made when alignment pins 1574 and keying alignment pin 1576 are respectively inserted into mating alignment sockets 1578 and keying alignment socket 1580 of printed circuit assembly 1522, such that contact faces 1590 electrically mate with their respective corresponding contact faces 1592 of conductors 1594 mounted on printed circuit assembly 1522. The assembly process is completed by placing force distributing member 1582 over shank portion 1568 by passing shank portion 1568 through aperture 1583 and aligning respective apertures 1584 and keying aperture 1586 to alignment pins 1574 and keying alignment pin 1576. Locknut 1588 is then attached to shank portion 1568 and tightened, causing sufficient force to be exerted by tensioning member 1582 to compress elastomer 1552 thereby achieving a reliable metal-to-metal contact between contact faces 1590 and 1592. Less pressure is required at this contact interface if contact faces 1590 and 1592 are finished with a corrosion resistant highly conductive material, such as gold, and when contact faces 1590 are given a wiping action against contact faces 1592 as the pressure electrical interconnection is made forcing contact faces 1590 as supported on insulative sheet backing 1532 to move laterally outward due to the fixing of cut end portions 1533. This wiping action is, therefore, facilitated by fixing the ends 1533 of the insulative sheet backing material 1532 so as to force the outward movement of contact faces 1590 as mating pressure is applied to contact faces 1590 and 1592 during the assembly process. A predetermined amount of contact pressure is applied to contact faces 1590 and 1592 by the limiting action of bottom surface 1596 of base portion 1542 of component housing 1520, when bottom surface 1596 encounters top surface of 1597 of printed circuit assembly 1522 preventing additional compression of elastomer 1552 during the assembly process.

The present invention also conveniently permits the reversal of the above assembly process, for removing and replacing electronic circuit component housing 1520, should electronic circuit component 1556 become defective.

As mentioned previously the tensionable fastener 1524, including the shank portion 1568, may be made of a thermoplastic material similar to base portion 1542. Such a fabrication would be used to reduce weight, provide a match of thermal coefficients of expansion between materials, and to lessen the manufacturing costs. A further reduction in assembly costs could be achieved by structuring aperture 1583 of force distributing member 1582 to directly grasp stud portion 1568 of tensionable fastener 1524 without the need for locknut 1588. With such structure removal of electronic circuit component housing 1520 from printed circuit assembly 1522 in the event of a failure of electronic circuit component 1556 would typically necessitate the severing of shank portion 1568 adjacent to the tensioning member 1582 enabling the destructive detachment of the defective component from printed circuit assembly 1522.

Similar to previous alternative embodiments of the present invention, electronic circuit component housing 1520 may be suitably oriented for proper installation by the truncated corner 1598 as shown in FIG. 50. The truncated corner 1598 is positioned relative to keying alignment pin 1576 and flat orienting face 1570 of stud portion 1568 to allow identification of the orientation of housing 1520 when assembled onto printed circuit assembly 1522.

Figure 51:
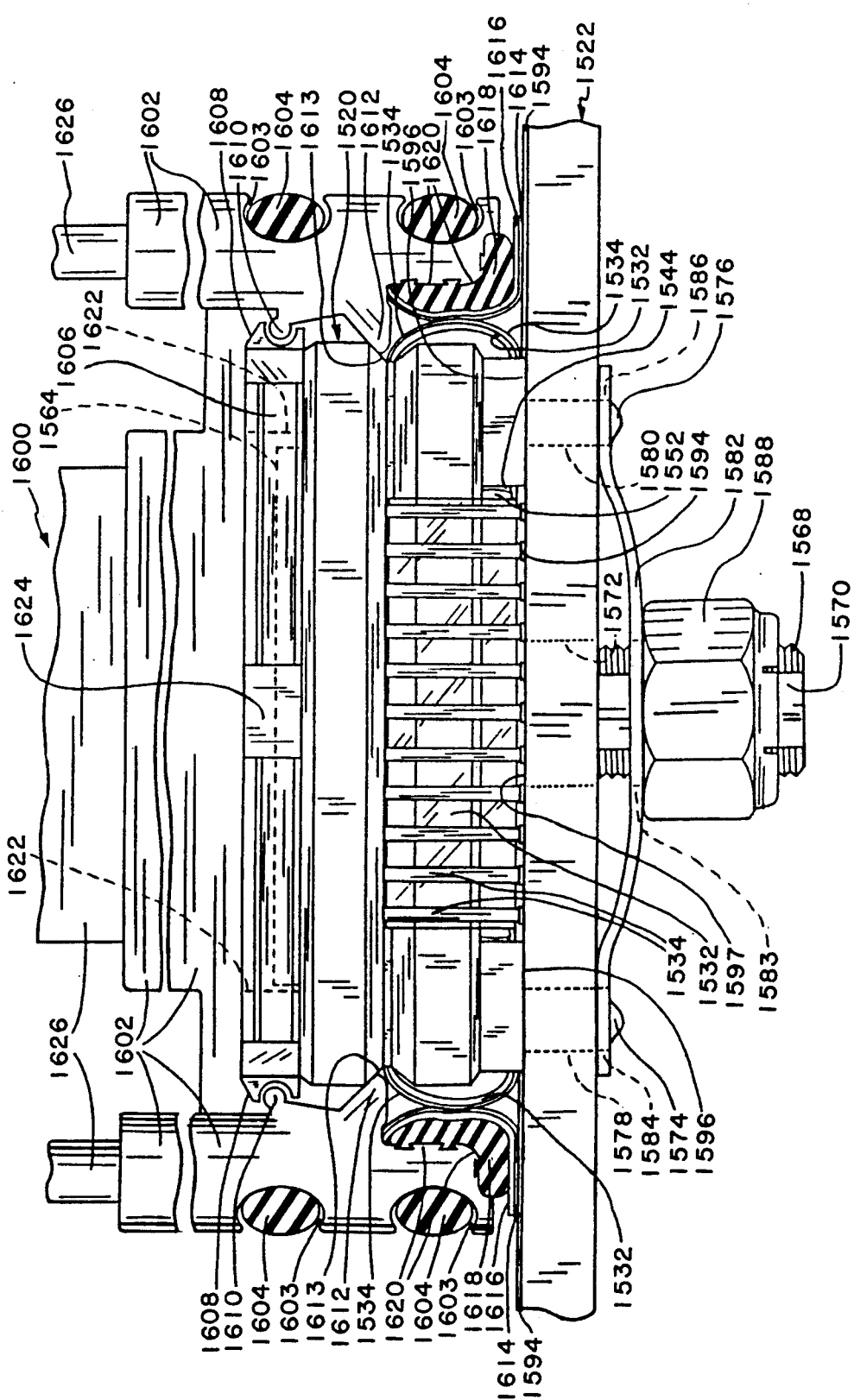
FIG. 51 is a sectional side view showing the electronic circuit component housing assembly of FIGS. 49 and 50, together with a circuit test probe attached thereto.

Referring to FIG. 51 of the drawings, a probe assembly 1600 is used to access the electrical signals in the interconnections between the circuitry contained within electronic circuit component housing 1520 and a printed circuit assembly 1522. Probe assembly 1600 shown in FIG. 51 is similiar to probe assembly 762 of FIG. 33 and includes a set of four probe sections 1602, each section having an internal face fitted to mate against a corresponding face of electronic circuit component housing 1520. The four probe sections 1602 are aligningly attached to the probe hinge ring 1606 by the use of mating hinge sockets 1608 and hinge pins 1610. Probe sections 1602 are further held in place by the tension of elastic bands 1604 which are themselves held in position about probe assembly 1600 by fitting securely into cavities 1603. The probe hinge ring 1606 includes an interior aperture 1622 for accommodating lid 1564 of electronic component housing 1520 when hinge ring 1606 is mounted against the top surface of electronic component housing 1520. Keying hinge guide opening gap 1624 is similar in function to the keying hinge guide gap 763 of FIG. 33 and is used for aligning with the corresponding hinge guide of the mating probe section 1602 (not shown in this view) to facilitate a precise alignment of these sections with component housing 1520. Probe assembly 1600 is held accurately in place by the action of elastic bands 1604 such that solid retaining ridge 1612 of probe sections 1602 is held under pressure against the upper surface of groove 1613 of electronic component housing 1520. With the probe assembly 1600 clamped in this fashion to electronic component housing 1520 the mating patterned conductors 1614, which are mounted on a flexible tape backing 1616 in a pattern corresponding with the pattern of conductors 1534 of electronic circuit component housing 1520, are made to establish a reliable electrical interconnection between electronic circuit component housing conductors 1534 and probe conductors 1614. Such a reliable electrical innerconnection is facilitated by a quality surface finish, such as gold, which may exist on the outer surfaces of both mating conductors, and by the action of elastomer 1618 which has been formed to fit inside cavity 1620 so as to exert pressure laterally against contacts 1534 of electronic printed circuit housing 1520 when probe assembly 1600 is attached to this housing. Because the metallized patterns of conductors 1534 of electronic component housing 1520 and conductors 1594 of printed circuit assembly 1522 and conductors 1614 of probe assembly 1600 are all typically fabricated using precise printed circuit photoprocessing techniques, these corresponding and mating patterns may be simultaneously interconnected by the attachment of probe assembly 1600 as shown in FIG. 51. In this manner probe assembly conductors 1614 are simultaneously made to mate with conductors 1594 of printed circuit assembly 1522 and conductors 1534 when probe assembly 1600 is clamped into place about electronic component housing 1520. The electrical signals in the conductors contacted by conductors 1614 of individual probe sections 1602 are transmitted to the appropriate electronic test and measurement equipment (not shown) by a respective set of output leads 1626 extending from each probe section 1602. Similar to the probe assembly of FIG. 33, probe assembly 1600 is attached and removed from electronic component housing 1520 by pivoting the upper portions of all four probe sections 1602 about hinge 1610, thereby disengaging retaining ridge 1612 from mating groove 1613 of electronic circuit component housing 1520, and in an upwardly lifting manner disengaging probe assembly 1600 from housing 1520 and disconnecting the interconnects made between probe contacts 1614 with conductors 1534 of electronic component housing 1520 and conductors 1594 of printed circuit assembly 1522. In the process of attaching probe assembly 1600 to electronic circuit component housing 1520, the individual probe sections 1602 are pivoted about hinge pin 1610 and the sweeping action of this pivoting motion causes probe contact 1614 to wipe along printed circuit conductors 1594 thereby improving the contact between these two conductors by disturbing contaminants or corrosion which may have previously formed at the site of this contact interface. It will be appreciated that although probe assembly 1600 of FIG. 51 is shown mating with electronic component housing 1520, also shown in FIG. 49, a probe assembly having similar features and functionality would mate with the electronic component housing 1440 of FIG. 47.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. In combination, an electronic circuit component and a device for carrying at least one electronic circuit component and for electrically connecting it to a plurality of conductors of an electrical circuit, comprising:
   (a) an electrically insulative base member including and insulating from each other a plurality of electrical conductors, said base member having an upper side and an oppositely located contact side;
   (b) support means defining at least one cavity on said upper side of said base member, for physically receiving at least one electronic circuit component, an upper surface of said upper side of said base member having a plurality of contact pads located thereon within said cavity in a predetermined array, at least some of said contact pads being electrically connected with respective ones of said electrical conductors;
   (c) at least one electronic circuit component located on said support means, said electronic circuit component having a plurality of electrical contacts located thereon in an array complementing said contact pads of said predetermined array and at least some of said contacts being physically in contact with and electrically interconnected with respective ones of said contact pads;
   (d) a resilient spring member located in said cavity above said electronic circuit component;
   (e) a force spreader interposed between said spring member and said electronic circuit component;
   (f) a lid fixedly attached to said upper side of said base member, closing said cavity and compressing said spring member, and urging said contacts of said electronic circuit component into contact with said contact pads within said cavity; and
   (g) a plurality of physically compliant electrical contacts arranged in a predetermined array on said contact side of said base member, at least some of said compliant contacts being connected with respective ones of said electrical conductors, and at least some of said electrical conductors extending from said contact side of said base member through said base member and being electrically connected with respective ones of said contact pads within said cavity.

2. In combination, an electronic circuit component and a device for carrying at least one electronic circuit component and for electrically connecting it to a plurality of conductors of an electrical circuit, comprising:

(a) an electrically insulative base member including and insulating from each other a plurality of electrical conductors, said base member having an upper side and an oppositely located contact side;

(b) support means defining at least one cavity on said upper side of said base member, for physically receiving at least one electronic circuit component, an upper surface of said upper side of said base member having a plurality of contact pads located thereon within said cavity in a predetermined array, at least some of said contact pads being electrically connected with respective ones of said electrical conductors;

(c) at least one electronic circuit component located on said support means, said electronic circuit component having a plurality of electrical contacts located thereon in an array complementing said contact pads of said predetermined array and at least some of said contacts being physically in contact with and electrically interconnected with respective ones of said contact pads;

(d) a metal spring member located in said cavity above said electronic circuit component;

(e) a metal force spreader interposed between said spring member and said electronic circuit component;

(f) a lid fixedly attached to said upper side of said base member, closing said cavity and compressing said spring member, and urging said contacts of said electronic circuit component into contact with said contact pads within said cavity; and (g) a plurality of physically compliant electrical contacts arranged in a predetermined array on said contact side of said base member, at least some of said compliant contacts being connected with respective ones of said electrical conductors, and at least some of said electrical conductors extending from said contact side of said base member through said base member and being electrically connected with respective ones of said contact pads within said cavity, and said metal spring and said metal force spreader thermally connecting said electronic circuit component to said lid.

3. In combination, an electronic circuit component and a device for carrying at least one electronic circuit component and for electrically interconnecting it to a plurality of electrical conductors, comprising:

(a) an electrically insulative base member including and insulating from each other a plurality of electrical conductors, said base member having an upper side;

(b) support means defining at least one cavity on said upper side of said base member, for physically receiving at least one electronic circuit component, an upper surface of said upper side of said base member having a plurality of contact pads located thereon within said cavity in a predetermined array, at least some of said contact pads being electrically interconnected with respective ones of said electrical conductors;

(c) at least one electronic circuit component located on said support means, said electronic circuit component having a plurality of electrical contacts located thereon in an array complementing said contact pads of said predetermined array, at least some of said contacts being electrically interconnected with respective ones of said predetermined array of contact pads;

(d) a resilient spring member located in said cavity above said electronic circuit component; and (e) a lid fixedly attached to said upper side of said base member, closing said cavity and compressing said spring member, and promoting electrical interconnection between at least some of said contacts of said electronic circuit component and some of said electrical conductors of said base member.

4. The device of claim 3, further including a contact carrier having an upper face and a lower face, said carrier being interposed between said electronic circuit component and said upper surface, said upper face having located thereon an upper array of physically compliant electrical contacts and said lower face having located thereon a lower array of physically compliant electrical contacts, and wherein said plurality of electrical contacts of said electronic circuit component include an array of contact pads arranged matably with said upper array of contacts and said lower array of contacts being matably arranged with said predetermined array of contact pads located in said cavity, and selected ones of said physically compliant contacts on said upper face being electrically interconnected with selected ones of said physically compliant contacts on said lower face, and at least some of said plurality of electrical contacts located on said electronic circuit component being electrically interconnected through said contact carrier with some of said contact pads located within said cavity on said upper surface.

5. The device of claim 4 wherein said contact carrier and electronic circuit component are both of a suitable size and shape for interacting with the interior configuration of said cavity closely enough to maintain alignment between respective ones of said contact pads and physically compliant contacts.

6. The device of claim 4 wherein said contact carrier includes means located thereon for limiting the amount of deformation of said physically compliant electrical contacts by maintaining at least a minimum separation between said electronic circuit component and said upper surface of said upper side of said base member within said cavity.

7. The device of claim 3 wherein said spring member is electrically and thermally conductive, enabling electrical and thermal connection to be made between said electronic circuit component and said lid.

8. The device of claim 3, including a discrete force spreading member interposed between said spring member and said electronic circuit component.

9. The device of claim 8 wherein said force spreading member is electrically and thermally conductive, enabling electrical and thermal connection to be made between said electronic circuit component and said lid.

10. In combination with an electrical circuit including a plurality of electrical circuit conductors located on a circuit support structure including a generally planar surface, a device for carrying at least one electronic circuit component and for electrically interconnecting said electronic circuit component with said electrical circuit conductors, comprising:
(a) an electrically insulative base member including and insulating from each other a plurality of electrical conductors, said base member having an upper side and an oppositely located contact side;
(b) a tensionable fastener physically attached to said device on said contact side of said base member and extending away from said upper side of said base member;
(c) support means included on said upper side of said base member for physically receiving at least one electronic circuit component, said support means including a plurality of electronic circuit component mating contacts each electrically connected with a respective one of said electrical conductors;
(d) a first plurality of electrical contact pads arranged in a predetermined array on said contact side of said base member, said contact pads being connected with respective ones of said electrical conductors, at least some of said electrical conductors extending from said contact side of said base member through said base member and being electrically connected with respective ones of said electronic circuit component mating contacts;
(e) a force distributing member, associated with said tensionable fastener, said force distributing member including means for urging a part of said electrical circuit toward said first plurality of electrical contacts;
(f) a layer of resilient material located supportingly beneath said generally planar surface of said circuit support structure;
(g) a second plurality of corresponding electrical contact pads arranged in a predetermined array on said generally planar surface and substantially corresponding with said predetermined array of said first plurality of electrical contact pads, individual ones of said second plurality of contact pads being connected with respective ones of said electrical circuit conductors on said generally planar surface; and
(h) alignment means for assuring that said contact pads of said first plurality are aligned with corresponding contact pads of said second plurality when said device is held in place against said circuit support structure by said tensionable fastener and said force distributing member, wherein said alignment means includes orientation means for uniquely orienting said device with respect to said electrical circuit during interconnection of said electronic circuit component with said electrical circuit conductors and for thereafter indicating the installed orientation.

11. In combination with an electrical circuit including a plurality of electrical circuit conductors located on a circuit support structure including a generally planar surface, a device for carrying at least one electronic circuit component and for electrically interconnecting said electronic circuit component with said electrical circuit conductors, comprising:
(a) an electrically insulative base member including and insulating from each other a plurality of electrical conductors, said base member having an upper side and an oppositely located contact side;
(b) at least one tensionable fastener physically attached to said device on said contact side of said base member and extending away from said upper side of said base member;
(c) support means included on said upper side of said base member for physically receiving at least one electronic circuit component, said support means including a plurality of electronic circuit component mating contacts at least some of which are electrically connected with respective ones of said electrical conductors;
(d) a first plurality of electrical contact pads arranged in a predetermined array on said contact side of said base member, said contact pads being connected with respective ones of said electrical conductors, at least some of said electrical conductors extending from said contact side of said base member through said base member and being electrically connected with respective ones of said electronic circuit component mating contacts;
(e) a second plurality of corresponding electrical contact pads arranged in a predetermined array on said generally planar surface and substantially corresponding with said predetermined array of said first plurality of electrical contact pads, individual ones of said second plurality of contact pads being connected with respective ones of said electrical circuit conductors on said generally planar surface;
(f) a layer of resilient material located supportingly beneath said second plurality of electrical contact pads; and
(g) (at least one) force distributing member associated with said tensionable fastener, said force distributing member including means for urging a part of said electrical circuit toward said first plurality of electrical contact pads.

12. The device of claim 11, including orientation and alignment means for uniquely orienting said device with respect to said circuit support structure and assuring that said contact pads of said first plurality are aligned with corresponding contact pads of said second plurality when said device is installed and held in place against said circuit support structure by said tensionable fastener and said force distributing member and for thereafter indicating the installed orientation.

13. A method for temporarily electrically interconnecting an electronic circuit component with a plurality of electrical circuit conductors of an electrical circuit in which said plurality of electrical circuit conductors are located on a circuit support structure including a generally planar surface, the method comprising:
(a) providing a device for carrying at least one electronic circuit component, said device including an electrically insulative base member including and insulating from each other a plurality of electrical conductors, said base member having an upper side and an oppositely located contact side;
(b) providing at least one tensionable fastener physically attached to said device on said contact side of said base member and extending away from said upper side of said base member;
(c) providing support means on said upper side of said base member for physically receiving at least one electronic circuit component;
(d) providing a plurality of electronic circuit component mating contacts on said support means, at least some of said electronic circuit component mating contacts being electrically connected with respective ones of said electrical conductors;

(e) providing a first plurality of electrical contacts arranged in a predetermined array on said contact side of said base member, said contacts being connected with respective ones of said electrical conductors, at least some of said electrical conductors extending from said contact side of said base member through said base member and being electrically connected with respective ones of said electronic circuit component mating contacts;

(f) providing a second plurality of corresponding electrical contact pads, arranged in a predetermined array on said generally planar surface and substantially corresponding with said predetermined array of said first plurality of electrical contacts, individual ones of said second plurality of contact pads being connected with respective ones of said electrical circuit conductors on said generally planar surface;

(g) providing a layer of resilient material supportingly beneath said second plurality of electrical contact pads;

(h) providing a force supporting member located supportingly beneath said layer of resilient material; and (i) urging said device, including said first plurality of electrical contacts, toward said second pluality of electrical contact pads and holding said device in place with sufficient force to enable electrical interconnection between respective ones of said first plurality of electrical contacts and said second plurality of electrical contact pads.

14. The method of claim 13, including the steps of uniquely orienting and aligning said electrical contacts of said first plurality with corresponding ones of said second plurality of electrical contact pads while urging said device toward said second plurality of electrical contact pads, and thereafter indicating the orientation of said device with respect to said generally planar surface.

* * * * *

UNITED STATES PATENT AND TRADEMARK OFFICE
CERTIFICATE OF CORRECTION

PATENT NO. : 5,065,282

DATED : November 12, 1991

INVENTOR(S) : John D. Polonio

It is certified that error appears in the above-identified patent and that said Letters Patent is hereby corrected as shown below:

Col. 10, lines 38-39   Change "obtained" to --chosen--.

Col. 26, line 3   Change "634" to --624--.

Col. 27, line 19   Change "106" to --706--.

Col. 31, line 15   Change "632" to --932--.

Signed and Sealed this

Tenth Day of August, 1993

Attest:

MICHAEL K. KIRK

*Attesting Officer*   Acting Commissioner of Patents and Trademarks